(12) United States Patent
Ishizu

(10) Patent No.: US 9,202,814 B2
(45) Date of Patent: *Dec. 1, 2015

(54) MEMORY DEVICE AND SIGNAL PROCESSING CIRCUIT

(71) Applicant: Semiconductor Energy Laboratory Co., Ltd., Atsugi-shi, Kanagawa-ken (JP)

(72) Inventor: Takahiko Ishizu, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/332,600

(22) Filed: Jul. 16, 2014

(65) Prior Publication Data

US 2014/0326995 A1 Nov. 6, 2014

Related U.S. Application Data

(63) Continuation of application No. 13/473,710, filed on May 17, 2012, now Pat. No. 8,787,102.

(30) Foreign Application Priority Data

May 20, 2011 (JP) .................................. 2011-113359

(51) Int. Cl.
*G11C 11/40* (2006.01)
*H01L 27/11* (2006.01)
(Continued)

(52) U.S. Cl.
CPC ............ *H01L 27/1108* (2013.01); *G11C 11/24* (2013.01); *G11C 11/412* (2013.01); *G11C 14/0054* (2013.01); *G11C 11/40* (2013.01)

(58) Field of Classification Search
CPC ..... G11C 11/40; G11C 11/412; H01L 27/1108
USPC ................................ 365/203, 149, 154, 189.2
See application file for complete search history.

(56) References Cited

U.S. PATENT DOCUMENTS 5,495,437 A * 2/1996 Tai et al. ....................... 365/145
5,528,032 A 6/1996 Uchiyama
(Continued)

FOREIGN PATENT DOCUMENTS

EP 1737044 A 12/2006
EP 2226847 A 9/2010
(Continued)

OTHER PUBLICATIONS

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.
(Continued)

*Primary Examiner* — Tan T Nguyen
(74) *Attorney, Agent, or Firm* — Fish & Richardson P.C.

(57) ABSTRACT

A memory device which can keep a stored logic state even when the power is off is provided. A signal processing circuit including the memory device, which achieves low power consumption by stopping supply of power, is provided. A memory device includes a logic circuit including a first node and a second node, a first memory circuit connected to the first node, a second memory circuit connected to the second node, and a precharge circuit connected to the first node, the second node, the first memory circuit, and the second memory circuit. When reading data is performed, the precharge circuit outputs a precharge potential to the first node and the second node. The first memory circuit and the second memory circuit each include a transistor in which a channel is formed in an oxide semiconductor film.

21 Claims, 25 Drawing Sheets

(51) Int. Cl.
*G11C 11/412* (2006.01)
*G11C 14/00* (2006.01)
*G11C 11/24* (2006.01)

(56) References Cited

U.S. PATENT DOCUMENTS

| | | | |
|---|---|---|---|
| 5,603,009 A | 2/1997 | Konishi et al. |
| 5,652,723 A | 7/1997 | Dosaka et al. |
| 5,663,905 A | 9/1997 | Matsuo et al. |
| 5,731,856 A | 3/1998 | Kim et al. |
| 5,744,864 A | 4/1998 | Cillessen et al. |
| 6,127,702 A | 10/2000 | Yamazaki et al. |
| 6,294,274 B1 | 9/2001 | Kawazoe et al. |
| 6,563,174 B2 | 5/2003 | Kawasaki et al. |
| 6,567,911 B1 | 5/2003 | Mahmoud |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,138,684 B2 | 11/2006 | Hidaka et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,772,053 B2 | 8/2010 | Kameshiro et al. |
| 8,279,691 B2 | 10/2012 | Takahashi et al. |
| 8,300,452 B2 | 10/2012 | Cannon et al. |
| 8,787,102 B2* | 7/2014 | Ishizu | 365/203 |
| 8,982,607 B2* | 3/2015 | Takemura | 365/149 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0124094 A1 | 5/2010 | Kimura |
| 2010/0148171 A1 | 6/2010 | Hayashi et al. |
| 2011/0176357 A1 | 7/2011 | Koyama et al. |
| 2011/0187410 A1 | 8/2011 | Kato et al. |
| 2011/0193078 A1 | 8/2011 | Takemura |
| 2012/0032730 A1 | 2/2012 | Koyama |
| 2012/0120715 A1 | 5/2012 | Saito |
| 2012/0161127 A1 | 6/2012 | Kato et al. |
| 2012/0161132 A1 | 6/2012 | Yamazaki |
| 2012/0182790 A1 | 7/2012 | Yamazaki et al. |
| 2012/0188814 A1 | 7/2012 | Yamazaki et al. |
| 2012/0257439 A1 | 10/2012 | Kurokawa |
| 2012/0262982 A1 | 10/2012 | Takemura |
| 2012/0271984 A1 | 10/2012 | Ohmaru et al. |
| 2012/0294068 A1 | 11/2012 | Ishizu |
| 2012/0294069 A1 | 11/2012 | Ohmaru et al. |
| 2013/0314976 A1* | 11/2013 | Onuki | 365/149 |
| 2015/0103585 A1* | 4/2015 | Chuang et al. | 365/156 |

FOREIGN PATENT DOCUMENTS

| | | | |
|---|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 09-186251 A | 7/1997 |
| JP | 10-078836 A | 3/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |

(56) References Cited

FOREIGN PATENT DOCUMENTS

| JP | 2004-103957 A | 4/2004 |
|---|---|---|
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2010-124290 A | 6/2010 |
| WO | WO-2004/114391 | 12/2004 |

OTHER PUBLICATIONS

Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

Kim.W et al., "An Experimental High-Density DRAM Cell with a Built-in Gain Stage", IEEE Journal of Solid-Sate Circuits, Aug. 1, 1994, vol. 29, No. 8, pp. 978-981.

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composited for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (M=7, 8, 9, and 16) in the In2O3—ZnHa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

(56) References Cited

OTHER PUBLICATIONS

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3-Ga2ZnO4-ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical Review. B), 2008, vol. 77, pp. 245202-1-245202-6.

Oh.M et al., "Improving the Gate Stability of ZnO Thin-Film Transistors With Aluminum Oxide Dielectric Laters", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner c-axis direction electric charge 0 electric charge +1 electric charge 0 a-b plane electric charge −1 electric charge 0

FIG. 13A  FIG. 13B
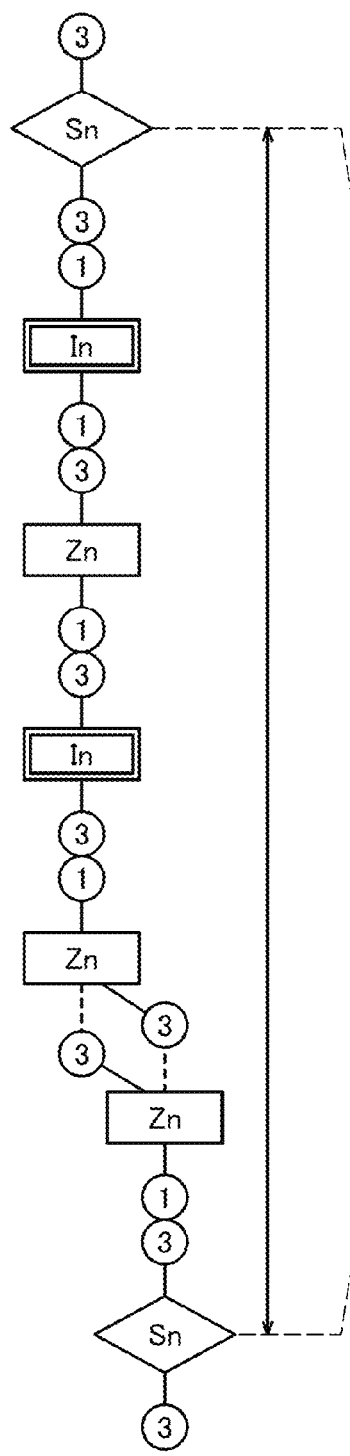
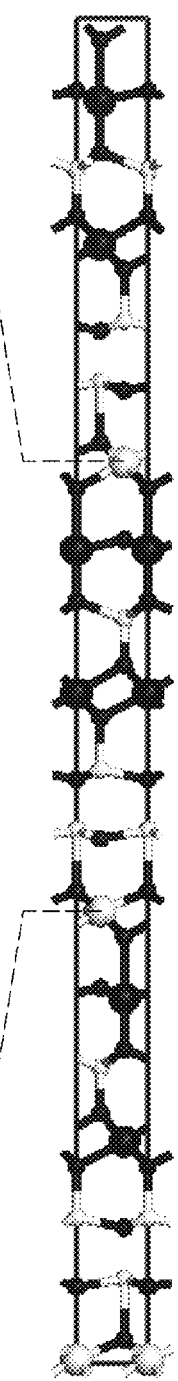
FIG. 13C
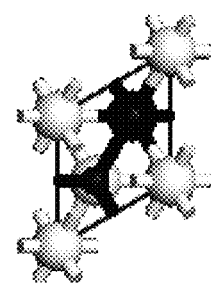
- In
- Sn
- Zn
- O

● In
○ Ga
○ Zn
● O

MEMORY DEVICE AND SIGNAL PROCESSING CIRCUIT

CROSS-REFERENCE TO RELATED APPLICATIONS

This application is a continuation of U.S. application Ser. No. 13/473,710, filed May 17, 2012, now allowed, which claims the benefit of a foreign priority application filed in Japan as Serial No. 2011-113359 on May 20, 2011, both of which are incorporated by reference.

BACKGROUND OF THE INVENTION

1. Field of the Invention

The present invention relates to a memory device utilizing a memory element, a manufacturing method thereof, and a driving method thereof. Further, the present invention relates to a signal processing circuit including the memory device.

2. Description of the Related Art

In recent years, with the widespread use of electronic devices such as personal computers and mobile phones, demand for higher performance of electronic devices has been increased. In order to achieve higher performance of such electronic devices, higher performance of memories has been particularly required in addition to higher-speed operation of interfaces, improvement in processing performance of external devices, and the like.

The "memory" used here includes, in its category, not only a main memory for storing data and program but also a register, a cache memory, and the like used in a signal processing circuit such as a central processing unit (CPU). A register is provided to temporarily hold data for carrying out arithmetic processing, holding a program execution state, or the like. In addition, a cache memory is located between an arithmetic circuit and a main memory in order to reduce access to the low-speed main memory and speed up the arithmetic processing. In a memory device such as a register or a cache memory, writing of data needs to be performed at higher speed than in a main memory. Thus, in general, a flip-flop or the like is used as a register, and a volatile memory circuit such as a static random access memory (SRAM) is used as a cache memory.

In order to reduce power consumption, a method for temporarily stopping supply of a power supply voltage to a signal processing circuit in a period during which data is not input and output has been suggested. In that method, a non-volatile memory circuit is located in the periphery of a volatile memory circuit such as a register or a cache memory, and the data is temporarily stored in the non-volatile memory circuit. Thus, in the signal processing circuit, the data stored in the register, the cache memory, or the like can be held even while a supply of power supply voltage is stopped (for example, see Patent Document 1).

In addition, in the case where supply of the power supply voltage is stopped in a signal processing circuit for a long time, data in a volatile memory circuit may be transferred to an external memory device such as a hard disk or a flash memory before supply of the power supply voltage is stopped, in which case the data can be prevented from being erased.

REFERENCE

[Patent Document 1] Japanese Published Patent Application No. H10-078836

SUMMARY OF THE INVENTION

In such a signal processing circuit disclosed in Patent Document 1, in the case of using a method for storing data of a volatile memory circuit in an external memory device while supply of power is stopped, it takes time to restore data from the external memory device to the volatile memory circuit after the supply of power is restarted. Therefore, such a signal processing circuit is not suitable in the case where supply of power is stopped for a short time for the purpose of a reduction in power consumption.

In view of the above problem, an object of one embodiment of the present invention is to provide a memory device which can keep a stored logic state even when the supply of power is stopped. Another object is to provide a signal processing circuit including the memory device, which achieves low power consumption by stopping supply of power.

A memory device according to one embodiment of the present invention includes a memory element including a logic circuit, a first memory circuit, and a second memory circuit, and a precharge circuit. A specific structure thereof is described below.

The memory device according to one embodiment of the present invention includes a logic circuit including a first node and a second node, a first memory circuit connected to the first node, a second memory circuit connected to the second node, and a precharge circuit connected to the first node, the second node, the first memory circuit, and the second memory circuit. The first memory circuit and the second memory circuit each include a transistor in which a cannel is formed in an oxide semiconductor film and a capacitor. The precharge circuit outputs a precharge potential to the first node and the second node.

While power is supplied to the memory device, data is held in the first node and the second node of the logic circuit. Before the supply of power is stopped, the data which has been held in the first node and the second node of the logic circuit is held in the first memory circuit and the second memory circuit connected to the first node and the second node, respectively.

The transistor included in each of the first memory circuit and the second memory circuit preferably has low off-state current. Specifically, the off-state current density is preferably less than or equal to 100 $zA/\mu m$, more preferably less than or equal to 10 $zA/\mu m$. As the transistor with low off-state current, it is preferable to use a transistor in which a channel is formed in a layer or a substrate formed using a semiconductor with a larger bandgap than silicon. As an example of a semiconductor with a bandgap of greater than or equal to 2 eV, preferably greater than or equal to 2.5 eV, more preferably greater than or equal to 3 eV, an oxide semiconductor can be given. A transistor in which a channel is formed in an oxide semiconductor has a characteristic of extremely low off-state current.

Therefore, such a transistor is used for each of the first memory circuit and the second memory circuit, whereby in the case where the transistor is off, a potential can be held by a capacitor connected to the transistor for a long period. In addition, even in the case where supply of power is stopped, a logic state of the logic circuit can be held in the first memory circuit and the second memory circuit. With such a memory element, a memory device which can keep a stored logic state even when the power is off can be provided.

Further, it is not necessary to transfer data held in the memory device to another memory device before supply of power is stopped; therefore, the supply of power can be stopped in a short time.

The oxide semiconductor film includes two or more elements selected from indium, gallium, tin, and zinc.

The memory device according to one embodiment of the present invention is provided with the precharge circuit, and the logic circuit, the first memory circuit, and the second memory circuit are connected to the precharge circuit. When the supply of power to the memory device is restarted and the data stored in the first memory circuit and the second memory circuit is restored to the logic circuit, the precharge potential output from the precharge circuit is supplied to the first node where the logic circuit and the first memory circuit are connected to each other and the second node where the logic circuit and the second memory circuit are connected to each other. After that, the transistors included in the first memory circuit and the second memory circuit are turned on. Thus, the potentials of the first node and the second node of the logic circuit vary depending on the potentials held in the first memory circuit and the second memory circuit, and can be set to the potentials held before the supply of power is stopped. Therefore, the data can be restored from the first memory circuit and the second memory circuit to the first node and the second node of the logic circuit in a short time.

With the use of the memory device according to one embodiment of the present invention for a signal processing circuit, power consumption can be reduced in the case where supply of power is stopped for a short time.

According to one embodiment of the present invention, a memory device which can keep a stored logic state even when the power is off can be provided. With the memory device, a signal processing circuit can be provided in which power consumption can be reduced by stopping the supply of power.

BRIEF DESCRIPTION OF THE DRAWINGS

In the accompanying drawings:

FIGS. 13A to 13C illustrate a crystal structure of an oxide material;

DETAILED DESCRIPTION OF THE INVENTION

Figure 1:
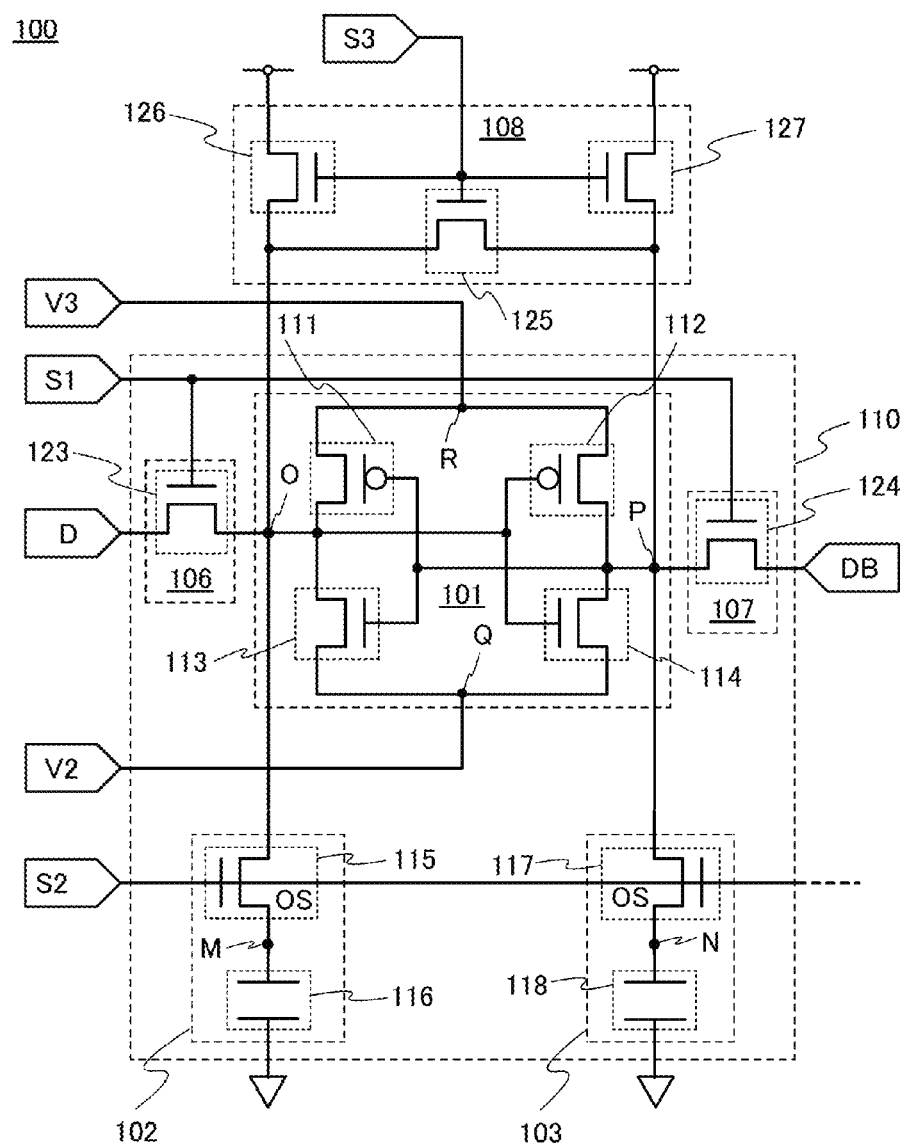
FIG. 1 is a circuit diagram of a memory device.

Hereinafter, embodiments of the present invention will be described in detail with reference to the accompanying drawings. Note that the present invention is not limited to the following description and it will be readily appreciated by those skilled in the art that the modes and details of the present invention can be modified in various ways without departing from the spirit and scope thereof. Therefore, the present invention should not be interpreted as being limited to the description in the following embodiments.

Note that functions of a "source" and a "drain" may be switched in the case where transistors of different polarities are employed or in the case where the direction of a current flow changes in a circuit operation, for example. Therefore, the terms "source" and "drain" can be used to denote the drain and the source, respectively, in this specification.

Voltage refers to a potential difference between a given potential and a reference potential (e.g., a ground potential) in many cases. Accordingly, in this specification, voltage, a potential, and a potential difference can be referred to as a potential, voltage, and a voltage difference, respectively.

The term "over" or "below" does not necessarily mean that a component is placed "directly on" or "directly under" another component. For example, the expression "a gate electrode over a gate insulating layer" can mean the case where a component is placed between the gate insulating layer and the gate electrode.

The position, size, range, or the like of each component illustrated in drawings and the like is not accurately represented in some cases for easy understanding. Therefore, the disclosed invention is not necessarily limited to the position, size, range, or the like as disclosed in the drawings and the like.

Ordinal numbers such as "first", "second", and "third" are used in order to avoid confusion among components.

Embodiment 1

A memory element and a memory device according to one embodiment of the present invention will be described with reference to FIG. 1. FIG. 1 illustrates a circuit configuration of a memory device 100.

<Structure of Memory Device>

The memory device 100 in FIG. 1 includes a memory element 110 and a precharge circuit 108.

The memory element 110 includes a logic circuit 101, a memory circuit 102, and a memory circuit 103. The memory element 110 may include a switch 106 and a switch 107 in addition to the above circuits. A main power supply is set to a first power supply potential V1 (not illustrated). Note that in some circuit diagrams, "OS" (abbreviation of an oxide semiconductor) is written besides a transistor in order to indicate that the transistor includes an oxide semiconductor.

The logic circuit 101 includes four transistors: two p-channel transistors 111 and 112 and two n-channel transistors 113 and 114. The transistors 111 and 113 form an inverter and the transistors 112 and 114 form an inverter. An input terminal of one of the inverters and an output terminal of the other of the inverters are cross-connected and an output terminal of one of the inverters and an input terminal of the other of the inverters are cross-connected, so that a flip flop having two stable states is obtained.

In this specification and the like, the inverter including the transistor 111 and the transistor 113 is referred to as a first inverter circuit, and the inverter including the transistor 112 and the transistor 114 is referred to as a second inverter circuit. The input terminal of the second inverter circuit, the output terminal of the first inverter circuit, and a first terminal of the switch 106 are electrically connected to one another, and the connection point is referred to as a node O. The input terminal of the first inverter circuit, the output terminal of the second inverter circuit, and a first terminal of the switch 107 are electrically connected to one another, and the connection point is referred to as a node P. A node where one of a source and a drain of the transistor 113 and one of a source and a drain of the transistor 114 are connected to each other is referred to as a node Q of the logic circuit 101, and a node where one of a source and a drain of the transistor 111 and one of a source and a drain of the transistor 112 are connected to each other is referred to as a node R of the logic circuit 101. In addition, a second power supply potential V2 (e.g., VSS) is input to the node Q, and a third power supply potential V3 (e.g., VDD) is input to the node R.

The memory circuit 102 includes a transistor 115 and a capacitor 116. Here, one of a source and a drain of the transistor 115 is connected to the node O of the logic circuit 101, and the other of the source and the drain of the transistor 115 is connected to one of a pair of electrodes of the capacitor 116. A point where the transistor 115 and the capacitor 116 are connected to each other is referred to as a node M. A control signal S2 is input to a gate of the transistor 115.

The memory circuit 103 includes a transistor 117 and a capacitor 118. Here, one of a source and a drain of the transistor 117 is connected to the node P of the logic circuit 101, and the other of the source and the drain of the transistor 117 is connected to one of a pair of electrodes of the capacitor 118. A point where the transistor 117 and the capacitor 118 are connected to each other is referred to as a node N. The control signal S2 is input to a gate of the transistor 117.

Here, the transistor 115 and the transistor 117 each preferably have low off-state current. Specifically, the off-state current density is preferably less than or equal to 100 zA/μm, more preferably less than or equal to 10 zA/μm. As the transistor with low off-state current, it is preferable to use a transistor whose channel is formed in a layer or a substrate formed using a semiconductor with a larger bandgap than silicon. As an example of a semiconductor whose bandgap is greater than or equal to 2 eV, preferably greater than or equal to 2.5 eV, more preferably greater than or equal to 3 eV, an oxide semiconductor can be given. A transistor whose channel is formed in an oxide semiconductor has a characteristic of extremely low off-state current.

Therefore, when a transistor whose channel is formed in an oxide semiconductor is used as the transistor 115, a potential of the node M can be kept for a long time with the transistor 115 being in an off state. Similarly, when a transistor whose channel is formed in an oxide semiconductor is used as the transistor 117, a potential of the node N can be kept for a long time with the transistor 117 being in an off state.

In the case where an In—Sn—Zn—O-based material is used as an oxide semiconductor material, the field-effect mobility of the transistor can be 30 $cm^2$/Vsec or higher, preferably 40 $cm^2$/Vsec or higher, more preferably 60 $cm^2$/Vsec or higher, so that the memory circuit 102 and the memory circuit 103 can operate at high speed.

The switch 106 includes a transistor 123. A first terminal of the switch 106 corresponds to one of a source and a drain of the transistor 123, a second terminal thereof corresponds to the other of the source and the drain of the transistor 123, and a third terminal thereof corresponds to a gate of the transistor 123. The first terminal of the switch 106 is connected to the node O of the logic circuit 101. Data D is input to the second terminal of the switch 106. The case where an n-channel transistor is used as the switch 106 is described; however, a p-channel transistor may be used. Alternatively, the switch 106 may be a combination of an n-channel transistor and a p-channel transistor. For example, the switch 106 may be an analog switch.

The switch 107 includes a transistor 124. A first terminal of the switch 107 corresponds to one of a source and a drain of the transistor 124, a second terminal thereof corresponds to the other of the source and the drain of the transistor 124, and a third terminal thereof corresponds to a gate of the transistor 124. The first terminal of the switch 107 is connected to the node P of the logic circuit 101. Data DB is input to the second terminal of the switch 107. The case where an n-channel transistor is used as the switch 107 is described; however, a p-channel transistor may be used. Alternatively, the switch 107 may be a combination of an n-channel transistor and a p-channel transistor. For example, the switch 107 may be an analog switch.

A control signal S1 is input to the third terminal of the switch 106 and the third terminal of the switch 107. When the control signal S1 is input to the third terminal of the switch 106, conduction or non-conduction between the first terminal and the second terminal (on or off state of the transistor 123) is selected. Similarly, when the control signal S1 is input to the third terminal of the switch 107, conduction or non-conduction between the first terminal and the second terminal (on or off state of the transistor 124) is selected.

The precharge circuit 108 includes a transistor 125, a transistor 126, and a transistor 127. One of a source and a drain of the transistor 125 and one of a source and a drain of the transistor 126 are connected to the node O of the logic circuit 101. The other of the source and the drain of the transistor 125 and one of a source and a drain of the transistor 127 are connected to the node P of the logic circuit 101. A precharge potential $V_{PRE}$ (e.g., VDD/2) is supplied from the other of the source and the drain of the transistor 126 and the other of the source and the drain of the transistor 127. A control signal S3 is input to gates of the transistors 125, 126, and 127.

In this embodiment, the transistors 111 and 112 are p-channel transistors, and the transistors 115, 117, and 123 to 127 are n-channel transistors; however, one embodiment of the present invention is not limited thereto, and the conductivity types of the transistors can be set as appropriate.

<Driving Method 1 of Memory Device>

Next, a driving method of the memory device 100 in FIG. 1 will be described with reference to a timing chart in FIG. 2.

Figure 2:
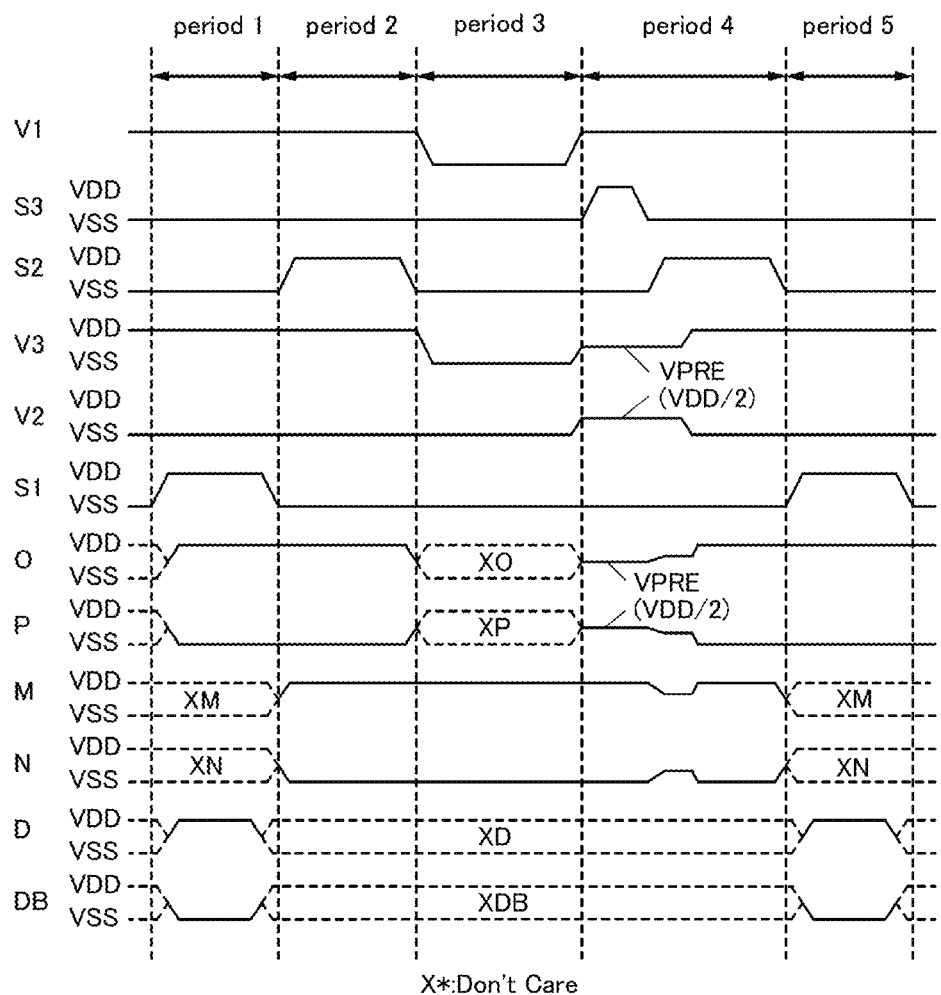
FIG. 2 is a timing chart showing operation of a memory device.

In the timing chart in FIG. 2, V1 represents a first power supply potential (a main power supply); S1, a potential of the control signal S1; S2, a potential of the control signal S2; S3, a potential of the control signal S3; O, a potential of the node O of the logic circuit 101; P, a potential of the node P of the logic circuit 101; V2, a second power supply potential; V3, a third power supply potential; M, a potential of the node M; N, a potential of the node N; D, a potential of the data D; and DB, a potential of the data DB. The description is made by referring to a low-level potential (also referred to as a first potential) as VSS, a precharge potential $V_{PRE}$ as (VDD/2), and a high-level potential (also referred to as a second potential) as VDD. The case where the data D has the high-level potential and the data DB has the low-level potential is described; however, the data D may have the low-level potential and the data DB may have the high-level potential.

A period 1 is a period for writing data to the logic circuit 101. In the period 1, the high-level potential is supplied to the third terminals of the switches 106 and 107 as the control signal S1. Thus, electrical continuity between the first terminal and the second terminal is established in each of the switches 106 and 107. A potential of the data D (high-level potential) is supplied to the input terminal of the second inverter circuit through the switch 106, so that the transistor 114 is turned on. In addition, a potential of the data DB (low-level potential) is supplied to the input terminal of the first inverter circuit through the switch 107, so that the transistor 111 is turned on.

The low-level potential is supplied to the node Q as the second power supply potential V2, and the high-level potential is supplied to the node R as the third power supply potential V3.

Thus, the logic circuit 101 can be activated, and the data D and the data DB can be held in the node O and the node P. After that, the low-level potential is supplied to the third terminals of the switches 106 and 107 as the control signal S1, whereby electrical discontinuity between the first terminal and the second terminal is established in each of the switches 106 and 107.

A period 2 is a period for writing the data D and data DB written to the logic circuit 101 to the memory circuit 102 and the memory circuit 103, respectively. In the period 2, the high-level potential is supplied to the gates of the transistors 115 and 117 as the control signal S2, so that the transistors 115 and 117 are turned on. Thus, the potentials of the data D and data DB held in the node O and the node P of the logic circuit 101 are supplied to the node M and the node N, respectively. After that, the low-level potential is supplied to the gates of the transistors 115 and 117 as the control signal S2, so that the transistors 115 and 117 are turned off.

A period 3 is a period for stopping supply of power. In the period 3, the first power supply potential V1 is changed to the low-level potential, so that supply of power to the memory device 100 is stopped. At the same time, the third power supply potential V3 is changed to the low-level potential.

The potentials of the nodes O and P of the logic circuit 101 cannot be held because the supply of power is stopped.

In one embodiment of the present invention, a transistor with low off-state current is used as each of the transistors 115 and 117. A transistor in which a channel is formed in an oxide semiconductor film can be used as the transistor with low off-state current. Such a transistor has a characteristic of extremely low off-state current. Therefore, even when the transistor 115 and the transistor 117 are off, a potential held by the capacitor 116 (potential of the node M) and a potential held by the capacitor 118 (potential of the node N) can be held for a long time. In other words, after the supply of power is stopped, the potentials which have been held in the nodes O and P of the logic circuit 101 can be held in the nodes M and N.

After that, the first power supply potential V1 is changed to the high-level potential, so that the supply of power to the memory device 100 is restarted. At the same time, the precharge potential $V_{PRE}$ (a third potential (e.g., VDD/2) between the first potential and the second potential) is supplied to the node Q as the second power supply potential V2, and the third potential is supplied to the node R as the third power supply potential V3.

A period 4 is a period for restoring the data D and data DB held in the memory circuit 102 and the memory circuit 103 to the node O and the node P of the logic circuit 101. First, the high-level potential is supplied to the gates of the transistors 125, 126, and 127 as the control signal S3, so that the transistors 125, 126, and 127 are turned on. Thus, the precharge potential $V_{PRE}$ (the third potential (e.g., VDD/2) between the first potential and the second potential) is supplied from the one of the source and the drain of the transistor 126 and the one of the source and the drain of the transistor 127 to the node O and the node P of the logic circuit 101, so that the potentials of the nodes O and P become the third potentials (e.g., VDD/2). After that, the low-level potential is supplied to the gates of the transistors 125, 126, and 127 as the control signal S3, so that the transistors 125, 126, and 127 are turned off.

Next, the high-level potential is supplied to the gates of the transistors 115 and 117 as the control signal S2, so that the transistors 115 and 117 are turned on. Thus, the potentials of the nodes O and P of the logic circuit 101 vary. For example, in the case where the high-level potential is held in the memory circuit 102 and the low-level potential is held in the memory circuit 103, the potential of the node O of the logic circuit 101 gradually increases and the potential of the node P of the logic circuit 101 gradually decreases. After the difference between the potential of the node O and the potential of the node P becomes ΔV, the low-level potential is supplied to the node Q as the second power supply potential V2 and the high-level potential is supplied to the node R as the third power supply potential V3. Specifically, ΔV is represented by the following formula (1).

$$\Delta V = \frac{C_s}{C_s + C} V \qquad (1)$$

V represents the high-level potential held in the memory circuit 102 or the memory circuit 103; $C_s$, capacitance of the capacitor 116 or the capacitor 118; and C, parasitic capacitance of a wiring (also referred to as a bit line) connecting the transistor 126 and the transistor 115 or parasitic capacitance of a wiring (also referred to as an inverted bit line) connecting the transistor 127 and the transistor 117. Note that in this embodiment, the high-level potential is held in the node M; therefore, V represents a potential held in the node M of the memory circuit 102, $C_s$ represents capacitance of the capacitor 116, and C represents parasitic capacitance of the wiring connecting the transistor 126 and the transistor 115.

After the difference between the potential of the node O and the potential of the node P becomes ΔV, the low-level potential is supplied to the node Q as the second power supply potential V2 and the high-level potential is supplied to the node R as the third power supply potential V3, whereby the potentials of the nodes O and P can be effectively amplified. Thus, the potential of the node O of the logic circuit 101 becomes the high-level potential and the potential of the node P of the logic circuit 101 becomes the low-level potential.

Thus, the logic circuit 101 can be activated, and the data D and the data DB can be held in the node O and the node P again. After that, the low-level potential is supplied to the gates of the transistors 115 and 117 as the control signal S2, whereby the transistors 115 and 117 are turned off.

A period 5 is a period for reading the data held in the nodes O and P of the logic circuit 101. In the period 5, the high-level potential is supplied to the third terminals of the switches 106 and 107 as the control signal S1, so that electrical continuity between the first terminal and the second terminal is established in each of the switches 106 and 107. The data D held in the node O of the logic circuit 101 can be read through the switch 106, and the data DB held in the node P of the logic circuit 101 can be read through the switch 107. After reading is completed, the low-level potential is supplied to the third terminals of the switches 106 and 107 as the control signal S1, whereby electrical discontinuity between the first terminal and the second terminal is established in each of the switches 106 and 107.

The foregoing has described the driving method of the memory device 100.

In a memory device of one embodiment of the present invention, a memory circuit including a transistor with low off-state current is provided in a memory element. A transistor in which a channel is formed in an oxide semiconductor film can be used as the transistor with low off-state current. Such a transistor has a characteristic of extremely low off-state current. Thus, even when the transistor is off, a potential can be held in a capacitor connected to the transistor for a long time. Therefore, even after supply of power is stopped, a logic state of the logic circuit included in the memory element can be held. With the use of a plurality of such memory elements, a memory device which can keep a stored logic state even when the power is off can be provided.

In the memory device according to one embodiment of the present invention, the data D and data DB held in the logic circuit 101 are respectively held in the memory circuit 102 and the memory circuit 103 which are connected to the logic circuit 101 before the supply of power is stopped. Accordingly, since it is not necessary to transfer the data held in the memory device to another memory device before the supply of power is stopped, the supply of power can be stopped in a short time.

In the memory device according to one embodiment of the present invention, the precharge circuit connected to the logic circuit 101, the memory circuit 102, and the memory circuit 103 is provided. When the supply of power is restarted and data held in the memory circuits 102 and 103 is restored to the logic circuit 101, the precharge potential $V_{PRE}$ is supplied from the precharge circuit to the node O where the logic circuit 101 and the memory circuit 102 are connected to each other and the node P where the logic circuit 101 and the memory circuit 103 are connected to each other. Thus, the potentials of the nodes O and P of the logic circuit 101 vary depending on the potentials held in the memory circuits 102 and 103, and the potentials of the nodes O and P can be set to the potentials held before the supply of power is stopped. Therefore, the data can be restored from the memory circuits 102 and 103 to the nodes O and P of the logic circuit 101 in a short time.

With the use of the memory device according to one embodiment of the present invention for a signal processing circuit, power consumption can be reduced in the case where supply of power is stopped for a short time.

<Driving Method 2 of Memory Device>

Next, another driving method of the memory device 100 in FIG. 1 will be described with reference to a timing chart in FIG. 3.

A period 1 is a period for writing data to the logic circuit 101, the memory circuit 102, and the memory circuit 103. In the period 1, the high-level potential is supplied to the gates of the transistors 115 and 117 as the control signal S2. Thus, the transistors 115 and 117 are on. After that, the high-level potential is supplied to the third terminals of the switches 106 and 107 as the control signal S1. Thus, electrical continuity between the first terminal and the second terminal is established in each of the switches 106 and 107. A potential of the data D (high-level potential) is supplied to the input terminal of the second inverter circuit through the switch 106, so that the transistor 114 is turned on. In addition, a potential of the data DB (low-level potential) is supplied to the input terminal of the first inverter circuit through the switch 107, so that the transistor 111 is turned on.

The low-level potential is supplied to the node Q as the second power supply potential V2, and the high-level potential is supplied to the node R as the third power supply potential V3.

Thus, the logic circuit 101 can be activated, and the data D and the data DB can be held in the node O and the node P. At this time, since the transistors 115 and 117 are on, the potentials of the data D and data DB held in the node O and node P of the logic circuit 101 can be supplied to the node M and the node N through the transistor 115 and the transistor 117, respectively.

After that, the low-level potential is supplied to the third terminals of the switches 106 and 107 as the control signal S1, whereby electrical discontinuity between the first terminal and the second terminal is established in each of the switches 106 and 107. Further, when the control signal S2 is changed to the low-level potential, the transistors 115 and 117 are turned off.

Figure 3:
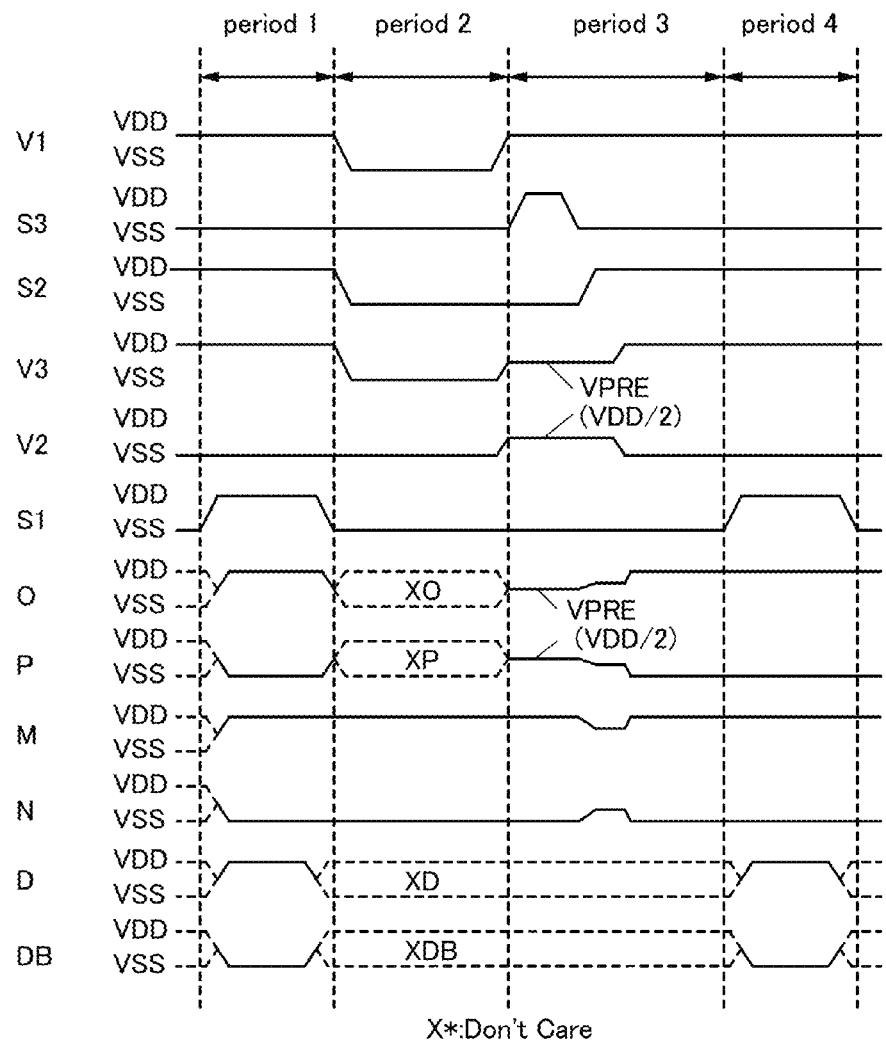
FIG. 3 is a timing chart showing operation of a memory device.

By the driving method of a memory device in FIG. 3, the data D and the data DB can be held in the memory circuit 102 and the memory circuit 103 in a short time as compared to the case where the data D and the data DB are held in the logic circuit 101 and then held in the memory circuit 102 and the memory circuit 103, respectively.

A period 2 is a period for stopping supply of power. In the period 2, the first power supply potential V1 is changed to the low-level potential, so that supply of power to the memory device 100 is stopped. At the same time, the third power supply potential V3 is changed to the low-level potential.

The potentials of the nodes O and P of the logic circuit 101 cannot be held because the supply of power is stopped.

In one embodiment of the present invention, a transistor with low off-state current is used as each of the transistors 115 and 117. A transistor in which a channel is formed in an oxide semiconductor film can be used as the transistor with low off-state current. Such a transistor has a characteristic of extremely low off-state current. Therefore, even when the transistor 115 and the transistor 117 are off, a potential held by the capacitor 116 (potential of the node M) and a potential held by the capacitor 118 (potential of the node N) can be held for a long time. In other words, after the supply of power is stopped, the potentials which have been held in the nodes O and P of the logic circuit 101 can be held in the nodes M and N.

After that, the first power supply potential V1 is changed to the high-level potential, so that the supply of power to the memory device 100 is restarted. At the same time, the precharge potential $V_{PRE}$ (the third potential (e.g., VDD/2) between the first potential and the second potential) is supplied to the node Q as the second power supply potential V2, and the third potential is supplied to the node R as the third power supply potential V3.

A period 3 is a period for restoring the data D and data DB held in the memory circuit 102 and the memory circuit 103 to the node O and the node P of the logic circuit 101. First, the high-level potential is supplied to the gates of the transistors 125, 126, and 127 as the control signal S3, so that the transistors 125, 126, and 127 are turned on. Thus, the precharge potential $V_{PRE}$ (the third potential (e.g., VDD/2) between the first potential and the second potential) is supplied from the one of the source and the drain of the transistor 126 and the one of the source and the drain of the transistor 127 to the node O and the node P of the logic circuit 101, so that the potentials of the nodes O and P become the third potentials (e.g., VDD/2). After that, the low-level potential is supplied to the gates of the transistors 125, 126, and 127 as the control signal S3, so that the transistors 125, 126, and 127 are turned off.

Next, the high-level potential is supplied to the gates of the transistors 115 and 117 as the control signal S2, so that the transistors 115 and 117 are turned on. Thus, the potentials of the nodes O and P of the logic circuit 101 vary. For example, in the case where the high-level potential is held in the memory circuit 102 and the low-level potential is held in the memory circuit 103, the potential of the node O of the logic circuit 101 gradually increases and the potential of the node P of the logic circuit 101 gradually decreases. After the difference between the potential of the node O and the potential of the node P becomes ΔV, the low-level potential is supplied to the node Q as the second power supply potential V2 and the high-level potential is supplied to the node R as the third power supply potential V3. Specifically, ΔV is represented by the following formula (1).

$$\Delta V = \frac{C_s}{C_s + C} V \quad (1)$$

After the difference between the potential of the node O and the potential of the node P becomes ΔV, the low-level potential is supplied to the node Q as the second power supply potential V2 and the high-level potential is supplied to the node R as the third power supply potential V3, whereby the potentials of the nodes O and P can be effectively amplified. Thus, the potential of the node O of the logic circuit 101 becomes the high-level potential and the potential of the node P of the logic circuit 101 becomes the low-level potential.

Thus, the logic circuit 101 can be activated, and the data D and the data DB can be held in the node O and the node P again. After that, the low-level potential is supplied to the gates of the transistors 115 and 117 as the control signal S2, whereby the transistors 115 and 117 are turned off.

A period 4 is a period for reading the data held in the nodes O and P of the logic circuit 101. In the period 4, the high-level potential is supplied to the third terminals of the switches 106 and 107 as the control signal S1, so that electrical continuity between the first terminal and the second terminal is established in each of the switches 106 and 107. The data D held in the node O of the logic circuit 101 can be read through the switch 106, and the data DB held in the node P of the logic circuit 101 can be read through the switch 107. After reading is completed, the low-level potential is supplied to the third terminals of the switches 106 and 107 as the control signal S1, whereby electrical discontinuity between the first terminal and the second terminal is established in each of the switches 106 and 107.

The foregoing has described the driving method of the memory device 100.

In a memory device of one embodiment of the present invention, a memory circuit including a transistor with low off-state current is provided in a memory element. A transistor in which a channel is formed in an oxide semiconductor film can be used as the transistor with low off-state current. Such a transistor has a characteristic of extremely low off-state current. Thus, even when the transistor is off, a potential can be held in a capacitor connected to the transistor for a long time. Therefore, even after supply of power is stopped, a logic state of the logic circuit included in the memory element can be held. With the use of a plurality of such memory elements, a memory device which can keep a stored logic state even when the power is off can be provided.

In the memory device according to one embodiment of the present invention, the data D and data DB held in the logic circuit 101 are respectively held in the memory circuit 102 and the memory circuit 103 which are connected to the logic circuit 101 before the supply of power is stopped. Accordingly, since it is not necessary to transfer the data held in the memory device to another memory device before the supply of power is stopped, the supply of power can be stopped in a short time.

In the memory device according to one embodiment of the present invention, the precharge circuit connected to the logic circuit 101, the memory circuit 102, and the memory circuit 103 is provided. When the supply of power is restarted and data held in the memory circuits 102 and 103 is restored to the logic circuit 101, the precharge potential $V_{PRE}$ is supplied from the precharge circuit to the node O where the logic circuit 101 and the memory circuit 102 are connected to each other and the node P where the logic circuit 101 and the memory circuit 103 are connected to each other. Thus, the potentials of the nodes O and P of the logic circuit 101 vary depending on the potentials held in the memory circuits 102 and 103, and the potentials of the nodes O and P can be set to the potentials held before the supply of power is stopped. Therefore, the data can be restored from the memory circuits 102 and 103 to the nodes O and P of the logic circuit 101 in a short time.

With the use of the memory device according to one embodiment of the present invention for a signal processing circuit, power consumption can be reduced in the case where supply of power is stopped for a short time.

<Structure of Memory Device>

Figure 4:
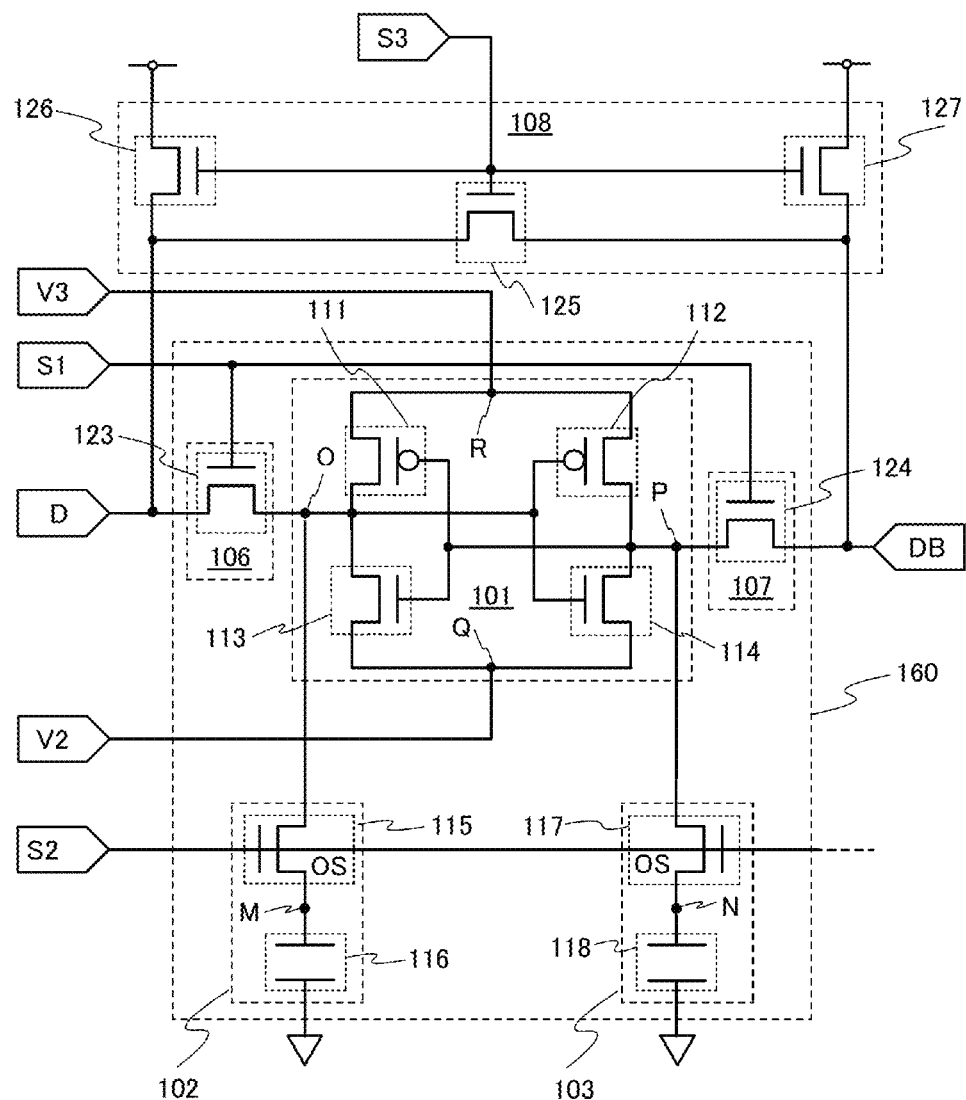
FIG. 4 is a circuit diagram of a memory device.

In FIG. 4, a memory device 150 partly different from the memory device 100 in FIG. 1 is illustrated. The memory device 150 includes a memory element 160 and the precharge circuit 108. The memory element 160 includes the logic circuit 101, the memory circuit 102, the memory circuit 103, the switch 106, and the switch 107.

In the memory device 150 in FIG. 4, one of a source and a drain of the transistor 125 and one of a source and a drain of the transistor 126 are connected to a second terminal of the switch 106, and the other of the source and the drain of the transistor 125 and one of a source and a drain of the transistor 127 which are included in the precharge circuit 108 are connected to a second terminal of the switch 107. Other structures are the same as those of the memory device 100 in FIG. 1 and thus are not described in detail.

<Structure of Memory Cell Array>

Figure 5:
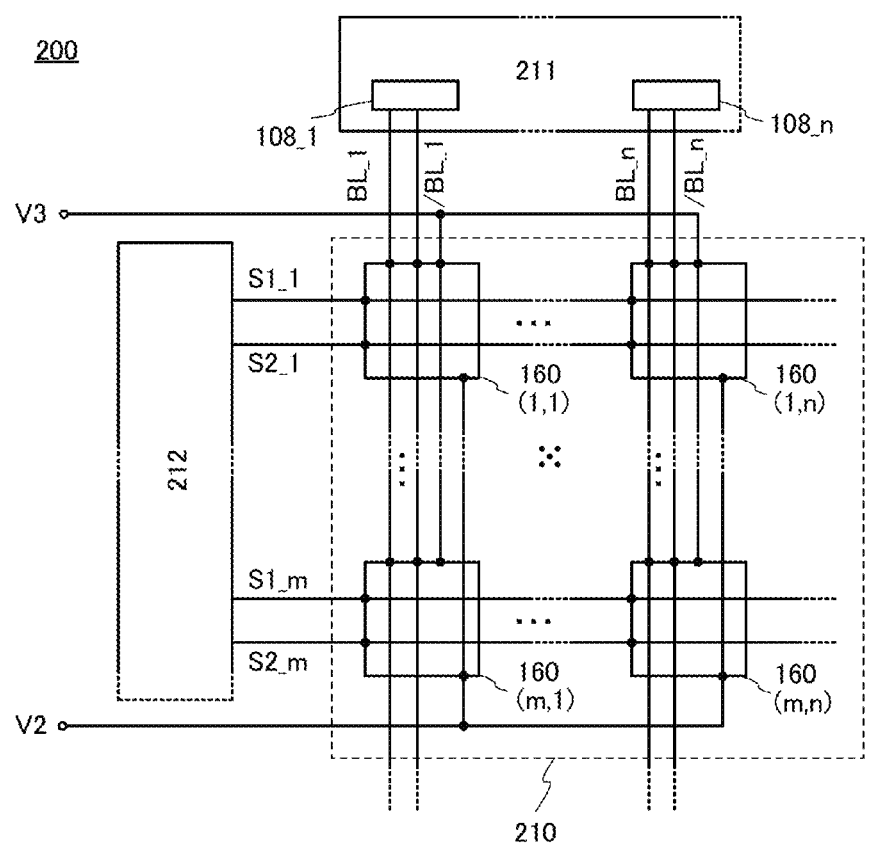
FIG. 5 is a circuit diagram of a memory cell array.

Next, the case where a plurality of the memory elements 160 in FIG. 4 form a memory cell array is illustrated in FIG. 5.

FIG. 5 is an example of a block diagram of a memory device including (m×n) memory elements 160. The case where the structure illustrated in FIG. 4 is used as the structure of the memory element 160 in FIG. 5 is described.

A memory device 200 in FIG. 5 includes m (m is an integer of 2 or more) signal lines S1, m signal lines S2, n (n is an integer of 2 or more) bit lines BL, n inverted bit lines (/BL), a first power supply line V1, a second power supply line V2, a third power supply line V3, a memory cell array 210 having the memory elements 160 arranged in matrix of m rows (in the vertical direction)×n columns (in the horizontal direction), a first driver circuit 211, and a second driver circuit 212. The first driver circuit 211 is connected to the n bit lines BL and the n inverted bit lines (/BL), and the second driver circuit 212 is connected to the m signal lines S1 and the m signal lines S2. The first power supply line V1 (not illustrated) supplies power to the memory device 200, and the second power supply line V2 and the third power supply line V3 are connected to the memory elements 160(1, 1) to 160(m, n). Note that precharge circuits 108_1 to 108_n are provided in the first driver circuit 211.

Access to the memory elements 160(1, 1) to 160(m, n) is performed through the signal lines S1 and the signal lines S2. Data is written and read to/from the memory cells connected to the respective bit lines BL and inverted bit lines (/BL).

The first driver circuit 211 controls access through the bit lines BL and the inverted bit lines (/BL) to the memory cells in the horizontal direction. On the other hand, the second driver circuit 212 controls access through the signal lines S1 and the signal lines S2 to the memory cells in the vertical direction.

With the above operation, random access to the memory cell array 210 in FIG. 5 is possible.

Note that the case of using the memory element 160 in FIG. 4 is described in FIG. 5; however, the memory element 110 in FIG. 1 also can be used. In the case where the memory element 110 in FIG. 1 is used as the memory element in the memory device, it is preferable that a precharge circuit be not provided in the first driver circuit 211 but provided in each of the memory elements 110 to form a memory cell array.

<Driving Method of Memory Device>

Figure 6:
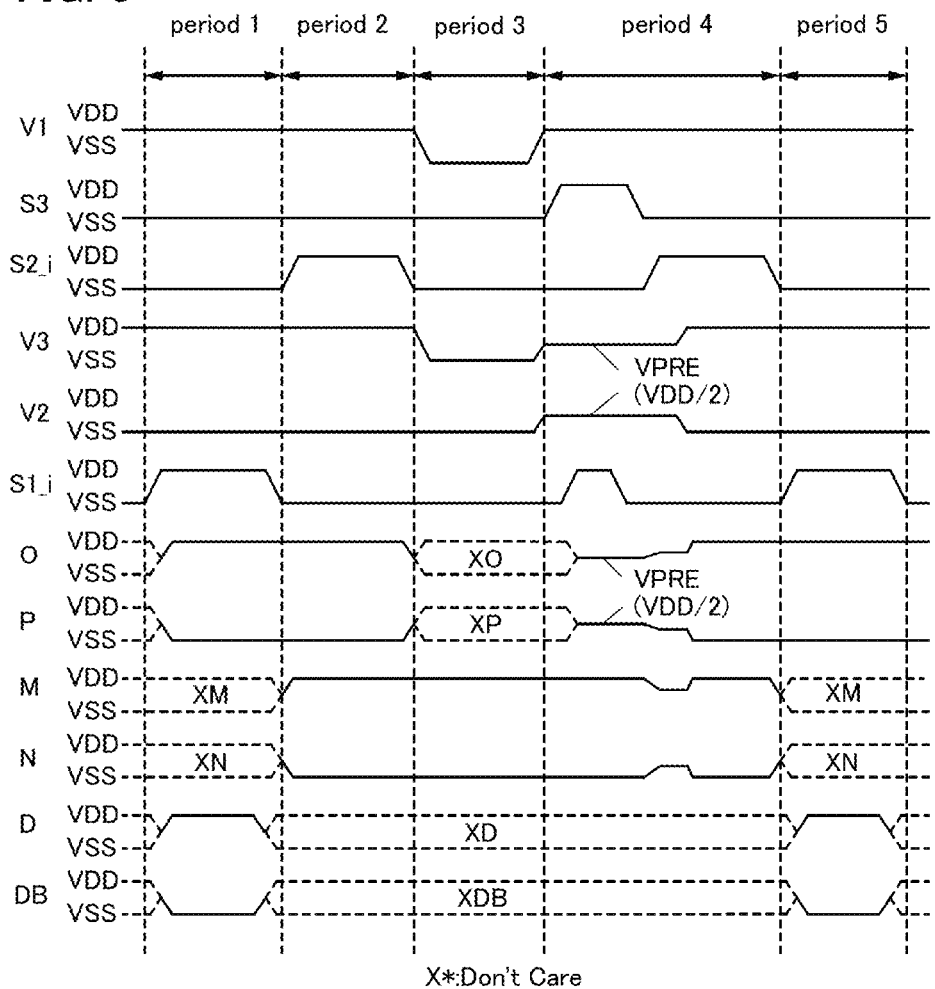
FIG. 6 is a timing chart showing operation of a memory device.

Next, a driving method of the memory device 200 in FIG. 5 will be described with reference to a timing chart in FIG. 6.

In this embodiment, the case where data is written to an i-th row (i is a natural number of greater than or equal to 1 and less than or equal to m) of the memory cell array 210 in FIG. 5, supply of power is stopped, the supply of power is restarted, and the data is read will be described. The timing chart in FIG. 6 illustrates operation of the memory elements 160(i, 1) to 160(i, n) in the i-th row.

A period 1 is a period for writing data to the logic circuits 101 included in the memory elements 160(i, 1) to 160(i, n) in the i-th row. In the period 1, the high-level potential is supplied to the third terminals of the switch 106 and the switch 107 included in each of the memory elements 160(i, 1) to 160(i, n), as a control signal S1_i in the i-th row. Thus, electrical continuity between the first terminal and the second terminal is established in each of the switches 106 and 107. In each of the memory elements 160(i, 1) to 160(i, n), a potential of the data D (high-level potential) is supplied to the input terminal of the second inverter circuit through the switch 106, so that the transistor 114 is turned on. In addition, a potential of the data DB (low-level potential) is supplied to the input terminal of the first inverter circuit through the switch 107, so that the transistor 111 is turned on. Note that control signals S1 in rows except the i-th row, in which data is not written to the logic circuit 101, are set to the low-level potential.

In each of the memory elements 160(i, 1) to 160(i, n), the low-level potential is supplied to the node Q as the second power supply potential V2, and the high-level potential is supplied to the node R as the third power supply potential V3.

Thus, the logic circuit 101 in each of the memory elements 160(i, 1) to 160(i, n) can be activated, and the data D and the data DB can be held in the node O and the node P. After that, the low-level potential is supplied to the third terminals of the switches 106 and 107 as the control signal S1_i in the i-th row, whereby electrical discontinuity between the first terminal and the second terminal is established in each of the switches 106 and 107.

A period 2 is a period for writing the data D and data DB written to the logic circuit 101 to the memory circuit 102 and the memory circuit 103, respectively, in each of the memory elements 160(i, 1) to 160(i, n) in the i-th row. In the period 2, the high-level potential is supplied to the gates of the transistors 115 and 117 as a control signal S2_i in the i-th row, so that the transistors 115 and 117 are turned on. Thus, the potentials of the data D and data DB held in the node O and the node P of the logic circuit 101 are supplied to the node M and the node N, respectively. After that, the low-level potential is supplied to the gates of the transistors 115 and 117 as the control signal S2 in the i-th row, so that the transistors 115 and 117 are turned off. Note that the control signals S2 in the rows except the i-th row, in which the data is not written to the logic circuit 101, are set to the low-level potentials.

A period 3 is a period for stopping supply of power. In the period 3, the first power supply potential V1 is changed to the low-level potential, so that the supply of power to the memory device 200 is stopped. At the same time, the third power supply potential V3 is changed to the low-level potential.

The potentials of the nodes O and P of the logic circuit 101 in each of the memory elements 160(i, 1) to 160(i, n) in the i-th row cannot be held because the supply of power is stopped.

In one embodiment of the present invention, a transistor with low off-state current is used as each of the transistors 115 and 117. A transistor in which a channel is formed in an oxide semiconductor film can be used as the transistor with low off-state current. Such a transistor has a characteristic of extremely low off-state current. Therefore, even when the transistor 115 and the transistor 117 are off, a potential held by the capacitor 116 (potential of the node M) and a potential held by the capacitor 118 (potential of the node N) can be held for a long time. In other words, after the supply of power is stopped, the potentials which have been held in the nodes O and P of the logic circuit 101 can be held in the nodes M and N.

After that, the first power supply potential V1 is changed to the high-level potential, so that the supply of power to the memory device 200 is restarted. At the same time, the precharge potential $V_{PRE}$ (the third potential (e.g., VDD/2) between the first potential and the second potential) is supplied to the node Q of the logic circuit 101 in each of the memory elements 160(i, 1) to 160(i, n) in the i-th row as the second power supply potential V2, and the third potential is supplied to the node R as the third power supply potential V3.

A period 4 is a period for restoring the data D and data DB held in the memory circuit 102 and the memory circuit 103 in each of the memory elements 160(i, 1) to 160(i, n) in the i-th row to the node O and the node P of the logic circuit 101. First, the high-level potential is supplied to the gates of the transistors 125, 126, and 127 in the first column to the n-th column as the control signal S3 in the first column to the n-th column, so that the transistors 125, 126, and 127 are turned on. Thus, the precharge potential $V_{PRE}$ (the third potential (e.g., VDD/2) between the first potential and the second potential) is supplied from the one of the source and the drain of the transistor 126 and the one of the source and the drain of the transistor 127 to the node O and the node P of the logic circuit 101, so that the potentials of the nodes O and P become the third potentials (e.g., VDD/2). After that, the low-level potential is supplied to the gates of the transistors 125, 126, and 127 as the control signal S3 in the first column to the n-th column, so that the transistors 125, 126, and 127 are turned off.

Next, the high-level potential is supplied to the gates of the transistors 115 and 117 as the control signal S2_*i* in the i-th row, so that the transistors 115 and 117 are turned on. Thus, the potentials of the nodes O and P of the logic circuit 101 vary. For example, in the case where the high-level potential is held in the memory circuit 102 and the low-level potential is held in the memory circuit 103, the potential of the node O of the logic circuit 101 gradually increases and the potential of the node P of the logic circuit 101 gradually decreases. After the difference between the potential of the node O and the potential of the node P becomes ΔV, the low-level potential is supplied to the node Q as the second power supply potential V2 and the high-level potential is supplied to the node R as the third power supply potential V3. Specifically, ΔV is represented by the following formula (1).

$$\Delta V = \frac{C_s}{C_s + C} V \quad (1)$$

After the difference between the potential of the node O and the potential of the node P becomes ΔV, the low-level potential is supplied to the node Q as the second power supply potential V2 and the high-level potential is supplied to the node R as the third power supply potential V3, whereby the potentials of the nodes O and P can be effectively amplified. Thus, the potential of the node O of the logic circuit 101 becomes the high-level potential and the potential of the node P of the logic circuit 101 becomes the low-level potential.

Thus, the logic circuit 101 in each of the memory elements 160(*i*, 1) to 160(*i*, *n*) in the i-th row can be activated, and the data D and the data DB can be held in the node O and the node P again. After that, the low-level potential is supplied to the gates of the transistors 115 and 117 as the control signal S2_*i* in the i-th row, whereby the transistors 115 and 117 are turned off.

A period 5 is a period for reading the data held in the node O and the node P of the logic circuit 101 in each of the memory elements 160(*i*, 1) to 160(*i*, *n*) in the i-th row. In the period 5, the high-level potential is supplied to the third terminals of the switches 106 and 107 as the control signal in the i-th row, so that electrical continuity between the first terminal and the second terminal is established in each of the switches 106 and 107. The data D held in the node O of the logic circuit 101 can be read through the switch 106, and the data DB held in the node P of the logic circuit 101 can be read through the switch 107.

In a memory device of one embodiment of the present invention, a memory circuit including a transistor with low off-state current is provided in a memory element. A transistor in which a channel is formed in an oxide semiconductor film can be used as the transistor with low off-state current. Such a transistor has a characteristic of extremely low off-state current. Even when the transistor is off, a potential can be held in a capacitor connected to the transistor for a long time. Therefore, even after supply of power is stopped, a logic state of the logic circuit included in the memory element can be held. With the use of a plurality of such memory elements, a memory device which can keep a stored logic state even when the power is off can be provided.

In the memory device according to one embodiment of the present invention, the data D and data DB held in the logic circuit 101 are respectively held in the memory circuit 102 and the memory circuit 103 which are connected to the logic circuit 101 before the supply of power is stopped. Accordingly, since it is not necessary to transfer the data held in the memory device to another memory device before the supply of power is stopped, the supply of power can be stopped in a short time.

In the memory device according to one embodiment of the present invention, the precharge circuit connected to the logic circuit 101, the memory circuit 102, and the memory circuit 103 is provided. When the supply of power is restarted and data held in the memory circuits 102 and 103 is restored to the logic circuit 101, the precharge potential $V_{PRE}$ is supplied from the precharge circuit to the node O where the logic circuit 101 and the memory circuit 102 are connected to each other and the node P where the logic circuit 101 and the memory circuit 103 are connected to each other. Thus, the potentials of the nodes O and P of the logic circuit 101 vary depending on the potentials held in the memory circuits 102 and 103, and the potentials of the nodes O and P can be set to the potentials held before the supply of power is stopped. Therefore, the data can be restored from the memory circuits 102 and 103 to the nodes O and P of the logic circuit 101 in a short time.

With the use of the memory device according to one embodiment of the present invention for a signal processing circuit, power consumption can be reduced in the case where supply of power is stopped for a short time.

This embodiment can be implemented in appropriate combination with any of the structures described in the other embodiments.

Embodiment 2

In this embodiment, an example of a manufacturing method of the memory element described in Embodiment 1 will be described with reference to FIGS. 7A to 7E, FIGS. 8A to 8D, FIGS. 9A to 9D, and FIGS. 10A and 10B. First, a manufacturing method of a transistor in a lower portion of the memory device will be described, and then, a manufacturing method of a transistor and a capacitor in an upper portion of the memory device will be described. Note that in cross-sectional views illustrating a manufacturing process, A1-A2 is a cross section illustrating a manufacturing step of an n-channel transistor and B1-B2 is a cross section illustrating a manufacturing step of a p-channel transistor.

<Manufacturing Method of Transistor in Lower Portion>

Figure 7A:
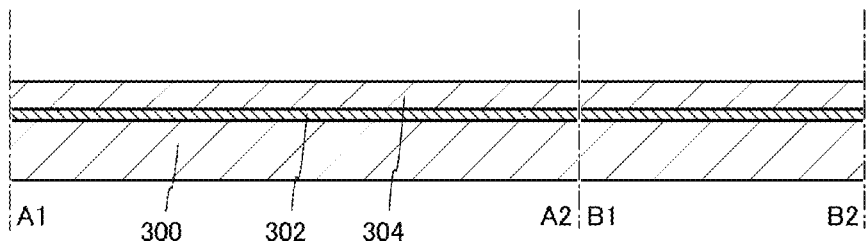
FIGS. 7A to 7E illustrate a method for manufacturing a memory device.

First, a substrate 300 over which a semiconductor film 304 is provided with an insulating film 302 interposed therebetween is prepared (see FIG. 7A).

As the substrate 300, for example, a single crystal semiconductor substrate or a polycrystalline semiconductor substrate containing silicon, silicon carbide, or the like, or a compound semiconductor substrate containing silicon germanium, gallium arsenide, indium phosphide, or the like can be used. Specific examples thereof are a variety of glass substrates that are used in the electronics industry, such as substrates of aluminosilicate glass, aluminoborosilicate glass, and barium borosilicate glass, a quartz substrate, a ceramic substrate, and a sapphire substrate.

The insulating film 302 is formed to have a single-layer structure or a stacked-layer structure using silicon oxide, silicon oxynitride, silicon nitride, or the like. As a formation method of the insulating film 302, a thermal oxidation method, a CVD method, a sputtering method, or the like can be used. The thickness of the insulating film 302 is greater than or equal to 1 nm and less than or equal to 100 nm, preferably greater than or equal to 10 nm and less than or equal to 50 nm.

As the semiconductor film 304, a single crystal semiconductor material or a polycrystalline semiconductor material of silicon, silicon carbide, or the like, or a compound semiconductor material of silicon germanium, gallium arsenide, indium phosphide, or the like can be used. Since the semiconductor film 304 does not include an oxide semiconductor material, the semiconductor film 304 is also referred to as a semiconductor material other than an oxide semiconductor.

As the semiconductor film 304, a single crystal semiconductor material of silicon or the like is preferably used because in that case, the logic circuit 101, the switch 106, the switch 107, and the like which are described in Embodiment 1 can operate at higher speed.

Alternatively, an SOI substrate can be used as the substrate 300 over which the semiconductor film 304 is provided with the insulating film 302 interposed therebetween. Note that although the term "SOI substrate" generally means a substrate in which a silicon layer is provided on an insulating surface, the term "SOI substrate" in this specification and the like also includes a substrate in which a semiconductor film including a material other than silicon is provided on an insulating surface. That is, the semiconductor film included in the "SOI substrate" is not limited to a silicon layer. Moreover, the SOI substrate also includes a substrate having a structure in which a semiconductor film is provided over an insulating substrate such as a glass substrate with an insulating film interposed therebetween. In this embodiment, the case is described in which an SOI substrate in which a silicon film is provided over a single crystal silicon substrate with a silicon oxide film interposed therebetween is used as the substrate 300 over which the semiconductor film 304 is provided with the insulating film 302 interposed therebetween.

Figure 7B:
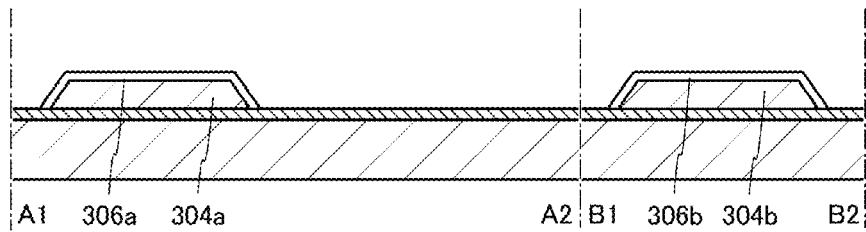

Next, the semiconductor film 304 is processed into an island shape, so that semiconductor films 304a and 304b are formed (see FIG. 7B). For the processing, dry etching is preferably performed, but wet etching may be performed. An etching gas and an etchant can be selected as appropriate depending on a material to be etched.

Next, gate insulating films 306a and 306b are formed so as to cover the semiconductor films 304a and 304b (see FIG. 7B). The gate insulating films 306a and 306b can be formed, for example, by performing heat treatment (e.g., thermal oxidation treatment, thermal nitridation treatment, or the like) on surfaces of the semiconductor films 304a and 304b. High-density plasma treatment may be employed instead of heat treatment. The high-density plasma treatment can be performed using, for example, a mixed gas of a rare gas such as He, Ar, Kr, or Xe and any of oxygen, nitrogen oxide, ammonia, nitrogen, and hydrogen. Needless to say, the gate insulating films may be formed by a CVD method, a sputtering method, or the like.

The gate insulating films 306a and 306b can be formed using silicon oxide, silicon oxynitride, silicon nitride, hafnium oxide, aluminum oxide, tantalum oxide, or the like. Alternatively, the gate insulating films may be formed using a material with a high dielectric constant (a high-k material) such as hafnium oxide, yttrium oxide, hafnium silicate (Hf-Si$_x$O$_y$ (x>0, y>0)), hafnium silicate to which nitrogen is added (HfSi$_x$O$_y$N$_z$ (x>0, y>0, z>0)), or hafnium aluminate to which nitrogen is added (HfAl$_x$O$_y$N$_z$ (x>0, y>0, z>0)). The gate insulating films are formed to have a single-layer structure or a stacked-layer structure using any of the above materials. The thickness of each of the gate insulating films 306a and 306b can be, for example, greater than or equal to 1 nm and less than or equal to 100 nm, preferably greater than or equal to 10 nm and less than or equal to 50 nm.

When the gate insulating films are thin as in the above description, a problem of gate leakage due to a tunneling effect or the like is caused. In order to solve the problem of gate leakage, the above high-k material is preferably used for the gate insulating films. With the use of a high-k material for the gate insulating films, the thickness of each of the gate insulating films can be increased to prevent gate leakage and electric characteristics can be maintained. Note that a stacked structure of a film including a high-k material and a film containing any of silicon oxide, silicon nitride, silicon oxynitride, silicon nitride oxide, aluminum oxide, and the like may be employed.

In this embodiment, a silicon oxide film is formed by oxidation treatment, whereby the gate insulating films 306a and 306b are formed.

Figure 7C:
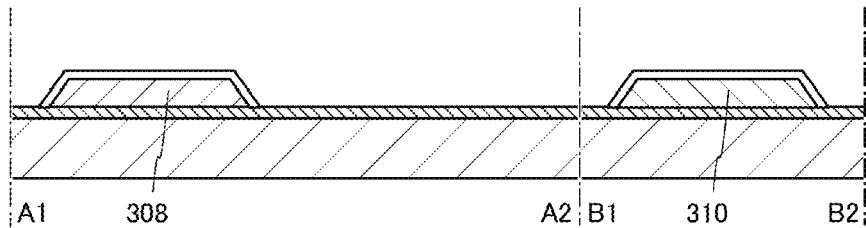

Next, an impurity element imparting n-type conductivity and an impurity element imparting p-type conductivity are added to the semiconductor films 304a and 304b through the gate insulating films 306a and 306b in order to control the threshold voltages of the transistors (see FIG. 7C). In the case where silicon is used for the semiconductor films 304a and 304b, for example, phosphorus, arsenic, or the like can be used as an impurity element imparting n-type conductivity. On the other hand, boron, aluminum, gallium, or the like can be used as an impurity element imparting p-type conductivity. In this embodiment, boron is added to the semiconductor film 304a through the gate insulating film 306a, so that an impurity region 308 is formed, and phosphorus is added to the semiconductor film 304b through the gate insulating film 306b, so that an impurity region 310 is formed.

Figure 7D:
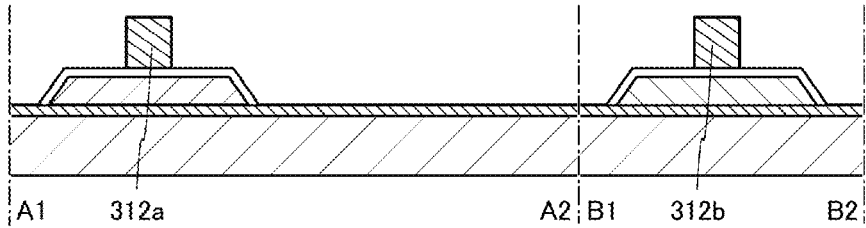

Next, a conductive film used for forming a gate electrode (including a wiring formed using the same layer as the gate electrode) is formed over the gate insulating films 306a and 306b and is processed, so that gate electrodes 312a and 312b are formed (see FIG. 7D).

The conductive film used for the gate electrodes 312a and 312b can be formed using a metal material such as aluminum, copper, titanium, tantalum, or tungsten. The conductive film may be formed using a semiconductor material such as polycrystalline silicon. There is no particular limitation on the method for forming the conductive film, and a variety of film formation methods such as an evaporation method, a CVD method, a sputtering method, and a spin coating method can be employed. The conductive film can be processed by etching with the use of a resist mask. In this embodiment, a tantalum nitride film and a tungsten film are stacked by a sputtering method and processed, so that the gate electrodes 312a and 312b are formed.

Figure 7E:
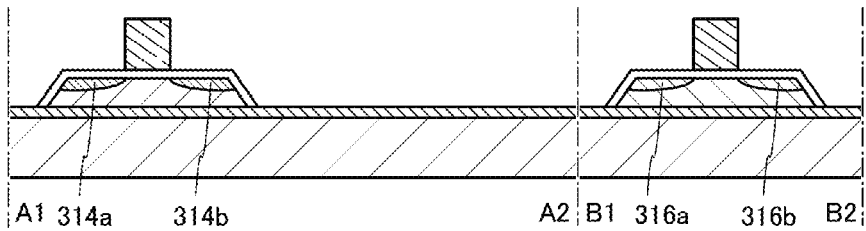

Next, an impurity element imparting n-type conductivity and an impurity element imparting p-type conductivity are added to the semiconductor films 304a and 304b using the gate electrodes 312a and 312b as masks through the gate insulating films 306a and 306b (see FIG. 7E). In this embodiment, phosphorus is added to the semiconductor film 304a through the gate insulating film 306a, so that impurity regions 314a and 314b are formed, and boron is added to the semiconductor film 304b through the gate insulating film 306b, so that impurity regions 316a and 316b are formed.

Figure 8A:
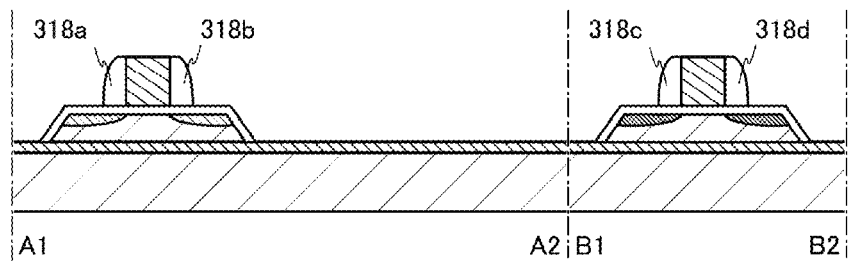
FIGS. 8A to 8D illustrate a method for manufacturing a memory device.

Next, sidewall insulating films 318a to 318d having a sidewall structure are formed on side surfaces of the gate electrodes 312a and 312b (see FIG. 8A). The sidewall insulating films 318a to 318d may be formed on the side surfaces of the gate electrodes 312a and 312b in a self-aligning manner, by forming an insulating film that covers the gate electrodes 312a and 312b, and then processing the insulating film by anisotropic etching by a reactive ion etching (RIE) method. There is no particular limitation on the insulating film; for example, the insulating film can be formed using silicon oxide with favorable step coverage, which is formed by reaction of tetraethyl ortho-silicate (TEOS), silane, or the like with oxygen, nitrous oxide, or the like. The insulating film may be formed using silicon oxide formed by a low temperature oxidation (LTO) method. The insulating film can be formed by a thermal CVD method, a plasma enhanced CVD method, an atmospheric pressure CVD method, a bias ECRCVD method, a sputtering method, or the like.

Figure 8B:
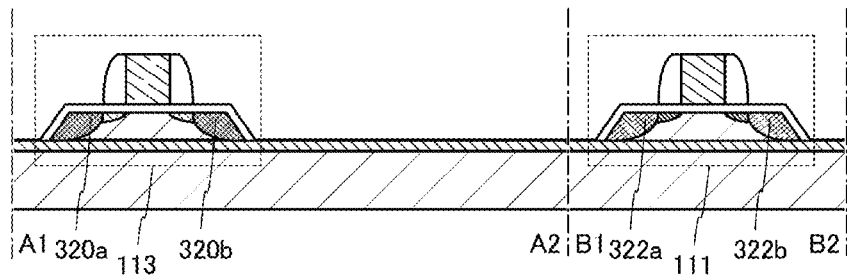

Next, an impurity element imparting n-type conductivity and an impurity element imparting p-type conductivity are added to the semiconductor films 304a and 304b using the gate electrodes 312a and 312b and the sidewall insulating films 318a to 318d as masks through the gate insulating films 306a and 306b (see FIG. 8B). In this embodiment, phosphorus is added to the semiconductor film 304a through the gate insulating film 306a, so that impurity regions 320a and 320b are formed, and boron is added to the semiconductor film 304b through the gate insulating film 306b, so that impurity regions 322a and 322b are formed. The impurity element is preferably added so that the impurity regions 320a and 320b have higher concentration than the impurity regions 314a and 314b, and the impurity element is preferably added so that the impurity regions 322a and 322b have higher concentration than the impurity regions 316a and 316b.

Through the above steps, an n-channel transistor and a p-channel transistor can be manufactured using the substrate 300 including a semiconductor material other than an oxide semiconductor (see FIG. 8B). Such transistors are capable of high-speed operation. Thus, the transistors are preferably applied to the logic circuit 101, the switch 106, the switch 107, the precharge circuit 108, and the like because in that case, the speed of operation thereof can be increased.

Figure 8C:
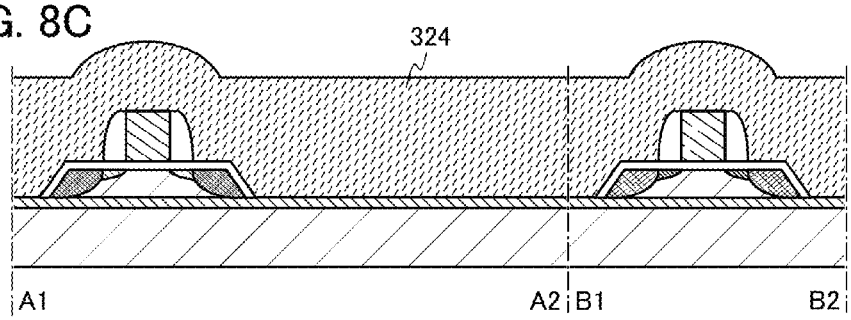

Next, an insulating film 324 is formed so as to cover the transistor 113 and the transistor 111 (see FIG. 8C). The insulating film 324 can be formed using a material containing an inorganic insulating material such as silicon oxide, silicon oxynitride, silicon nitride, or aluminum oxide. A material with a low dielectric constant (a low-k material) is preferably used for the insulating film 324 because capacitance due to overlap of electrodes or wirings can be sufficiently reduced. Note that a porous insulating film formed using such a material may be used as the insulating film 324. The porous insulating film has a lower dielectric constant than an insulating film with high density and thus makes it possible to further reduce capacitance due to electrodes or wirings. Alternatively, the insulating film 324 can be formed using an organic insulating material such as polyimide or acrylic. In this embodiment, the case where the insulating film 324 is formed using silicon oxynitride is described.

Next, after the insulating film 324 is formed, heat treatment is performed to activate the impurity elements added to the semiconductor films 304a and 304b. The heat treatment is performed using an annealing furnace. Alternatively, a laser annealing method or a rapid thermal annealing (RTA) method can be used. The heat treatment is performed at 400° C. to 600° C., typically 450° C. to 500° C. in a nitrogen atmosphere for 1 to 4 hours. By this heat treatment, activation of the impurity elements is performed and hydrogen in the silicon oxynitride film of the insulating film 324 is released, so that hydrogenation of the semiconductor films 304a and 304b can be performed.

Note that before or after each of the above steps, a step of forming an electrode, a wiring, a semiconductor film, an insulating film, or the like may be further performed. For example, an electrode, a wiring, or the like for connecting the transistor in the lower portion and the transistor in the upper portion is preferably formed. In addition, a multilayer wiring structure in which an insulating film and a conductive layer are stacked may be employed as a wiring structure, so that a highly-integrated memory device can be achieved.

<Manufacturing Method of Transistor in Upper Portion>

Figure 8D:
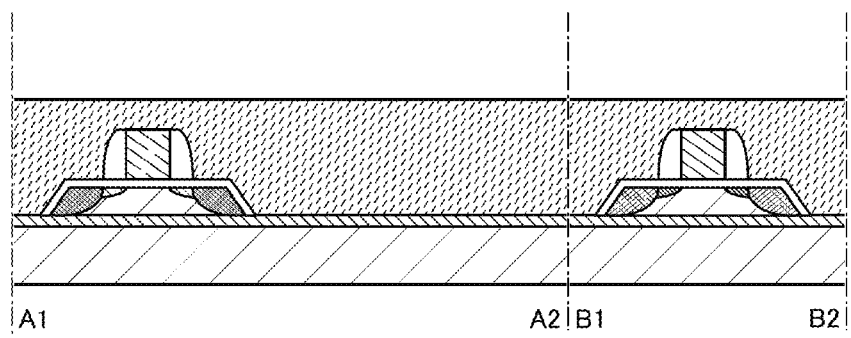

First, as treatment before formation of the transistor 115 and the capacitor 116, a surface of the insulating film 324 is planarized (see FIG. 8D). As the planarization treatment for the insulating film 324, etching treatment or the like can be employed instead of polishing treatment such as chemical mechanical polishing (hereinafter, also referred to as CMP treatment). CMP treatment and etching treatment may be performed in combination. The surface of the insulating film 324 is preferably planarized as much as possible in order to improve characteristics of the transistor 115.

Here, CMP treatment is a method of planarizing a surface of an object to be processed with a combination of chemical and mechanical actions, using the surface as a reference. Specifically, CMP treatment is a method in which a polishing cloth is attached to a polishing stage, the polishing stage and an object to be processed are rotated or swung while a slurry (an abrasive) is supplied between the object and the polishing cloth, and the surface of the object is polished by a chemical reaction between the slurry and the object and by action of mechanical polishing of the object with the polishing cloth.

The oxide semiconductor film is preferably formed over the surface of the insulating film 324 with an average surface roughness ($R_a$) of less than or equal to 1 nm, preferably less than or equal to 0.3 nm, more preferably less than or equal to 0.1 nm. Note that $R_a$ is obtained by three-dimension expansion of center line average surface roughness which is defined by JIS B 0601 so as to be applied to a plane. The $R_a$ can be expressed as an "average value of the absolute values of deviations from a reference surface to a specific surface" and is defined by the following formula (2).

$$Ra = \frac{1}{S_0} \int_{y_1}^{y_2} \int_{x_1}^{x_2} |f(x, y) - Z_0| \, dx \, dy \qquad (2)$$

In the above formula, $S_0$ represents the area of a plane to be measured (a quadrangular region which is defined by four points represented by coordinates $(x_1, y_1)$, $(x_1, y_2)$, $(x_2, y_1)$, and $(x_2, y_2)$), and $Z_0$ represents the average height of the plane to be measured. Further, $R_a$ can be measured using an atomic force microscope (AFM).

Next, an oxide semiconductor film 342 is formed over the planarized surface of the insulating film 324.

An oxide semiconductor to be used preferably contains at least indium (In) or zinc (Zn). In particular, In and Zn are preferably contained. As a stabilizer for reducing variation in electric characteristics of a transistor including the oxide semiconductor, it is preferable that one or more elements selected from gallium (Ga), tin (Sn), hafnium (Hf), and aluminum (Al) be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an In—Ga—Zn-based oxide means an oxide containing In, Ga, and Zn as its main component, and there is no limitation on the ratio of In:Ga:Zn. Further, the In—Ga—Zn-based oxide may contain a metal element other than In, Ga, and Zn.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the composition is not limited to those described above, and a material having an appropriate composition may be used depending on needed semiconductor characteristics (such as mobility, threshold voltage, and variation). In order to obtain needed semiconductor characteristics, it is preferable that the carrier concentration, the impurity concentration, the defect density, the atomic ratio of a metal element to oxygen, the interatomic distance, the density, and the like be set to appropriate values.

For example, it is relatively easy to obtain high mobility with an In—Sn—Zn-based oxide. However, it is possible to obtain high mobility even with an In—Ga—Zn-based oxide by reducing the defect density in a bulk.

Note that for example, the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

The oxide semiconductor may be either single crystal or non-single-crystal. In the latter case, the oxide semiconductor may be either amorphous or polycrystalline. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in a bulk can be further reduced and when a surface flatness is improved, and mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness ($R_a$) of less than or equal to 1 nm, preferably less than or equal to 0.3 nm, more preferably less than or equal to 0.1 nm.

In the case where an In—Zn-based oxide semiconductor material is used as the oxide semiconductor film 342, a ratio of atoms of metal elements of a target is In:Zn=50:1 to 1:2 in atomic ratio ($In_2O_3$:ZnO=25:1 to 1:4 in molar ratio), preferably, In:Zn=20:1 to 1:1 in atomic ratio ($In_2O_3$:ZnO=10:1 to 1:2 in molar ratio), further preferably, In:Zn=15:1 to 1.5:1 in atomic ratio ($In_2O_3$:ZnO=15:2 to 3:4 in molar ratio). For example, in a target used for formation of an In—Zn—O-based oxide semiconductor which has an atomic ratio of In:Zn:O=X:Y:Z, the relation of Z>1.5X+Y is satisfied.

In the case of forming the oxide semiconductor film 342 using an In—Ga—Zn-based oxide semiconductor material by a sputtering method, it is preferable to use an In—Ga—Zn-based oxide target having an atomic ratio of In:Ga:Zn=1:1:1, 4:2:3, 3:1:2, 1:1:2, 2:1:3, or 3:1:4.

In the case of forming the oxide semiconductor film 342 using an In—Sn—Zn-based oxide semiconductor material by a sputtering method, it is preferable to use an In—Sn—Zn-based oxide target having an atomic ratio of In:Sn:Zn=1:1:1, 2:1:3, 1:2:2, or 20:45:35.

The relative density of the target is higher than or equal to 90% and lower than or equal to 100%, preferably higher than or equal to 95% and lower than or equal to 99.9%. With the use of the target with high relative density, the oxide semiconductor film 342 can have high density.

The oxide semiconductor film 342 can be formed by a sputtering method, a molecular beam epitaxy method, an atomic layer deposition method, or a pulsed laser deposition method. The thickness of the oxide semiconductor film 342 is greater than or equal to 5 nm and less than or equal to 100 nm, preferably greater than or equal to 10 nm and less than or equal to 30 nm.

The oxide semiconductor film 342 may be amorphous or may have crystallinity. For example, the oxide semiconductor film is a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis. Note that in this specification and the like, an oxide semiconductor film including a c-axis aligned crystal is called a c-axis aligned crystalline oxide semiconductor (CAAC-OS) film.

The CAAC-OS film is not a single crystal, but this does not mean that the CAAC-OS film is composed of only an amorphous component. Although the CAAC-OS film includes a crystallized portion (crystalline portion), a boundary between one crystalline portion and another crystalline portion is not clear in some cases.

In the case where oxygen is included in the CAAC-OS film, nitrogen may be substituted for part of oxygen included in the CAAC-OS film. The c-axes of individual crystalline portions included in the CAAC-OS film may be aligned in one direction (e.g., a direction perpendicular to a surface of a substrate over which the CAAC-OS film is formed or a surface of the CAAC-OS film). Alternatively, the normals of the a-b planes of the individual crystalline portions included in the CAAC-OS film may be aligned in one direction (e.g., a direction perpendicular to a surface of a substrate over which the CAAC-OS film is formed or a surface of the CAAC-OS film).

The CAAC-OS film becomes a conductor, a semiconductor, or an insulator depending on its composition or the like.

The CAAC-OS film transmits or does not transmit visible light depending on its composition or the like.

As an example of a crystalline portion included in such a CAAC-OS film, there is a crystalline portion which is formed into a film shape and has a triangular or hexagonal atomic arrangement when observed from the direction perpendicular to a surface of the film or a surface of a substrate over which the CAAC-OS film is formed, and in which metal atoms are arranged in a layered manner or metal atoms and oxygen atoms (or nitrogen atoms) are arranged in a layered manner when a cross section of the film is observed.

Next, a formation method of the oxide semiconductor film 342 as a CAAC-OS film is described. As a formation method of the oxide semiconductor film 342 as a CAAC-OS film, the following two kinds of methods can be given, for example. One of the methods is that formation of the oxide semiconductor film 342 is performed while a substrate is heated; the other method is that formation of the oxide semiconductor film 342 is performed in two steps, and heat treatment is performed after each formation step of the oxide semiconductor film 342.

In the case where the oxide semiconductor film 342 is formed in one step while a substrate is heated, the substrate temperature may be higher than or equal to 100° C. and lower than or equal to 600° C., preferably higher than or equal to 200° C. and lower than or equal to 500° C. When the substrate is heated at high temperature during formation of the oxide semiconductor film 342, the CAAC-OS film in which the proportion of a crystalline portion is higher than that of an amorphous portion can be formed.

In the case where formation of the oxide semiconductor film 342 is performed in two steps, a first oxide semiconductor film 342 is formed over the insulating film 324 while the substrate temperature is kept at a temperature higher than or equal to 100° C. and lower than or equal to 450° C., and then heat treatment is performed at a temperature higher than or equal to 550° C. and lower than the strain point of the substrate under an atmosphere of nitrogen, oxygen, a rare gas, or dry air. By the heat treatment, a crystalline region (including a plate-like crystal) is formed in a region including a surface of the first oxide semiconductor film 342. Next, a second oxide semiconductor film 342 is formed thicker than the first oxide semiconductor film 342. After that, heat treatment is performed again at a temperature higher than or equal to 550° C. and lower than the strain point of the substrate, so that crystals grow upward using, as a seed of crystal growth, the first oxide semiconductor film 342 in which a crystalline region (including a plate-like crystal) is formed in the region including the surface. Thus, the second oxide semiconductor film 342 is entirely crystallized. Note that the thickness of the first oxide semiconductor film 342 is preferably greater than or equal to 1 nm and less than or equal to 10 nm.

The above formation method is preferable because a short-channel effect can be suppressed even when the thickness of the oxide semiconductor film 342 is approximately 5 nm.

Since the crystallinity of the crystalline portion included in the CAAC-OS film is affected by roughness of a surface where the CAAC-OS film is formed, as described above, the surface of the insulating film 324 is preferably planarized as much as possible. The average surface roughness of the insulating film 324 is preferably greater than or equal to 0.1 nm and less than 0.5 nm. By planarizing the surface of the insulating film 324, the continuity of the crystalline portion included in the CAAC-OS film can be improved. In addition, by planarizing the surface of the insulating film 324, the CAAC-OS film in which the proportion of a crystalline portion is higher than that of an amorphous portion can be formed.

The oxide semiconductor film 342 formed by a sputtering method contains hydrogen, water, a compound having a hydroxyl group, or the like in some cases. Hydrogen, water, and the like easily form a donor level and thus serve as impurities in the oxide semiconductor. Therefore, in the formation of the oxide semiconductor film 342 by a sputtering method, the hydrogen concentration in the oxide semiconductor film 342 is preferably reduced as much as possible.

In order to reduce the hydrogen concentration, the leakage rate of a treatment chamber of a sputtering apparatus is set to $1\times10^{-10}$ Pa·m$^3$/s or less in the formation of the oxide semiconductor film 342, whereby entry of impurities such as an alkali metal and hydride into the oxide semiconductor film 342 that is being deposited by a sputtering method can be reduced. Further, with the use of an entrapment vacuum pump (e.g., a cryopump) as an evacuation system, counter flow of impurities such as an alkali metal, a hydrogen atom, a hydrogen molecule, water, a compound having a hydroxyl group, and hydride from the evacuation system can be reduced.

When the purity of the target is set to 99.99% or higher, alkali metal, a hydrogen atom, a hydrogen molecule, water, a hydroxyl group, hydride, or the like mixed to the oxide semiconductor film can be reduced. In addition, when the target is used, the concentration of alkali metal such as lithium, sodium, or potassium can be reduced in the oxide semiconductor film.

Note that it has been pointed out that an oxide semiconductor is insensitive to impurities, there is no problem when a considerable amount of metal impurities is contained in the film, and therefore, soda-lime glass which contains a large amount of alkali metal such as sodium (Na) and is inexpensive can be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). But such consideration is not appropriate. Alkali metal is not an element included in an oxide semiconductor, and therefore, is an impurity. Also, alkaline earth metal is an impurity in the case where alkaline earth metal is not included in an oxide semiconductor. An alkali metal, in particular, Na becomes Na$^+$ when an insulating film in contact with the oxide semiconductor film is an oxide and Na diffuses into the insulating layer. In addition, in the oxide semiconductor film, Na cuts or enters a bond between metal and oxygen which are included in an oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the hydrogen concentration in the oxide semiconductor film is very low. Therefore, when the hydrogen concentration in the oxide semiconductor film is less than or equal to $1\times10^{18}$/cm$^3$, preferably less than or equal to $1\times10^{17}$/cm$^3$, the concentration of the above impurity is preferably reduced. Specifically, a measurement value of a Na concentration by secondary ion mass spectrometry is preferably less than or equal to $5\times10^{16}$/cm$^3$, more preferably less than or equal to $1\times10^{16}$/cm$^3$, still more preferably less than or equal to $1\times10^{15}$/cm$^3$. In a similar manner, a measurement value of a Li concentration is preferably less than or equal to $5\times10^{15}$/cm$^3$, more preferably less than or equal to $1\times10^{15}$/cm$^3$. In a similar manner, a measurement value of a K concentration is preferably less than or equal to $5\times10^{15}/cm^3$, more preferably less than or equal to $1\times10^{15}/cm^3$.

A highly purified rare gas (typically, argon), highly purified oxygen, or a highly purified mixed gas of oxygen and a rare gas, from which impurities such as hydrogen, water, a compound having a hydroxyl group, and hydride are removed, is used as appropriate as an atmosphere gas supplied to a treatment chamber of a sputtering apparatus. For example, the purity of argon is set to 9N (99.9999999%) or higher (the concentration of $H_2O$ is less than 0.1 ppb, and the concentration of $H_2$ is less than 0.5 ppb), and the dew point thereof is set to −121° C. The oxygen concentration is set to 8N (99.999999%) or higher (the concentration of $H_2O$ is less than 1 ppb, and the concentration of $H_2$ is less than 1 ppb), and the dew point thereof is set to −112° C. In the case where a mixed gas of the rare gas and oxygen is used, the flow rate ratio of oxygen is preferably high.

As one example of the film formation condition, the distance between the substrate and the target is 100 mm, the pressure is 0.6 Pa, the direct-current (DC) power is 0.5 kW, and the atmosphere is an oxygen atmosphere (the proportion of the oxygen flow is 100%). Note that a pulsed direct-current (DC) power source is preferable because dust generated in film formation can be reduced and the film thickness can be made uniform.

In this manner, the oxide semiconductor film 342 in which the amount of contained hydrogen is small can be formed. Note that even when the sputtering apparatus is used, the oxide semiconductor film 342 contains more than a little nitrogen. For example, the nitrogen concentration in the oxide semiconductor film 342 measured by secondary ion mass spectrometry (SIMS) is lower than $5\times10^{18}$ atoms$^{-3}$.

In order to reduce impurities such as moisture and hydrogen in the oxide semiconductor film 342 (dehydration or dehydrogenation), the oxide semiconductor film 342 is preferably subjected to heat treatment. For example, the oxide semiconductor film 342 is subjected to heat treatment in a reduced-pressure atmosphere, an inert gas atmosphere of nitrogen, a rare gas, or the like, an oxidation gas atmosphere, or an ultra dry air atmosphere (the moisture amount is 20 ppm (−55° C. by conversion into a dew point) or less, preferably 1 ppm or less, more preferably 10 ppb or less, in the case where the measurement is performed by a dew point meter in a cavity ring down laser spectroscopy (CRDS) system). Note that the oxidation atmosphere refers to an atmosphere including an oxidation gas such as oxygen, ozone, or nitrogen oxide at 10 ppm or higher. The inert gas atmosphere refers to an atmosphere including the oxidation gas at lower than 10 ppm and is filled with nitrogen or a rare gas.

For example, the heat treatment is performed at a temperature higher than or equal to 150° C. and lower than the strain point of the substrate, preferably higher than or equal to 250° C. and lower than or equal to 450° C., more preferably higher than or equal to 300° C. and lower than or equal to 450° C. The treatment time is 3 minutes to 24 hours. It is preferable that the heat treatment time be 24 hours or shorter in order not to reduce the productivity.

There is no particular limitation on a heat treatment apparatus used for the heat treatment, and the apparatus may be provided with a device for heating an object to be processed by heat radiation or heat conduction from a heating element such as a resistance heating element. For example, an electric furnace, or a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

By the heat treatment, hydrogen (water, a compound having a hydroxyl group) can be released from the oxide semiconductor film 342. Thus, impurities in the oxide semiconductor film 342 can be reduced.

Furthermore, hydrogen that is an unstable carrier source can be discharged from the oxide semiconductor film 342 by the heat treatment, whereby the threshold voltage of the transistor can be prevented from being shifted negatively. As a result, the reliability of the transistor can be improved.

Figure 9A:
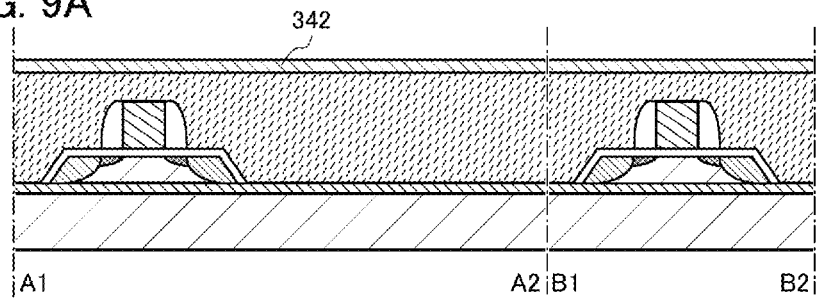
FIGS. 9A to 9D illustrate a method for manufacturing a memory device.
Figure 9B:
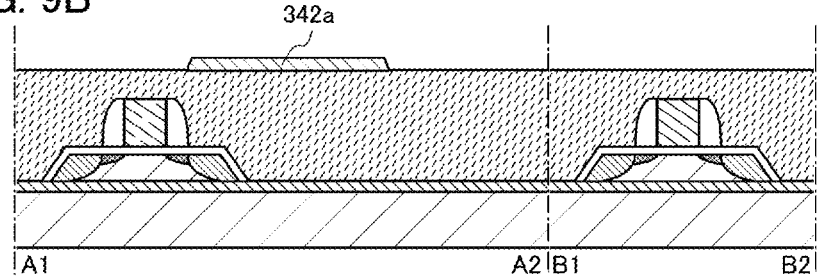

Next, a resist mask is formed through a photolithography process over the oxide semiconductor film 342, and the oxide semiconductor film 342 is etched to have a desired shape with the use of the resist mask; in this manner, an island-shaped oxide semiconductor film 342a is formed (see FIG. 9B). The resist mask can be formed by an ink-jet method, a printing method, or the like as appropriate, as well as through the photolithography process. The etching is preferably performed so that an end portion of the oxide semiconductor film 342a has a tapered shape. The end portion of the island-shaped oxide semiconductor film 342a is tapered, whereby in the manufacturing process of the transistor 115, coverage with a film which is formed after this etching step can be improved, and disconnection of the film can accordingly be prevented. The tapered shape can be formed by performing etching while the resist mask is made to recede.

Note that in this embodiment, the case where the heat treatment is performed directly after the oxide semiconductor film 342 is formed is described; however, the heat treatment may be performed after the island-shaped oxide semiconductor film 342a is obtained.

Figure 9C:
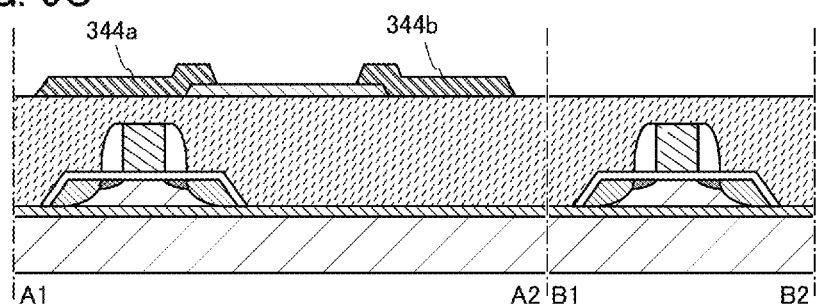

Next, after a conductive film is formed over the oxide semiconductor film 342a and the like, a resist mask is formed through a photolithography process over the conductive film and the conductive film is etched to have a desired shape with the use of the resist mask; in this manner, a source or drain electrode 344a and a source or drain electrode 344b are formed (see FIG. 9C).

The conductive film is to be a source electrode and a drain electrode later, and can be formed using a metal material such as aluminum, chromium, copper, titanium, tantalum, molybdenum, or tungsten. Alternatively, the conductive film can be formed using an alloy containing any of the above metal materials as a component, or the like. Moreover, one or more materials selected from manganese, magnesium, zirconium, beryllium, neodymium, and scandium may be used.

The conductive film may have a single-layer structure or a stacked structure of two or more layers. For example, the conductive film can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked. Note that when the conductive film has a single-layer structure of a titanium film or a titanium nitride film, there is an advantage that it can be easily processed into the source or drain electrode 344a and the source or drain electrode 344b having tapered shapes.

Further, as the conductive film, indium oxide, indium tin oxide (also referred to as ITO), indium zinc oxide, zinc oxide, zinc oxide to which gallium is added, graphene, or the like can be used.

The conductive film is selectively etched to form the source or drain electrode 344a and the source or drain electrode 344b (see FIG. 9C). Here, the source or drain electrode 344a functions as one of a pair of electrodes of the capacitor.

The conductive film is preferably etched such that the source or drain electrode 344a and the source or drain electrode 344b are formed to have tapered end portions. Here, the taper angle thereof is, for example, preferably greater than or equal to 30° and less than or equal to 60°. When the source or drain electrode 344a and the source or drain electrode 344b are formed by etching so as to have tapered end portions, coverage with the gate insulating film which is formed later can be improved and disconnection of the gate insulating film can be prevented.

The channel length (L) of the transistor is determined by the distance between a lower end portion of the source or drain electrode 344a and a lower end portion of the source or drain electrode 344b. Note that in light exposure for forming a mask for a transistor with a channel length (L) less than 25 nm, it is preferable to use extreme ultraviolet rays whose wavelength is as short as several nanometers to several tens of nanometers. The resolution of light exposure with extreme ultraviolet rays is high and the depth of focus is large. Accordingly, the channel length (L) of the transistor formed later can be greater than or equal to 10 nm and less than or equal to 1000 nm (1 μm), whereby the operation speed of the circuit can be increased. Moreover, power consumption of the memory device can be reduced by miniaturization.

Figure 9D:
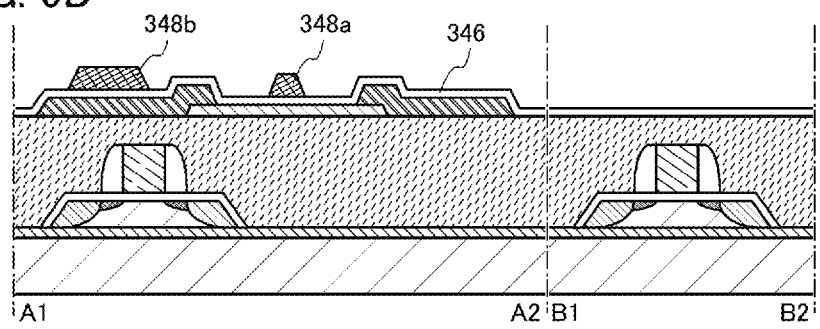

Next, a gate insulating film 346 is formed so as to cover the source or drain electrode 344a, the source or drain electrode 344b, and the oxide semiconductor film 342a (see FIG. 9D).

The gate insulating film 346 can be formed by a CVD method, a sputtering method, or the like. The gate insulating film 346 can be formed using silicon oxide, silicon nitride, silicon oxynitride, gallium oxide, aluminum oxide, tantalum oxide, or the like. Alternatively, the gate insulating film 346 can be formed using a material with a high dielectric constant (a high-k material) such as hafnium oxide, yttrium oxide, hafnium silicate ($HfSi_xO_y$, (x>0, y>0)), hafnium silicate to which nitrogen is added ($HfSi_xO_yN_z$ (x>0, y>0, z>0)), or hafnium aluminate to which nitrogen is added ($HfAl_xO_yN_z$ (x>0, y>0, z>0)). The gate insulating film 346 has either a single-layer structure or a stacked structure in which these materials are combined. There is no particular limitation on the thickness of the gate insulating film 346; in the case where the memory device is miniaturized, the gate insulating film 346 is preferably thin in order to ensure the operation of the transistor. For example, in the case of using silicon oxide, the thickness can be greater than or equal to 1 nm and less than or equal to 100 nm, preferably greater than or equal to 10 nm and less than or equal to 50 nm.

Further, the gate insulating film 346 may be formed using an insulating material containing a Group 13 element and oxygen. Many of oxide semiconductor materials contain a Group 13 element, and an insulating material containing a Group 13 element works well with oxide semiconductor materials. Therefore, with the use of an insulating material containing a Group 13 element and oxygen for an insulating film in contact with the oxide semiconductor film, an interface with the oxide semiconductor film can keep a favorable state.

Here, an insulating material containing a Group 13 element refers to an insulating material containing one or more Group 13 elements. As the insulating material containing a Group 13 element, gallium oxide, aluminum oxide, aluminum gallium oxide, gallium aluminum oxide, or the like can be given as an example. Here, the amount of aluminum is larger than that of gallium in atomic percent in aluminum gallium oxide, whereas the amount of gallium is larger than or equal to that of aluminum in atomic percent in gallium aluminum oxide.

For example, when a material containing gallium oxide is used for the gate insulating film 346 that is in contact with the oxide semiconductor film 342a containing gallium, characteristics at the interface between the oxide semiconductor film and the gate insulating film can be kept favorable. The oxide semiconductor film and an insulating film containing gallium oxide are provided in contact with each other, so that pileup of hydrogen at the interface between the oxide semiconductor film and the insulating film can be reduced. Note that a similar effect can be obtained in the case where an element in the same group as a constituent element of the oxide semiconductor is used in an insulating film. For example, it is effective to form an insulating film with the use of a material containing aluminum oxide. Note that aluminum oxide has a property of not easily transmitting water. Thus, it is preferable to use a material containing aluminum oxide in terms of preventing entry of water into the oxide semiconductor film.

By the heat treatment performed on the oxide semiconductor film 342 (or the oxide semiconductor film 342a), oxygen in the oxide semiconductor film 342 is released together with hydrogen. When oxygen is released from the oxide semiconductor film 342, oxygen deficiency is caused therein. Part of the oxygen deficiency becomes a donor, which leads to generation of carriers in the oxide semiconductor film 342. As a result, characteristics of the transistor might be affected.

Therefore, an insulating film from which oxygen is discharged by heat treatment is preferably used as the gate insulating film 346 in contact with the oxide semiconductor film 342a.

In this specification and the like, the expression "oxygen is discharged by heat treatment" means that the amount of discharged oxygen (or released oxygen) which is converted into oxygen atoms is greater than or equal to $1.0 \times 10^{18}$ $cm^{-3}$, preferably greater than or equal to $3.0 \times 10^{20}$ $cm^{-3}$, in thermal desorption spectroscopy (TDS) analysis. In contrast, the expression "oxygen is not discharged by heat treatment" means that the amount of discharged oxygen (or released oxygen) which is converted into oxygen atoms is less than $1.0 \times 10^{18}$ $cm^{-3}$ in TDS analysis.

A method for quantifying the amount of released oxygen which is converted into oxygen atoms, with the use of TDS analysis is described below.

The amount of discharged gas in TDS analysis is proportional to the integral value of ion intensity. Therefore, the amount of discharged gas can be calculated from the ratio between the integral value of ion intensity of an insulating film and the reference value of a standard sample. The reference value of a standard sample refers to, in a sample containing an atom at a predetermined density, the ratio of the density of the atom to the integral value of ion intensity corresponding to the atom.

For example, the number of the discharged oxygen molecules ($N_{O2}$) from an insulating film can be found according to the following formula (3) with the TDS analysis results of a silicon wafer containing hydrogen at a predetermined density which is the standard sample and the TDS analysis results of the insulating film. Here, all gases having a mass number of 32 which are obtained in the TDS analysis are assumed to originate from an oxygen molecule. Note that $CH_3OH$, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal.

$$N_{O2}=N_{H2}/S_{H2} \times S_{O2} \times \alpha \tag{3}$$

In the formula, $N_{H2}$ is the value obtained by conversion of the number of hydrogen molecules desorbed from the standard sample into densities, and $S_{H2}$ is the integral value of ion intensity when the standard sample is subjected to TDS analysis. Here, the reference value of the standard sample is set to $N_{H2}/S_{H2}$. Further, $S_{O2}$ is the integral value of ion intensity when the insulating film is subjected to TDS analysis, and a is a coefficient affecting the ion intensity in the TDS analysis. Japanese Published Patent Application No. H6-275697 can be referred to for details of the above formula. Note that the above value of the amount of discharged oxygen is obtained by measurement with a thermal desorption spectrometer produced by ESCO Ltd., EMD-WA1000S/W using a silicon wafer containing hydrogen atoms at $1 \times 10^{16}$ cm$^{-3}$ as the standard sample.

Further, in the TDS analysis, part of oxygen is detected as an oxygen atom. The ratio between oxygen molecules and oxygen atoms can be calculated from the ionization rate of the oxygen molecules. Note that, since the above a includes the ionization rate of the oxygen molecules, the number of the discharged oxygen atoms can also be estimated through the evaluation of the number of the discharged oxygen molecules.

Note that $N_{O2}$ is the number of the discharged oxygen molecules. In the insulating film, the amount of discharged oxygen when converted into oxygen atoms is twice the number of the discharged oxygen molecules.

As an example of a film from which oxygen is discharged by heat treatment, a film of oxygen-excess silicon oxide (SiO$_x$ (x>2)) is given. In the oxygen-excess silicon oxide (SiO$_x$ (x>2)), the number of oxygen atoms per unit volume is more than twice the number of silicon atoms per unit volume. The number of silicon atoms and the number of oxygen atoms per unit volume are measured by Rutherford backscattering spectrometry.

An insulating film from which oxygen is discharged by heat treatment is used as an insulating film in contact with the oxide semiconductor film 342a (for example, the insulating film 324, the gate insulating film 346), and is subjected to heat treatment in any of steps after the formation of the gate insulating film 346, so that oxygen is discharged from the insulating film 324 and the gate insulating film 346 to be supplied to the oxide semiconductor film 342a. Consequently, oxygen deficiency generated in the oxide semiconductor film 342a can be compensated for and can be reduced. Therefore, generation of carriers in the oxide semiconductor film 342a can be suppressed, whereby variation in electric characteristics of the transistor can be suppressed.

Next, after a conductive film is formed over the gate insulating film 346, a resist mask is formed through a photolithography process over the conductive film and the conductive film is etched to have a desired shape with the use of the resist mask, so that a gate electrode 348a and an electrode 348b are formed (see FIG. 9D). A conductive layer functions as an electrode of the capacitor. The conductive film can be formed by using a metal material such as molybdenum, titanium, tantalum, tungsten, aluminum, copper, neodymium, or scandium, or an alloy material containing any of these materials as a main component. The conductive film can have either a single-layer structure or a stacked structure.

Figure 10A:
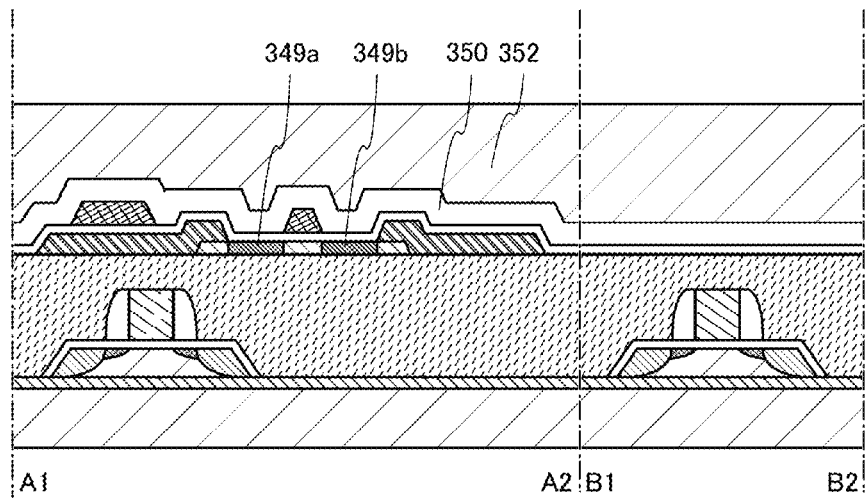
FIGS. 10A and 10B illustrate a method for manufacturing a memory device.

After the gate electrode 348a and the electrode 348b are formed, a dopant imparting n-type conductivity is added to the oxide semiconductor film 342a with the use of the gate electrode 348a, the source or drain electrode 344a, and the source or drain electrode 344b as masks; in this manner, a pair of dopant regions 349a and 349b are formed (see FIG. 10A). In the oxide semiconductor film 342a, a region between the dopant region 349a and the dopant region 349b serves a channel formation region. The channel formation region in the oxide semiconductor film 342a overlaps with the gate electrode 348a with the gate insulating film 346 interposed therebetween.

The addition of the dopant for forming the dopant regions 349a and 349b can be performed by an ion implantation method. As the dopant, for example, a rare gas such as helium, argon, or xenon, a Group 15 element such as nitrogen, phosphorus, arsenic, or antimony, or the like can be used. For example, in the case where nitrogen is used as the dopant, the concentration of nitrogen atoms in the dopant regions 349a and 349b is preferably higher than or equal to $5 \times 10^{19}$/cm$^3$ and lower than or equal to $1 \times 10^{22}$/cm$^3$. The dopant regions 349a and 349b to which the dopant imparting n-type conductivity is added have higher conductivity than the other regions in the oxide semiconductor film 342a. Therefore, by providing the dopant regions 349a and 349b in the oxide semiconductor film 342a, the resistance between the source and drain electrodes 344a and 344b can be decreased.

Then, an insulating film 350 and an insulating film 352 are formed over the gate insulating film 346, the gate electrode 348a, and the electrode 348b (see FIG. 10A). The insulating film 350 and the insulating film 352 can be formed by a PVD method, a CVD method, or the like. The insulating film 350 and the insulating film 352 can be formed using a material containing an inorganic insulating material such as silicon oxide, silicon oxynitride, silicon nitride, hafnium oxide, gallium oxide, or aluminum oxide, or a material containing an organic material such as polyimide or acrylic. Note that for the insulating film 350 and the insulating film 352, a material with a low dielectric constant or a structure with a low dielectric constant (e.g., a porous structure) is preferably used. This is because when the insulating film 350 and the insulating film 352 have a low dielectric constant, capacitance generated between wirings, electrodes, or the like can be reduced and operation at higher speed can be achieved. For example, a material containing an inorganic material can be used for the insulating film 350 and a material containing an organic material can be used for the insulating film 352.

An aluminum oxide film has a property of blocking hydrogen, water, and the like. Therefore, the insulating film 350 is preferably formed using an aluminum oxide film in order to prevent hydrogen, water, and the like from entering the oxide semiconductor film 342a from the outside of the memory device. Further, an aluminum oxide film also has a property of blocking oxygen, so that outward diffusion of oxygen contained in the oxide semiconductor film 342a can be suppressed. The use of an aluminum oxide film for the insulating film 350 not only can prevent hydrogen, water, and the like from entering the oxide semiconductor film 342a but also can suppress outward diffusion of oxygen contained in the oxide semiconductor film 342a. Therefore, variation in electric characteristics of the transistor can be suppressed.

Next, an opening reaching the source or drain electrode 344b is formed in the gate insulating film 346, the insulating film 350, and the insulating film 352. The opening is formed by selective etching with the use of a mask or the like. After that, a conductive film is formed in contact with the source or drain electrode 344b. Next, the conductive film is subjected to etching or CMP treatment to form an electrode 354 (see FIG. 10B).

Figure 10B:
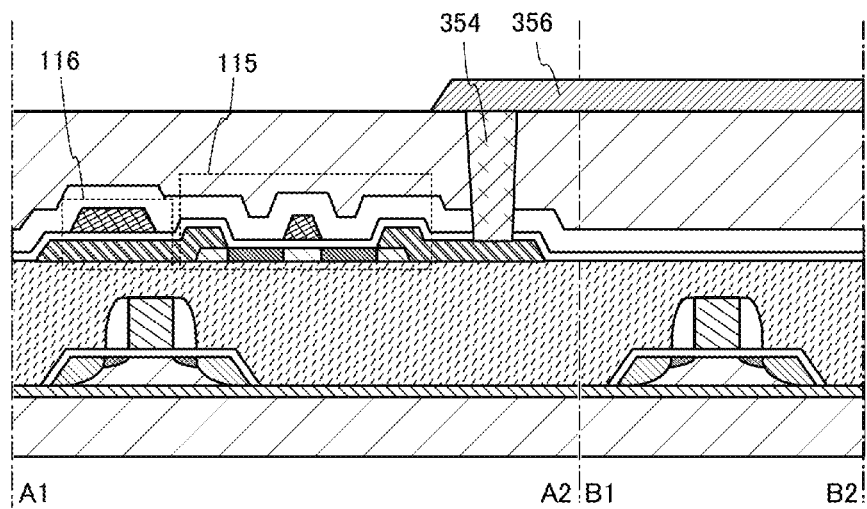

Next, a wiring 356 is formed so as to cover the insulating film 352 and be in contact with the electrode 354 (see FIG. 10B). The wiring 356 is formed in such a manner that a conductive film is formed by a PVD method or a CVD method and then the conductive film is processed. For the conductive film, a metal material such as aluminum, chromium, copper, tantalum, titanium, molybdenum, or tungsten, an alloy containing any of these metal materials as a component, or the like can be used. Any of manganese, magnesium, zirconium, beryllium, neodymium, and scandium, or a material including any of these in combination may be used.

Further, the wiring 356 may be formed without formation of the electrode 354. For example, it is possible to employ a method in which a thin titanium film is formed in a region including the opening of the insulating film 350 by a PVD method and then an aluminum film is formed so as to be embedded in the opening. Here, the titanium film formed by a PVD method has a function of reducing an oxide film (e.g., a natural oxide film) formed on a surface where the titanium film is formed, to decrease contact resistance with a lower electrode or the like (here, the source or drain electrode 344b). In addition, hillock of the aluminum film can be prevented. A copper film may be formed by a plating method after the formation of the barrier film of titanium, titanium nitride, or the like.

By the wiring 356, the lower transistor and the upper transistor can be connected to each other (not illustrated).

Thus, the memory element in which the transistor 115 including the oxide semiconductor film 342a and the capacitor 116 are formed is completed (see FIG. 10B).

By the above manufacturing method, the memory device in which the transistor including an oxide semiconductor material is formed over the transistor including a semiconductor material other than an oxide semiconductor can be manufactured.

By the above manufacturing method, the oxide semiconductor film 342a in which the amount of impurities such as hydrogen and an alkali metal is extremely small can be obtained. The hydrogen concentration in the oxide semiconductor film 342a can be $5\times10^{19}$ atoms/cm$^3$ or lower, preferably $5\times10^{18}$ atoms/cm$^3$ or lower, more preferably $5\times10^{17}$ atoms/cm$^3$ or lower, for example. Further, as for the concentration of impurities such as Li and Na which are alkali metals and Ca which is an alkaline earth metal in the oxide semiconductor film 342a, specifically, a measurement value of a Na concentration by secondary ion mass spectrometry is preferably less than or equal to $5\times10^{16}$/cm$^3$, more preferably less than or equal to $1\times10^{16}$/cm$^3$, still more preferably less than or equal to $1\times10^{15}$/cm$^3$. In a similar manner, a measurement value of a Li concentration is preferably less than or equal to $5\times10^{15}$/cm$^3$, more preferably less than or equal to $1\times10^{15}$/cm$^3$. In a similar manner, the measurement value of a K concentration can be preferably less than or equal to $5\times10^{15}$/cm$^3$, preferably less than or equal to $1\times10^{15}$/cm$^3$.

When the transistor 115 (and the transistor 117) is manufactured using the oxide semiconductor film 342a, a transistor whose off-state current is extremely low can be manufactured. Specifically, the off-state current density can be 100 zA/μm or lower, preferably 10 zA/μm or lower. This value of off-state current density is lower than the off-state current density of a transistor in which a channel is formed in a crystalline silicon film. The use of the transistor 115 for the memory circuit 102 and the memory circuit 103 used in the memory element 110 illustrated in FIG. 1 and the memory element 160 illustrated in FIG. 4 enables stored data to be held for a long time because the off-state current of the transistor 115 can be extremely low as described above.

The transistor according to this embodiment has relatively high field-effect mobility; therefore, with the use of the transistor as the transistor 115 and the transistor 117 illustrated in FIG. 1 or FIG. 4, the memory circuit 102 and the memory circuit 103 can operate at high speed. Accordingly, in the memory device illustrated in FIG. 1 or FIG. 4, data can be transferred from the logic circuit 101 to the memory circuit 102 and the memory circuit 103 in a short time, before supply of power is stopped. Further, after the supply of power is restarted, data can be restored from the memory circuit 102 and the memory circuit 103 to the logic circuit 101 in a short time.

In the memory element according to one embodiment of the present invention, the memory circuit 102 including the transistor 115 in which a channel is formed in an oxide semiconductor film and the memory circuit 103 including the transistor 117 can be formed over the logic circuit 101 and the precharge circuit 108 each including a transistor in which a channel is formed in a film of a semiconductor other than an oxide semiconductor. In this manner, the transistors 115 and 117 in which a channel is formed in an oxide semiconductor film can be stacked over a transistor in which a channel is formed in a film including a semiconductor other than an oxide semiconductor; thus, the memory element can be formed three-dimensionally. Therefore, the area of a two-dimensional plane of the memory element can be decreased.

A magnetic tunneling junction element (an MTJ element) is known as a non-volatile random access memory. The MTJ element stores data in a low resistance state when the magnetization directions of ferromagnetic films provided above and below an insulating film are parallel, and stores data in a high resistance state when the directions are anti parallel. Therefore, the principles of the MTJ element and the memory element according to one embodiment of the present invention are completely different from each other. Table 1 shows comparison between the MTJ element and the memory element according to one embodiment of the present invention.

TABLE 1

|  | Spintronics (MTJ element) | OS/Si |
| --- | --- | --- |
| 1) Heat resistance | Curie temperature | Process temperature at 500° C. (reliability at 150° C.) |
| 2) Driving method | Current driving | Voltage driving |
| 3) Writing principle | Changing magnetization direction of ferromagnetic film | Turning on/off FET |
| 4) Si LSI | Suitable for bipolar LSI (For highly integrated circuit, MOS LSI is | Suitable for MOS LSI |

TABLE 1-continued

|  | Spintronics (MTJ element) | OS/Si |
|---|---|---|
|  | preferable to bipolar LSI, which is unsuitable for high integration. Note that W becomes larger.) |  |
| 5) Overhead | Large (because of high Joule heat) | Smaller than overhead of MTJ element by 2 to 3 or more orders of magnitude (because of utilizing charging and discharging of parasitic capacitance) |
| 6) Nonvolatility | Utilizing spin | Utilizing low off-state current |
| 7) Cycles capable of holding charge | No limitation | No limitation |
| 8) 3D structure | Difficult (at most two layers) | Easy (with a limitless number of layers) |
| 9) Integration degree ($F^2$) | 4 $F^2$ to 15 $F^2$ | Depending on the number of layers stacked in 3D structure (need heat resistance high enough to withstand process of forming upper OS FET) |
| 10) Material | Magnetic rare-earth element | OS material |
| 11) Cost per bit | High | Low (might be slightly high depending on constituent of OS (e.g., In)) |
| 12) Resistance to magnetic field | Low | High |

The MTJ element is disadvantageous in that its magnetic properties are lost when the temperature is the Curie temperature or higher because it contains a magnetic material. Further, the MTJ element is driven by current and thus is compatible with a silicon bipolar device. However, a silicon bipolar device is unsuitable for high integration. Furthermore, the MTJ element has a problem in that its power consumption is increased with the increase in memory capacity, although the MTJ element requires low write current.

In principle, the MTJ element has low resistance to a magnetic field, so that the magnetization direction is likely to change when the MTJ element is exposed to a high magnetic field. Moreover, it is necessary to control magnetic fluctuation due to a nanoscale magnetic material used for the MTJ element.

In addition, a rare earth element is used for the MTJ element; thus, it requires special attention to incorporate a process of forming the MTJ element in a process of forming a silicon semiconductor that is sensitive to metal contamination. Further, the MTJ element is expensive in terms of the material cost per bit.

On the other hand, the transistor including an oxide semiconductor, which is included in this embodiment, has an element structure and an operation principle similar to those of a silicon MOSFET except that a semiconductor material for forming a channel is a metal oxide. Further, the transistor including an oxide semiconductor is not affected by a magnetic field, and does not cause soft errors. These facts show that the transistor is highly compatible with a silicon integrated circuit.

This embodiment can be implemented in appropriate combination with any of the structures described in the other embodiments.

Embodiment 3

In this embodiment, a transistor which includes an oxide semiconductor material and has a structure different from the structure in Embodiment 2 will be described.

Figure 11A:
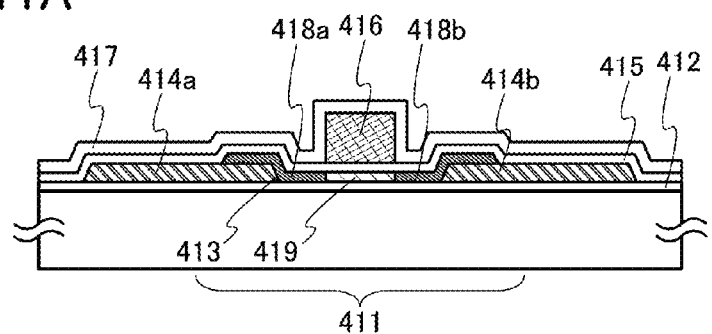
FIGS. 11A to 11C are cross-sectional views of transistors.

A transistor 411 illustrated in FIG. 11A includes a source or drain electrode 414a and a source or drain electrode 414b which are formed over a base film 412, an oxide semiconductor film 413 which is formed over the source and drain electrodes 414a and 414b, a gate insulating film 415 over the oxide semiconductor film 413 and the source and drain electrodes 414a and 414b, a gate electrode 416 provided over the gate insulating film 415 so as to overlap with the oxide semiconductor film 413, and a protective insulating film 417 provided over the gate electrode 416 and covering the oxide semiconductor film 413.

The transistor 411 illustrated in FIG. 11A has a top-gate structure where the gate electrode 416 is formed over the oxide semiconductor film 413, and has a bottom-contact structure where the source and drain electrodes 414a and 414b are formed below the oxide semiconductor film 413. In addition, the source and drain electrodes 414a and 414b and the gate electrode 416 do not overlap in the transistor 411; thus, parasitic capacitance between the gate electrode 416 and the source and drain electrodes 414a and 414b can be made low, so that high-speed operation can be realized.

The oxide semiconductor film 413 includes a pair of dopant regions 418a and 418b which are obtained by addition of a dopant imparting n-type conductivity to the oxide semiconductor film 413 after formation of the gate electrode 416. Further, in the oxide semiconductor film 413, a region with which the gate electrode 416 overlaps with the gate insulating film 415 provided therebetween is a channel formation region 419. In the oxide semiconductor film 413, the channel formation region 419 is provided between the pair of dopant regions 418a and 418b. The addition of the dopant for forming the dopant regions 418a and 418b can be performed by an ion implantation method. A rare gas such as helium, argon, or xenon, nitrogen, phosphorus, arsenic, antimony, boron, or the like can be used as the dopant, for example.

For example, in the case where nitrogen is used as the dopant, the concentration of nitrogen atoms in the dopant regions 418a and 418b is preferably higher than or equal to $5\times10^{19}/cm^3$ and lower than or equal to $1\times10^{22}/cm^3$.

The dopant regions 418a and 418b to which the dopant imparting n-type conductivity is added have higher conductivity than the other regions in the oxide semiconductor film 413. Therefore, by providing the dopant regions 418a and 418b in the oxide semiconductor film 413, the resistance between the source and drain electrodes 414a and 414b can be decreased.

In the case where an In—Ga—Zn—O-based oxide semiconductor is used for the oxide semiconductor film 413, heat treatment is performed at a temperature higher than or equal to 300° C. and lower than or equal to 600° C. after nitrogen is added. Consequently, the oxide semiconductor in the dopant regions 418a and 418b has a wurtzite crystal structure. When the oxide semiconductor in the dopant regions 418a and 418b has a wurtzite crystal structure, the conductivity of the dopant regions 418a and 418b can be further increased and the resistance between the source or drain electrode 414a and the source or drain electrode 414b can be decreased. Note that in order to effectively decrease the resistance between the source or drain electrode 414a and the source or drain electrode 414b by forming the oxide semiconductor having a wurtzite crystal structure, when nitrogen is used as a dopant, the nitrogen atom concentration in the dopant regions 418a and 418b is preferably higher than or equal to $1\times10^{20}/cm^3$ and lower than or equal to 7 atoms %. However, even when the nitrogen atom concentration is lower than the above range, the oxide semiconductor having a wurtzite crystal structure can be obtained in some cases.

Further, the oxide semiconductor film 413 may be a CAAC-OS film. When the oxide semiconductor film 413 is a CAAC-OS film, the conductivity of the oxide semiconductor film 413 can be higher than that in the case of using an amorphous oxide semiconductor film; therefore, the resistance between the source and drain electrodes 414a and 414b can be reduced.

By reducing the resistance between the source and drain electrodes 414a and 414b, high on-state current and high-speed operation can be ensured even when the transistor 411 is miniaturized. In addition, by miniaturization of the transistor 411, the area of a semiconductor device including the transistor can be reduced, so that the number of transistors per unit area can be increased.

Figure 11B:
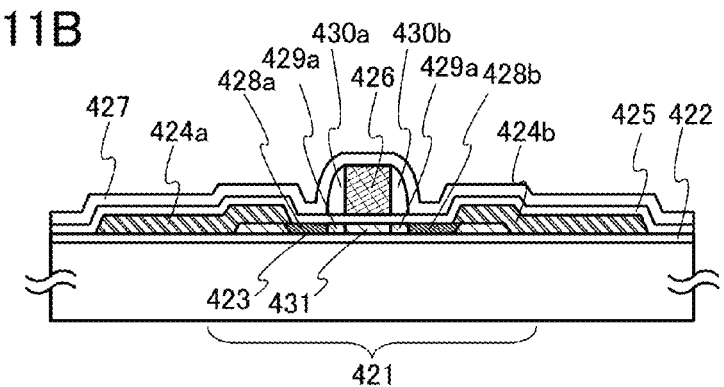

A transistor 421 illustrated in FIG. 11B includes an oxide semiconductor film 423 formed over a base film 422, a source or drain electrode 424a and a source or a drain electrode 424b which are formed over the oxide semiconductor film 423, a gate insulating film 425 over the oxide semiconductor film 423 and the source and drain electrodes 424a and 424b, a gate electrode 426 provided over the gate insulating film 425 so as to overlap with the oxide semiconductor film 423, and a protective insulating film 427 provided over the gate electrode 426 and covering the oxide semiconductor film 423. The transistor 421 further includes sidewalls 430a and 430b provided on side surfaces of the gate electrode 426 and formed using an insulating film.

The transistor 421 illustrated in FIG. 11B has a top-gate structure where the gate electrode 426 is formed over the oxide semiconductor film 423, and has a top-contact structure where the source and drain electrodes 424a and 424b are formed over the oxide semiconductor film 423. In addition, similarly to the transistor 411, the source and drain electrodes 424a and 424b and the gate electrode 426 do not overlap in the transistor 421; thus, parasitic capacitance between the gate electrode 426 and the source and drain electrodes 424a and 424b can be made low, so that high-speed operation can be realized.

The oxide semiconductor film 423 includes a pair of high-concentration dopant regions 428a and 428b and a pair of low-concentration dopant regions 429a and 429b which are obtained by addition of dopants imparting n-type conductivity to the oxide semiconductor film 423 after formation of the gate electrode 426. Further, in the oxide semiconductor film 423, a region with which the gate electrode 426 overlaps with the gate insulating film 425 provided therebetween is a channel formation region 431. In the oxide semiconductor film 423, the pair of low-concentration dopant regions 429a and 429b are provided between the pair of high-concentration dopant regions 428a and 428b, and the channel formation region 431 is provided between the pair of low-concentration dopant regions 429a and 429b. The pair of low-concentration dopant regions 429a and 429b are provided in regions which are included in the oxide semiconductor film 423 and overlap with the sidewalls 430a and 430b with the gate insulating film 425 provided therebetween.

Similarly to the dopant regions 418a and 418b included in the transistor 411, the high-concentration dopant regions 428a and 428b and the low-concentration dopant regions 429a and 429b can be formed by an ion implantation method. The description of the dopant regions 418a and 418b can be referred to for the kind of the dopant for forming the high-concentration dopant regions 428a and 428b.

For example, in the case where nitrogen is used as the dopant, the concentration of nitrogen atoms in the high-concentration dopant regions 428a and 428b is preferably higher than or equal to $5\times10^{19}/cm^3$ and lower than or equal to $1\times10^{22}/cm^3$. Further, for example, in the case where nitrogen is used as the dopant, the concentration of nitrogen atoms in the low-concentration dopant regions 429a and 429b is preferably higher than or equal to $5\times10^{18}/cm^3$ and lower than or equal to $5\times10^{19}/cm^3$.

The high-concentration dopant regions 428a and 428b to which the dopant imparting n-type conductivity is added have higher conductivity than the other regions in the oxide semiconductor film 423. Therefore, by providing the high-concentration dopant regions 428a and 428b in the oxide semiconductor film 423, the resistance between the source and drain electrodes 424a and 424b can be decreased. Further, the low-concentration dopant regions 429a and 429b are provided between the channel formation region 431 and the high-concentration dopant regions 428a and 428b, which results in a reduction in negative shift of a threshold voltage due to a short-channel effect.

In the case where an In—Ga—Zn—O-based oxide semiconductor is used for the oxide semiconductor film 423, heat treatment is performed at a temperature higher than or equal to 300° C. and lower than or equal to 600° C. after nitrogen is added. Consequently, the oxide semiconductor in the high-concentration dopant regions 428a and 428b has a wurtzite crystal structure. Further, depending on the nitrogen concentration, the low-concentration dopant regions 429a and 429b also have a wurtzite crystal structure due to the heat treatment. When the oxide semiconductor in the high-concentration dopant regions 428a and 428b has a wurtzite crystal structure, the conductivity of the high-concentration dopant regions 428a and 428b can be further increased and the resistance between the source or drain electrode 424a and the source or drain electrode 424b can be decreased. Note that in order to effectively decrease the resistance between the source or drain electrode 424a and the source or drain electrode 424b by forming the oxide semiconductor having a wurtzite crystal structure, when nitrogen is used as a dopant, the nitrogen atom concentration in the dopant regions 428a and 428b is preferably higher than or equal to $1\times10^{20}/cm^3$ and lower than or equal to 7 atoms %. However, even when the nitrogen atom concentration is lower than the above range, the oxide semiconductor having a wurtzite crystal structure can be obtained in some cases.

Further, the oxide semiconductor film 423 may be a CAAC-OS film. When the oxide semiconductor film 423 is a CAAC-OS film, the conductivity of the oxide semiconductor film 423 can be higher than that in the case of using an amorphous oxide semiconductor film; therefore, the resistance between the source and drain electrodes 424a and 424b can be reduced.

By reducing the resistance between the source and drain electrodes 424a and 424b, high on-state current and high-speed operation can be ensured even when the transistor 421 is miniaturized. By miniaturization of the transistor 421, the area of a memory cell array including the transistor can be reduced, so that memory capacity per unit area can be increased.

Figure 11C:
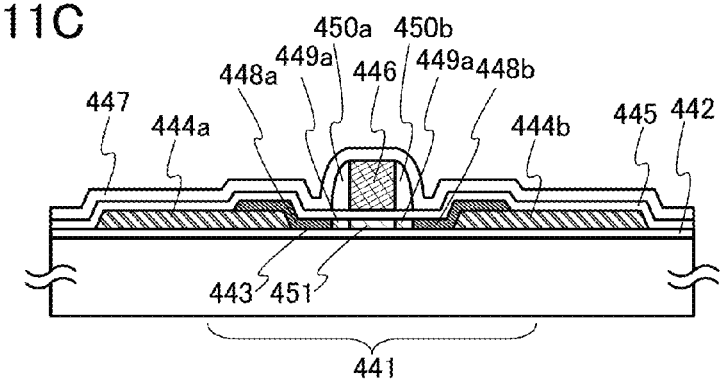

A transistor 441 illustrated in FIG. 11C includes a source or drain electrode 444a and a source or drain electrode 444b which are formed over a base film 442, an oxide semiconductor film 443 which is formed over the source and drain electrodes 444a and 444b and which serves as an active layer, a gate insulating film 445 over the oxide semiconductor film 443 and the source and drain electrodes 444a and 444b, a gate electrode 446 provided over the gate insulating film 445 so as to overlap with the oxide semiconductor film 443, and a protective insulating film 447 provided over the gate electrode 446 and covering the oxide semiconductor film 443. The transistor 441 further includes sidewalls 450a and 450b which are provided on side surfaces of the gate electrode 446 and formed using an insulating film.

The transistor 441 illustrated in FIG. 11C has a top-gate structure where the gate electrode 446 is formed over the oxide semiconductor film 443, and has a bottom-contact structure where the source and drain electrodes 444a and 444b are formed below the oxide semiconductor film 443. In addition, similarly to the transistor 411, the source and drain electrodes 444a and 444b and the gate electrode 446 do not overlap in the transistor 441; thus, parasitic capacitance between the gate electrode 446 and the source and drain electrodes 444a and 444b can be made low, so that high-speed operation can be realized.

The oxide semiconductor film 443 includes a pair of high-concentration dopant regions 448a and 448b and a pair of low-concentration dopant regions 449a and 449b which are obtained by addition of dopants imparting n-type conductivity to the oxide semiconductor film 443 after formation of the gate electrode 446. Further, in the oxide semiconductor film 443, a region with which the gate electrode 446 overlaps with the gate insulating film 445 provided therebetween is a channel formation region 451. In the oxide semiconductor film 443, the pair of low-concentration dopant regions 449a and 449b are provided between the pair of high-concentration dopant regions 448a and 448b, and the channel formation region 451 is provided between the pair of low-concentration dopant regions 449a and 449b. The pair of low-concentration dopant regions 449a and 449b are provided in regions which are included in the oxide semiconductor film 443 and with which the sidewalls 450a and 450b overlap with the gate insulating film 445 provided therebetween.

Similarly to the dopant regions 418a and 418b included in the transistor 411, the high-concentration dopant regions 448a and 448b and the low-concentration dopant regions 449a and 449b can be formed by an ion implantation method. The description of the dopant regions 418a and 418b can be referred to for the kind of the dopant for forming the high-concentration dopant regions 448a and 448b.

For example, in the case where nitrogen is used as the dopant, the concentration of nitrogen atoms in the high-concentration dopant regions 448a and 448b is preferably higher than or equal to $5\times10^{19}/cm^3$ and lower than or equal to $1\times10^{22}/cm^3$. Further, for example, in the case where nitrogen is used as the dopant, the concentration of nitrogen atoms in the low-concentration dopant regions 449a and 449b is preferably higher than or equal to $5\times10^{18}/cm^3$ and lower than or equal to $5\times10^{19}/cm^3$.

The high-concentration dopant regions 448a and 448b to which the dopant imparting n-type conductivity is added have higher conductivity than the other regions in the oxide semiconductor film 443. Therefore, by providing the high-concentration dopant regions 448a and 448b in the oxide semiconductor film 443, the resistance between the source and drain electrodes 444a and 444b can be decreased. Further, the low-concentration dopant regions 449a and 449b are provided between the channel formation region 451 and the high-concentration dopant regions 448a and 448b, which results in a reduction in negative shift of a threshold voltage due to a short-channel effect.

In the case where an In—Ga—Zn—O-based oxide semiconductor is used for the oxide semiconductor film 443, heat treatment is performed at a temperature higher than or equal to 300° C. and lower than or equal to 600° C. after nitrogen is added. Consequently, the oxide semiconductor in the high-concentration dopant regions 448a and 448b has a wurtzite crystal structure. Further, depending on the nitrogen concentration, the low-concentration dopant regions 449a and 449b also have a wurtzite crystal structure due to the heat treatment. When the oxide semiconductor in the high-concentration dopant regions 448a and 448b has a wurtzite crystal structure, the conductivity of the high-concentration dopant regions 448a and 448b can be further increased and the resistance between the source or drain electrode 444a and the source or drain electrode 444b can be decreased. Note that in order to effectively decrease the resistance between the source or drain electrode 444a and the source or drain electrode 444b by forming the oxide semiconductor having a wurtzite crystal structure, when nitrogen is used as a dopant, the nitrogen atom concentration in the dopant regions 448a and 448b is preferably higher than or equal to $1\times10^{20}/cm^3$ and lower than or equal to 7 atoms %. However, even when the nitrogen atom concentration is lower than the above range, the oxide semiconductor having a wurtzite crystal structure can be obtained in some cases.

Further, the oxide semiconductor film 443 may be a CAAC-OS film. When the oxide semiconductor film 443 is a CAAC-OS film, the conductivity of the oxide semiconductor film 443 can be higher than that in the case of using an amorphous oxide semiconductor film; therefore, the resistance between the source and drain electrodes 444a and 444b can be reduced.

By reducing the resistance between the source and drain electrodes 444a and 444b, high on-state current and high-speed operation can be ensured even when the transistor 441 is miniaturized. In addition, by miniaturization of the transistor 441, the area of a semiconductor device including the transistor can be reduced, so that the number of transistors per unit area can be increased.

Note that, as one of methods for manufacturing high-concentration dopant regions functioning as a source region and a drain region in a transistor including an oxide semiconductor by a self-aligned process, a method is disclosed in which a surface of an oxide semiconductor film is exposed and argon plasma treatment is performed to reduce resistance of the region in the oxide semiconductor film which is exposed to plasma (S. Jeon et al. "180 nm Gate Length Amorphous InGaZnO Thin Film Transistor for High Density Image Sensor Applications", *IEDM Tech. Dig.*, pp. 504-507, 2010).

However, in the manufacturing method, a gate insulating film needs to be partly removed after formation of the gate insulating film so that portions which are to serve as the source region and the drain region are exposed. At the time of partly removing the gate insulating film, part of an oxide semiconductor film below the gate insulating film is overetched, so that the thicknesses of the portions which are to serve as the source region and the drain region are reduced. Consequently, the resistance of the source or drain region is increased, and defects in characteristics of the transistor due to overetching easily occur.

In order to promote miniaturization of a transistor, it is necessary to employ a dry etching method with high processing accuracy. However, the above-described overetching remarkably tends to occur in the dry-etching method by which the selection ratio of the gate insulating film to the oxide semiconductor film cannot be sufficiently provided.

For example, although overetching does not cause a problem when the oxide semiconductor film is sufficiently thick, it is necessary that the thickness of part of the oxide semiconductor film which serves as a channel formation region is less than or equal to 20 nm, preferably less than or equal to 10 nm when the channel length is less than or equal to 200 nm, considering prevention of a short-channel effect. Overetching of such a thin oxide semiconductor film is not preferable because the above-described problem such as increase in the resistance of the source or drain region or defects in characteristics of the transistor occurs.

However, when a dopant is added to the oxide semiconductor film in the state where the oxide semiconductor film is not exposed and a gate insulating film remains, as described in one embodiment of the present invention, the overetching of the oxide semiconductor film can be prevented and excessive damage to the oxide semiconductor film can be reduced. In addition, the interface between the oxide semiconductor film and the gate insulating film is kept clean. Accordingly, the characteristics and reliability of the transistor can be improved.

A base film positioned below the oxide semiconductor film or a protective insulating film positioned above the oxide semiconductor film is preferably formed using a material that has a high barrier property against an alkali metal, hydrogen, and oxygen. For example, as the insulating film having a high barrier property, a silicon nitride film, a silicon nitride oxide film, an aluminum nitride film, an aluminum oxide film, an aluminum oxynitride film, an aluminum nitride oxide film, or the like can be used. As the base film and the protective insulating film, a single layer or a stack of layers of the insulating film having a high barrier property, or a stack of layers of the insulating film having a high barrier property and the insulating film having a low barrier property may be used.

Covering the oxide semiconductor film with an insulating film having a high barrier property can prevent entry of impurities from the outside and release of oxygen from the oxide semiconductor film. Therefore, reliability of the transistor can be improved.

This embodiment can be implemented in appropriate combination with any of the other embodiments.

Embodiment 4

In this embodiment, an oxide semiconductor film including a crystal with c-axis alignment (also referred to as a CAAC-OS film) which has a triangular or hexagonal atomic arrangement when seen from the direction of an a-b plane, a surface, or an interface is described. In the crystal, metal atoms are arranged in a layered manner along the c-axis, or metal atoms and oxygen atoms are arranged in a layered manner along the c-axis, and the direction of the a-axis or the b-axis is varied in the a-b plane (the crystal twists around the c-axis).

An example of a crystal structure of the CAAC-OS film will be described in detail with reference to FIGS. 12A to 12E, FIGS. 13A to 13C, FIGS. 14A to 14C, and FIGS. 15A and 15B. In FIGS. 12A to 12E, FIGS. 13A to 13C, FIGS. 14A to 14C, and FIGS. 15A and 15B, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 12A to 12E, O surrounded by a circle represents a tetracoordinate O atom and O surrounded by a double circle represents a tricoordinate O atom.

Figure 12A:
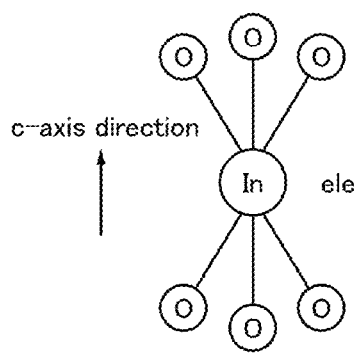
FIGS. 12A to 12E each illustrate a crystal structure of an oxide material.

FIG. 12A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 12A is actually an octahedral structure, but is illustrated as a planar structure for simplicity. Note that three tetracoordinate O atoms exist in each of an upper half and a lower half in FIG. 12A. In the small group illustrated in FIG. 12A, charge is 0.

Figure 12D:
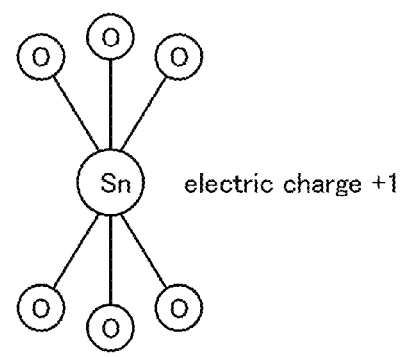
Figure 12B:
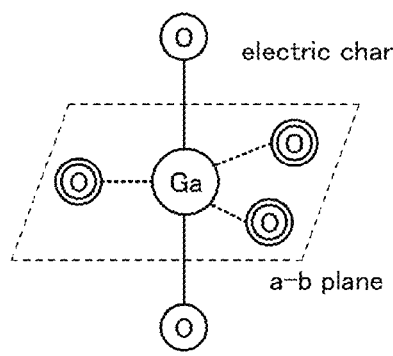

FIG. 12B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 12B. An In atom can also have the structure illustrated in FIG. 12B because an In atom can have five ligands. In the small group illustrated in FIG. 12B, charge is 0.

Figure 12E:
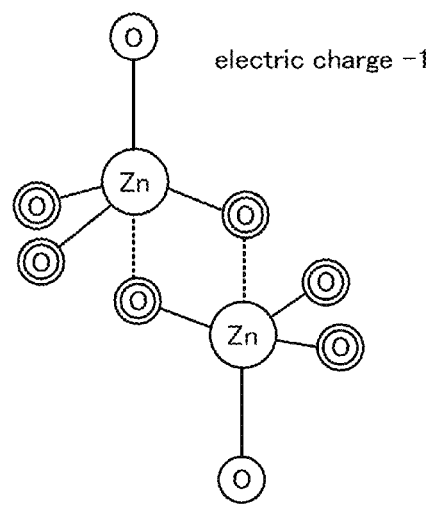
Figure 12C:
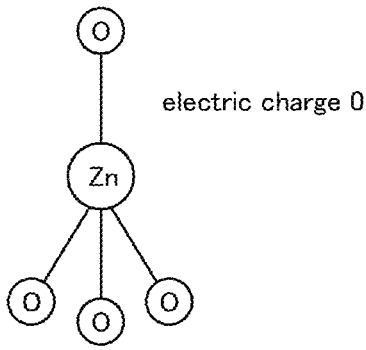

FIG. 12C illustrates a structure including one tetracoordinate Zn atom and four tetracoordinate O atoms proximate to the Zn atom. In FIG. 12C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 12C. In the small group illustrated in FIG. 12C, charge is 0.

FIG. 12D illustrates a structure including one hexacoordinate Sn atom and six tetracoordinate O atoms proximate to the Sn atom. In FIG. 12D, three tetracoordinate O atoms exist in each of an upper half and a lower half. In the small group illustrated in FIG. 12D, charge is +1.

FIG. 12E illustrates a small group including two Zn atoms. In FIG. 12E, one tetracoordinate O atom exists in each of an upper half and a lower half. In the small group illustrated in FIG. 12E, charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 12A each have three proximate In atoms in the downward direction, and the three O atoms in the lower half each have three proximate In atoms in the upward direction. The one O atom in the upper half with respect to the pentacoordinate Ga atom in FIG. 12B has one proximate Ga atom in the downward direction, and the one O atom in the lower half has one proximate Ga atom in the upward direction. The one O atom in the upper half with respect to the tetracoordinate Zn atom in FIG. 12C has one proximate Zn atom in the downward direction, and the three O atoms in the lower half each have three proximate Zn atoms in the upward direction. In this manner, the number of tetracoordinate O atoms above a metal atom is equal to the number of metal atoms proximate to and below the tetracoordinate O atoms; similarly, the number of tetracoordinate O atoms below a metal atom is equal to the number of metal atoms proximate to and above the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total charge of the layered structure is 0.

FIG. 13A illustrates a model of a medium group included in a layered structure of an In—Sn—Zn—O-based material. FIG. 13B illustrates a large group including three medium groups. Note that FIG. 13C illustrates an atomic arrangement in the case where the layered structure in FIG. 13B is observed from the c-axis direction.

In FIG. 13A, for simplicity, a tricoordinate O atom is omitted and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 13A, one tetracoordinate O atom existing in each of an upper half and a lower half with respect to an In atom is denoted by circled 1. FIG. 13A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 13A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, charge for one bond of a tricoordinate O atom and charge for one bond of a tetracoordinate O atom can be assumed to be −0.667 and −0.5, respectively. For example, charge of a (hexacoordinate or pentacoordinate) In atom, charge of a (tetracoordinate) Zn atom, and charge of a (pentacoordinate or hexacoordinate) Sn atom are +3, +2, and +4, respectively. Accordingly, charge in a small group including a Sn atom is +1. Therefore, charge of −1, which cancels +1, is needed to form a layered structure including a Sn atom. As a structure having charge of −1, the small group including two Zn atoms as illustrated in FIG. 12E can be given. For example, with one small group including two Zn atoms, charge of one small group including a Sn atom can be cancelled, so that the total charge of the layered structure can be 0.

When the large group illustrated in FIG. 13B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: an In—Sn—Ga—Zn—O-based oxide which is an oxide of four metal elements; an In—Ga—Zn—O-based oxide (also referred to as IGZO), an In—Al—Zn—O-based oxide, a Sn—Ga—Zn—O-based oxide, an Al—Ga—Zn—O-based oxide, a Sn—Al—Zn—O-based oxide, an In—Hf—Zn—O-based oxide, an In—La—Zn—O-based oxide, an In—Ce—Zn—O-based oxide, an In—Pr—Zn—O-based oxide, an In—Nd—Zn—O-based oxide, an In—Sm—Zn—O-based oxide, an In—Eu—Zn—O-based oxide, an In—Gd—Zn—O-based oxide, an In—Tb—Zn—O-based oxide, an In—Dy—Zn—O-based oxide, an In—Ho—Zn—O-based oxide, an In—Er—Zn—O-based oxide, an In—Tm—Zn—O-based oxide, an In—Yb—Zn—O-based oxide, or an In—Lu—Zn—O-based oxide, which is an oxide of three metal elements; an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, or an In—Ga—O-based oxide which is an oxide of two metal elements; and the like.

Figure 14A:
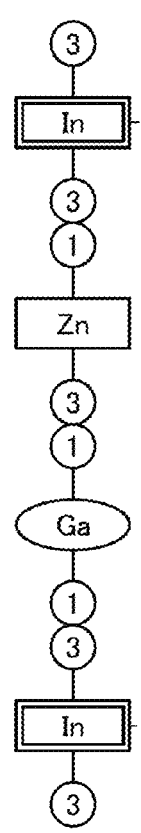
FIGS. 14A to 14C illustrate a crystal structure of an oxide material.

As an example, FIG. 14A illustrates a model of a medium group included in a layered structure of an In—Ga—Zn—O-based material.

In the medium group included in the layered structure of the In—Ga—Zn—O-based material in FIG. 14A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 14B:
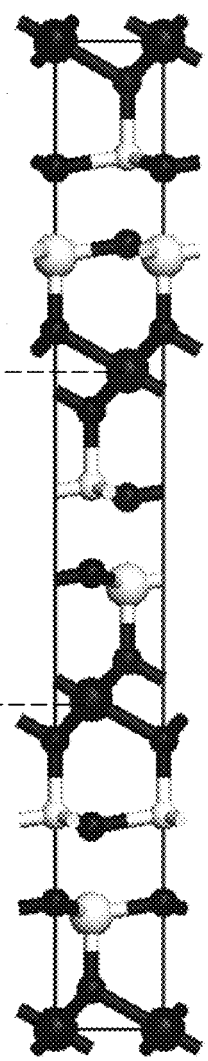
Figure 14C:
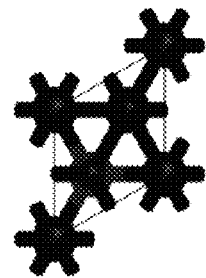

FIG. 14B illustrates a large group including three medium groups. Note that FIG. 14C illustrates an atomic arrangement in the case where the layered structure in FIG. 14B is observed from the c-axis direction.

Here, since charge of a (hexacoordinate or pentacoordinate) In atom, charge of a (tetracoordinate) Zn atom, and charge of a (pentacoordinate) Ga atom are +3, +2, and +3, respectively, charge of a small group including any of an In atom, a Zn atom, and a Ga atom is 0. As a result, the total charge of a medium group having a combination of such small groups is always 0.

In order to form the layered structure of the In—Ga—Zn—O-based material, a large group can be formed using not only the medium group illustrated in FIG. 14A but also a medium group in which the arrangement of the In atom, the Ga atom, and the Zn atom is different from that in FIG. 14A.

When the large group illustrated in FIG. 14B is repeated, an In—Ga—Zn—O-based crystal can be obtained. Note that a layered structure of the obtained In—Ga—Zn—O-based crystal can be expressed as a composition formula, $InGaO_3(ZnO)_n$ (n is a natural number).

Figure 15A:
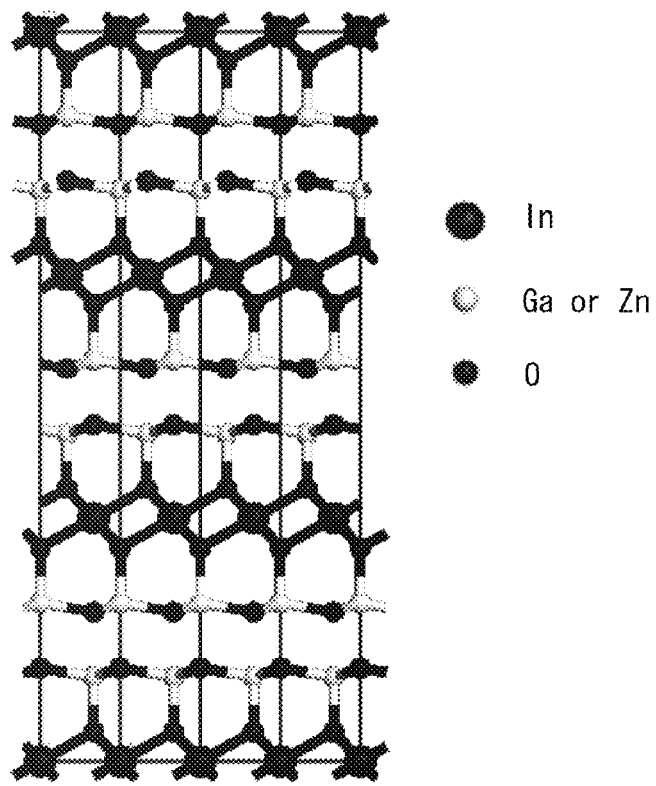
FIGS. 15A and 15B each illustrate a crystal structure of an oxide material.

In the case where n=1 ($InGaZnO_4$), a crystal structure illustrated in FIG. 15A can be obtained, for example. Note that in the crystal structure in FIG. 15A, since a Ga atom and an In atom each have five ligands as described with FIG. 12B, a structure in which Ga is replaced with In can be obtained.

Figure 15B:
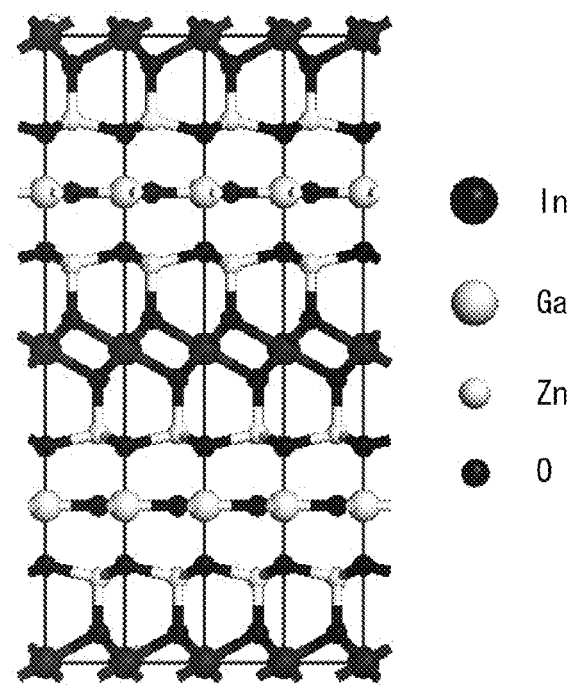

In the case where n=2 ($InGaZn_2O_5$), a crystal structure illustrated in FIG. 15B can be obtained, for example. Note that in the crystal structure in FIG. 15B, since a Ga atom and an In atom each have five ligands as described with FIG. 12B, a structure in which Ga is replaced with In can be obtained.

As described above, a variety of crystal structures of the CAAC-OS film can be obtained.

This embodiment can be implemented in appropriate combination with any of the other embodiments.

Embodiment 5

In this embodiment, the field-effect mobility of a transistor will be described.

The actually measured field-effect mobility of an insulated gate transistor can be lower than its original mobility because of a variety of reasons; this phenomenon occurs not only in the case of using a transistor whose channel is formed in an oxide semiconductor film. One of the reasons that reduce the mobility is a defect inside a semiconductor or a defect at the interface between the semiconductor and an insulating film. When a Levinson model is used, the field-effect mobility that is based on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility t can be expressed as the following formula (4).

$$\mu = \mu_0 \exp\left(-\frac{E}{kT}\right) \quad (4)$$

Here, E represents the height of the potential barrier, k represents the Boltzmann constant, and T represents the absolute temperature. When the potential barrier is assumed to be attributed to a defect, the height E of the potential barrier can be expressed as the following formula (5) according to the Levinson model.

$$E = \frac{e^2 N^2}{8\varepsilon n} = \frac{e^2 N^2 t}{8\varepsilon C_{ox} V_g} \quad (5)$$

Here, e represents the elementary charge, N represents the average defect density per unit area in a channel, ∈ represents the permittivity of the semiconductor, n represents the number of carriers per unit area in the channel, $C_{ox}$ represents the capacitance per unit area, $V_g$ represents the gate voltage, and t represents the thickness of the channel. Note that in the case where the thickness of the semiconductor layer is less than or equal to 30 nm, the thickness of the channel may be regarded as being the same as the thickness of the semiconductor layer. The drain current $I_d$ in a linear region can be expressed as the following formula (6).

$$I_d = \frac{W \mu V_g V_d C_{ox}}{L} \exp\left(-\frac{E}{kT}\right) \quad (6)$$

Here, L represents the channel length and W represents the channel width, and L and W are each 10 μm. Further, $V_d$ represents the drain voltage. When dividing both sides of the above equation by $V_g$ and then taking logarithms of both sides, the following formula (7) can be obtained.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT\varepsilon C_{ox} V_g} \quad (7)$$

The right side of the formula (7) is a function of $V_g$. From the formula, it is found that the defect density N can be obtained from the slope of a line in which $\ln(I_d/V_g)$ is the ordinate and $1/V_g$ is the abscissa. That is, the defect density can be evaluated from the $I_d$–$V_g$ characteristics of the transistor. The defect density N of an oxide semiconductor in which the ratio of indium (In), tin (Sn), and zinc (Zn) is 1:1:1 is approximately $1 \times 10^{12}/cm^2$.

On the basis of the defect density obtained in this manner, or the like, $\mu_0$ can be calculated to be 120 $cm^2$/Vs from the formula 4 and the formula 5. The measured mobility of an In—Sn—Zn oxide including a defect is approximately 40 $cm^2$/Vs. However, assuming that no defect exists inside the semiconductor and at the interface between the semiconductor and an insulating film, the mobility $\mu_0$ of the oxide semiconductor is expected to be 120 $cm^2$/Vs.

Note that even when no defect exists inside a semiconductor, scattering at the interface between a channel and a gate insulating layer adversely affects the transport property of the transistor. In other words, the mobility $\mu_1$ at a position that is distance x away from the interface between the channel and the gate insulating layer can be expressed as the following formula (8).

$$\frac{1}{\mu_1} = \frac{1}{\mu_0} + \frac{D}{B} \exp\left(-\frac{x}{l}\right) \quad (8)$$

Here, D represents the electric field in the gate direction, and B and l are constants. Note that B and l can be obtained from actual measurement results; according to the above measurement results, B is $4.75 \times 10^7$ cm/s and l is 10 nm (the depth to which the influence of interface scattering reaches). When D is increased (i.e., when the gate voltage is increased), the second term of the formula 6 is increased and accordingly the mobility $\mu_1$ is decreased.

Figure 16:
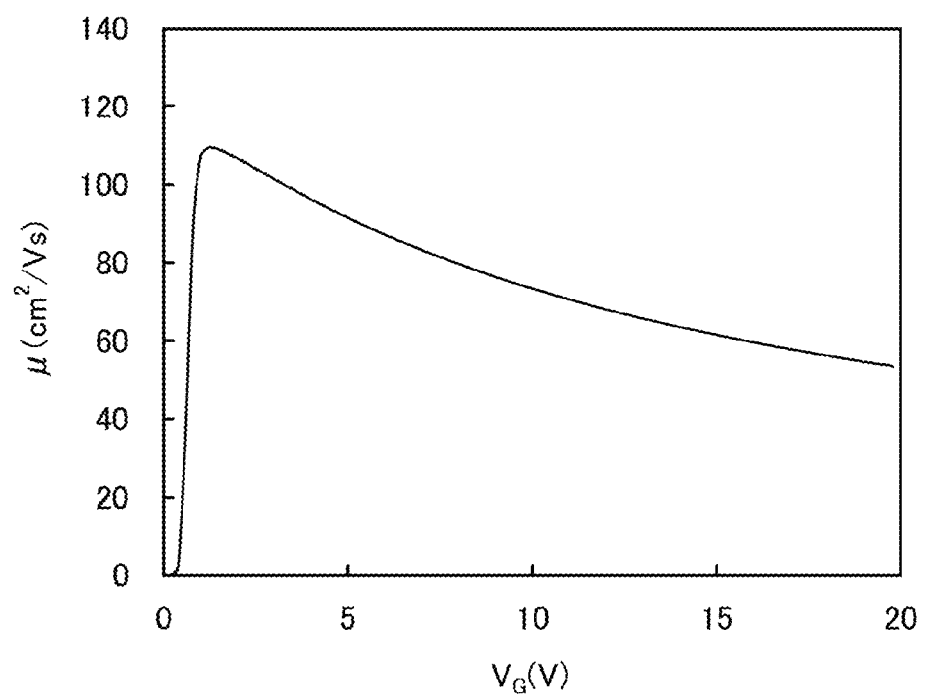
FIG. 16 shows gate voltage dependence of mobility obtained by calculation.

FIG. 16 shows calculation results of the mobility $\mu_2$ of a transistor whose channel is formed using an ideal oxide semiconductor without a defect inside the semiconductor. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating layer was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 16, the mobility has a peak of 100 cm²/Vs or more at a gate voltage that is a little over 1 V, and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors formed using an oxide semiconductor having such a mobility are shown in FIGS. 17A to 17C, FIGS. 18A to 18C, and FIGS. 19A to 19C. FIGS. 20A and 20B illustrate cross-sectional structures of the transistors used for the calculation. The transistors illustrated in FIGS. 20A and 20B each include a semiconductor region 1103a and a semiconductor region 1103c that have n⁺-type conductivity in an oxide semiconductor layer. The resistivity of the semiconductor regions 1103a and 1103c is 2×10⁻³ Ωcm.

The transistor in FIG. 20A is formed over a base insulating layer 1101 and an embedded insulator 1102 that is embedded in the base insulating layer 1101 and formed of aluminum oxide. The transistor includes the semiconductor region 1103a, the semiconductor region 1103c, an intrinsic semiconductor region 1103b that is placed between the semiconductor regions 1103a and 1103c and serves as a channel formation region, and a gate electrode 1105. The width of the gate electrode 1105 is 33 nm.

A gate insulating film 1104 is formed between the gate electrode 1105 and the semiconductor region 1103b. A sidewall insulating layer 1106a and a sidewall insulating layer 1106b are formed on both side surfaces of the gate electrode 1105, and an insulating layer 1107 is formed over the gate electrode 1105 so as to prevent a short circuit between the gate electrode 1105 and another wiring. The sidewall insulating layer has a width of 5 nm. A source or drain electrode 1108a and a source or drain electrode 1108b are provided in contact with the semiconductor region 1103a and the semiconductor region 1103c, respectively. Note that the channel width of this transistor is 40 nm.

The transistor in FIG. 20B is the same as the transistor in FIG. 20A in that it is formed over the base insulating layer 1101 and the embedded insulator 1102 formed of aluminum oxide and that it includes the semiconductor region 1103a, the semiconductor region 1103c, the intrinsic semiconductor region 1103b provided therebetween, the gate electrode 1105 having a width of 33 nm, the gate insulating film 1104, the sidewall insulating layer 1106a, the sidewall insulating layer 1106b, the insulating layer 1107, the source or drain electrode 1108a, and the source or drain electrode 1108b.

The difference between the transistor in FIG. 20A and the transistor in FIG. 20B is the conductivity type of semiconductor regions under the sidewall insulating layers 1106a and 1106b. In the transistor in FIG. 20A, the semiconductor regions under the sidewall insulating layer 1106a and the sidewall insulating layer 1106b are part of the semiconductor region 1103a having n⁺-type conductivity and part of the semiconductor region 1103c having n⁺-type conductivity, whereas in the transistor in FIG. 20B, the semiconductor regions under the sidewall insulating layer 1106a and the sidewall insulating layer 1106b are part of the intrinsic semiconductor region 1103b. In other words, in the semiconductor layer of FIG. 20B, a region having a width of $L_{off}$ which overlaps with neither the semiconductor region 1103a (the semiconductor region 1103c) nor the gate electrode 1105 is provided. This region is called an offset region, and the width $L_{off}$ is called an offset length. As is seen from the drawing, the offset length is equal to the width of the sidewall insulating layer 1106a (the sidewall insulating layer 1106b).

Figure 17A:
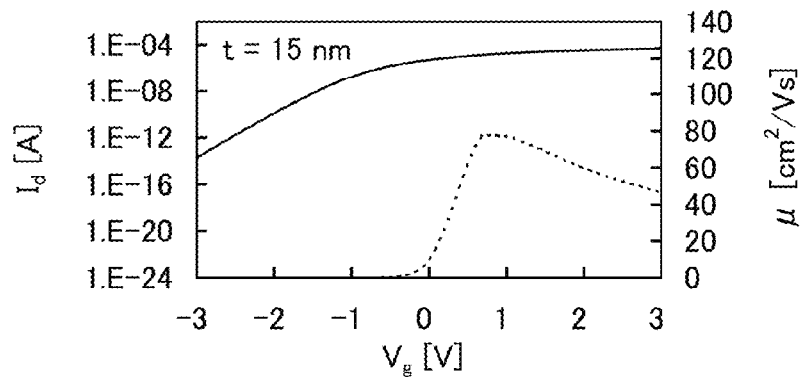
FIGS. 17A to 17C each show gate voltage dependence of drain current and mobility obtained by calculation.
Figure 17B:
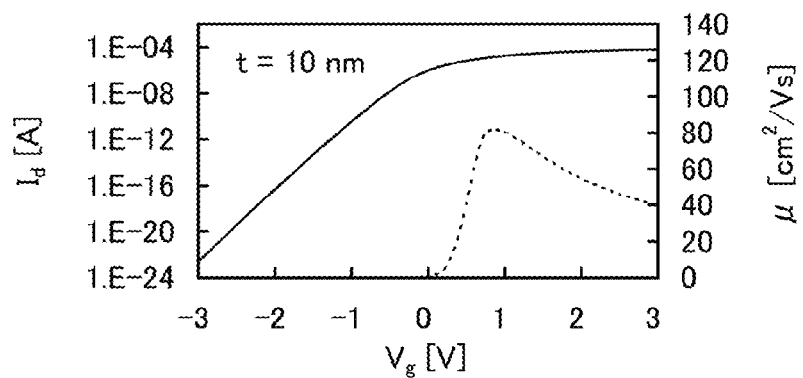
Figure 17C:
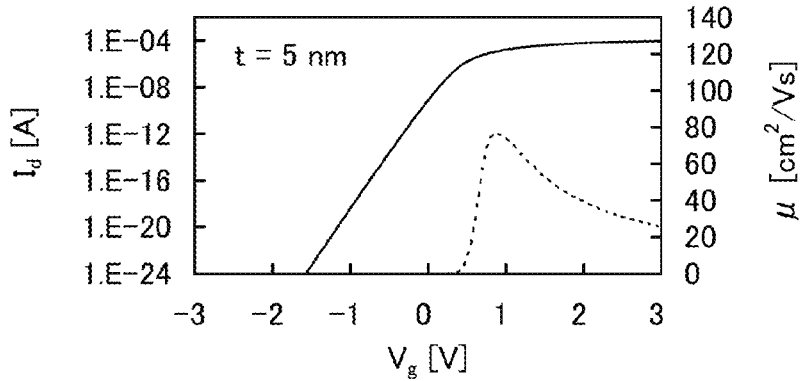

The other parameters used in calculation are as described above. For the calculation, device simulation software Sentaurus Device manufactured by Synopsys, Inc. was used. FIGS. 17A to 17C show the gate voltage ($V_g$: a potential difference between the gate and the source) dependence of the drain current ($I_d$, a solid line) and the mobility (μ, a dotted line) of the transistor having the structure illustrated in FIG. 20A. The drain current $I_d$ is obtained by calculation under the assumption that the drain voltage (a potential difference between the drain and the source) is +1 V, and the mobility μ is obtained by calculation under the assumption that the drain voltage is +0.1 V.

FIG. 17A shows the gate voltage dependence of the transistor in the case where the thickness of the gate insulating film is 15 nm, FIG. 17B shows that of the transistor in the case where the thickness of the gate insulating film is 10 nm, and FIG. 17C shows that of the transistor in the case where the thickness of the gate insulating film is 5 nm. As the gate insulating film is thinner, the drain current $I_d$ in an off state (the off-state current) in particular is significantly decreased. In contrast, there is no noticeable change in peak value of the mobility μ and the drain current $I_d$ in an on state (the on-state current). The graphs show that the drain current exceeds 10 μA, which is required in a memory element and the like, at a gate voltage of around 1 V.

Figure 18A:
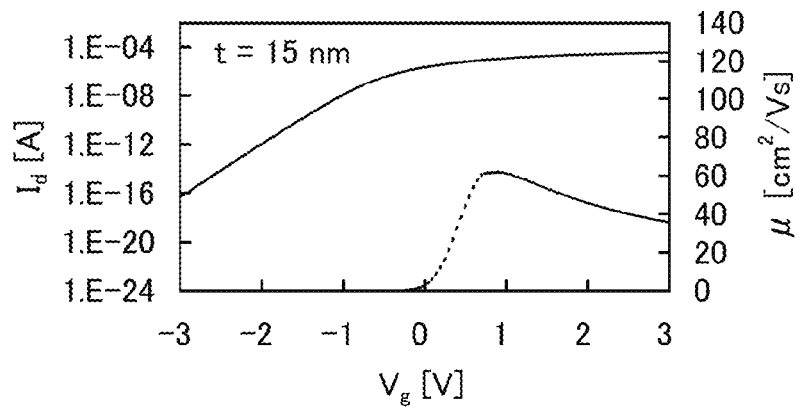
FIGS. 18A to 18C each show gate voltage dependence of drain current and mobility obtained by calculation.
Figure 18B:
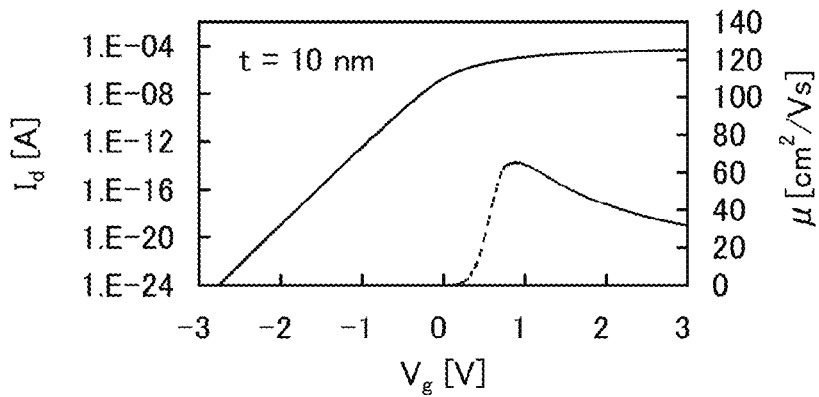
Figure 18C:
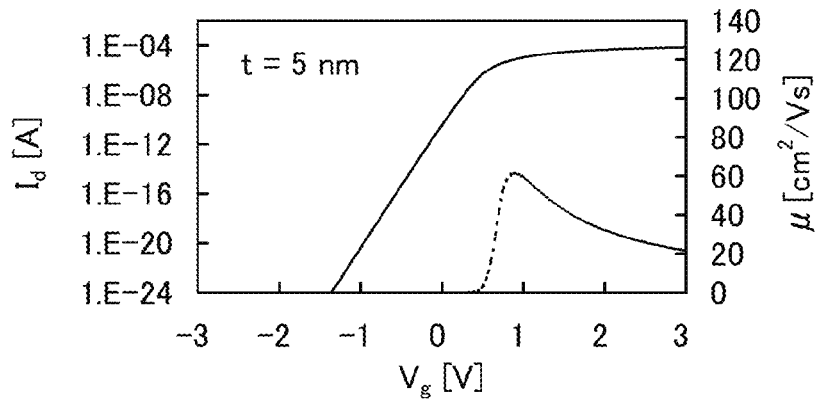

FIGS. 18A to 18C show the gate voltage $V_g$ dependence of the drain current $I_d$ (a solid line) and the mobility μ (a dotted line) of the transistor having the structure in FIG. 20B and an offset length $L_{off}$ of 5 nm. The drain current $I_d$ is obtained by calculation under the assumption that the drain voltage is +1 V, and the mobility μ is obtained by calculation under the assumption that the drain voltage is +0.1 V. FIG. 18A shows the gate voltage dependence of the transistor in the case where the thickness of the gate insulating film is 15 nm, FIG. 18B shows that of the transistor in the case where the thickness of the gate insulating film is 10 nm, and FIG. 18C shows that of the transistor in the case where the thickness of the gate insulating film is 5 nm.

Figure 19A:
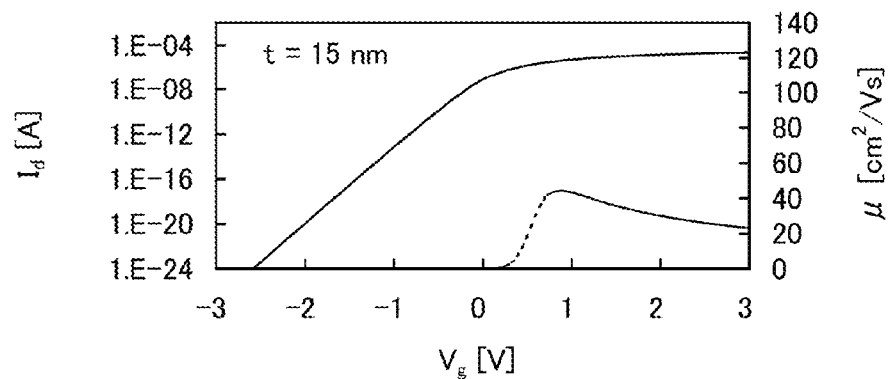
FIGS. 19A to 19C each show gate voltage dependence of drain current and mobility obtained by calculation.
Figure 19B:
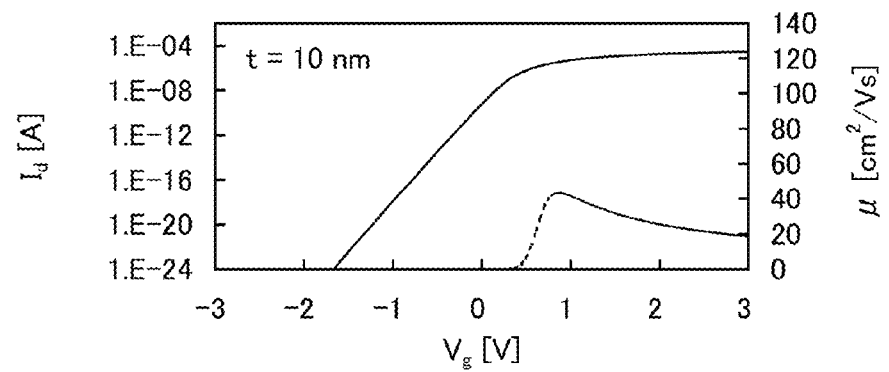
Figure 19C:
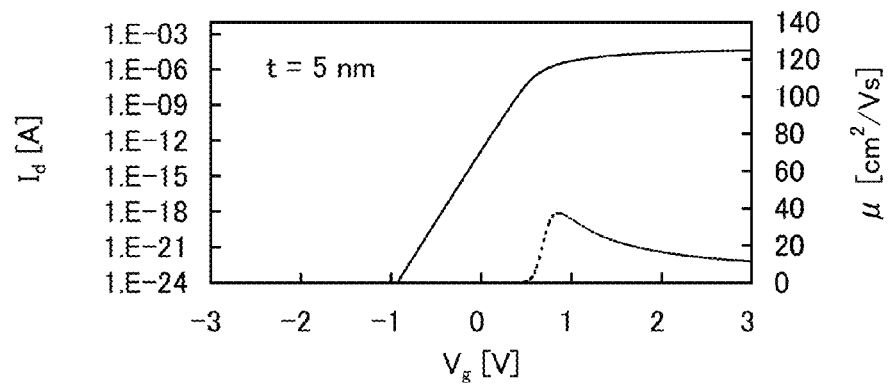
Figure 20A:
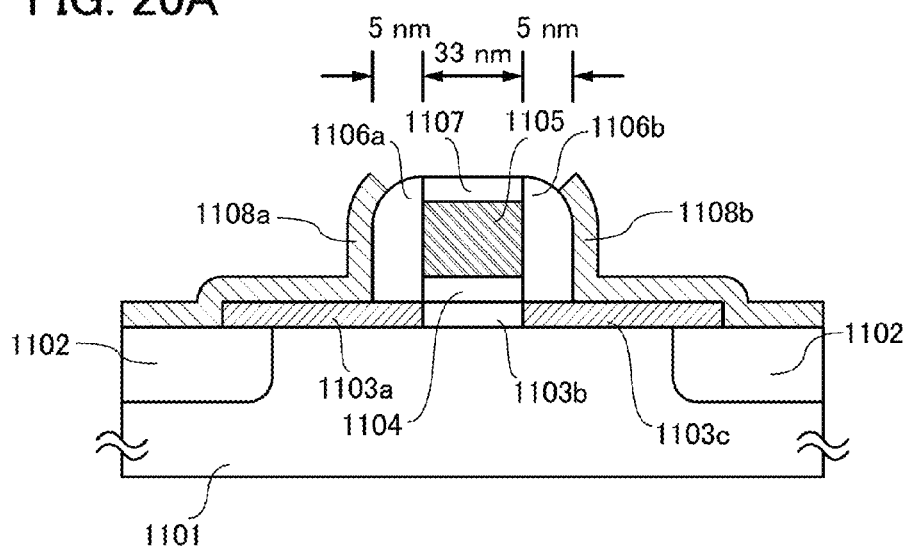
FIGS. 20A and 20B each illustrate a cross-sectional structure of a transistor used in calculation.
Figure 20B:
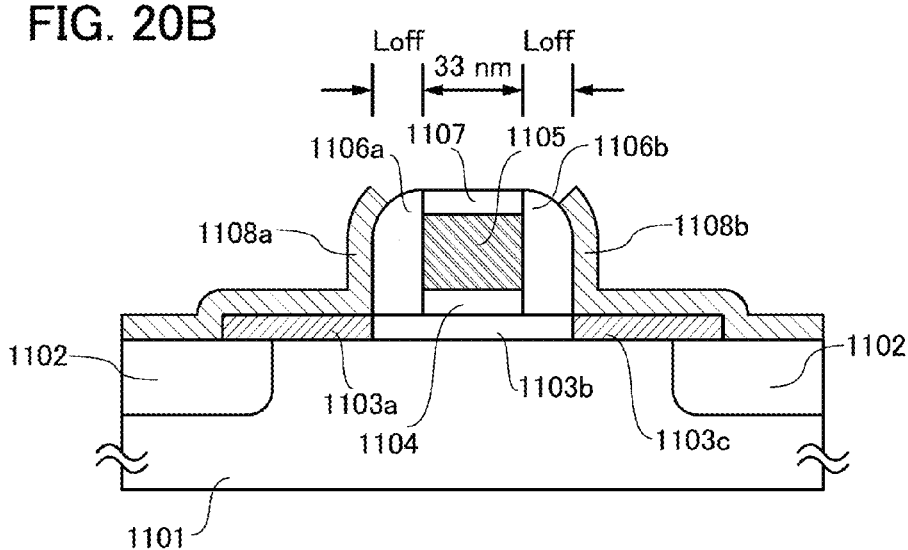

FIGS. 19A to 19C show the gate voltage dependence of the drain current $I_d$ (a solid line) and the mobility μ (a dotted line) of the transistor having the structure in FIG. 20B and an offset length $L_{off}$ of 15 nm. The drain current $I_d$ is obtained by calculation under the assumption that the drain voltage is +1 V, and the mobility μ is obtained by calculation under the assumption that the drain voltage is +0.1 V. FIG. 19A shows the gate voltage dependence of the transistor in the case where the thickness of the gate insulating film is 15 nm, FIG. 19B shows that of the transistor in the case where the thickness of the gate insulating film is 10 nm, and FIG. 19C shows that of the transistor in the case where the thickness of the gate insulating film is 5 nm.

In either of the structures, as the gate insulating film is thinner, the off-state current is significantly decreased, whereas no noticeable change arises in the peak value of the mobility μ and the on-state current.

Note that the peak of the mobility t is approximately 80 cm²/Vs in FIGS. 17A to 17C, approximately 60 cm²/Vs in FIGS. 18A to 18C, and approximately 40 cm²/Vs in FIGS. 19A to 19C; thus, the peak of the mobility t is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

This embodiment can be implemented in appropriate combination with any of the other embodiments.

Embodiment 6

In this embodiment, electric characteristics and off-state current of a transistor including an oxide semiconductor, which can be used in a memory device according to one embodiment of the present invention, will be described.

Figure 21A:
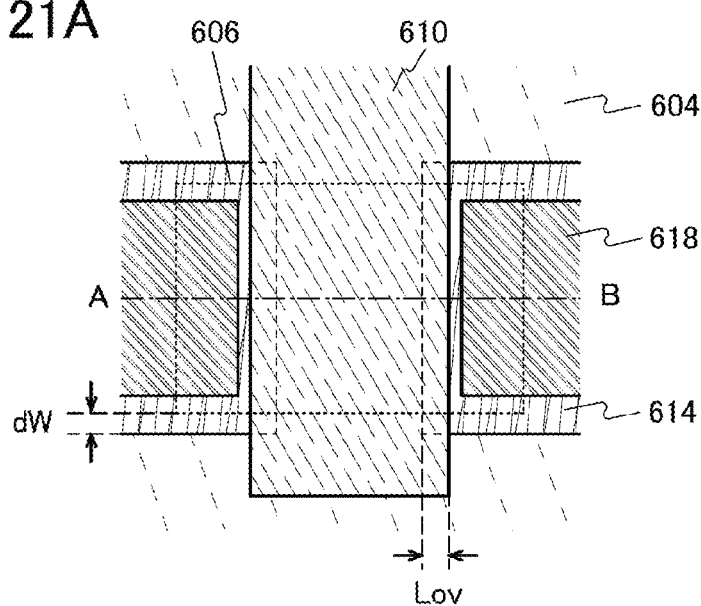
FIGS. 21A and 21B are a top view and a cross-sectional view of a transistor.
Figure 21B:
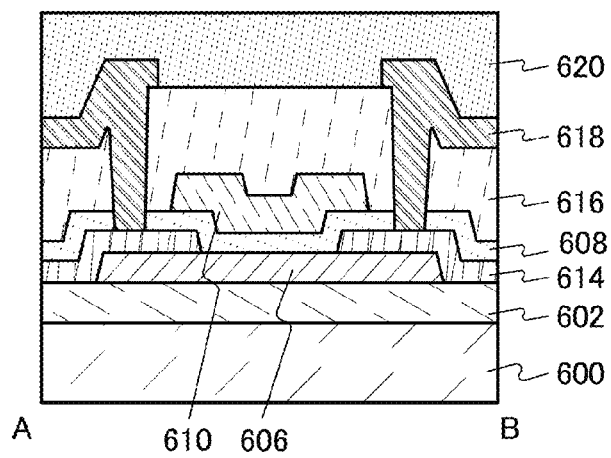

FIGS. 21A and 21B are a top view and a cross-sectional view of each of transistors (Sample 1 and Sample 2). FIG. 21A is a top view of each transistor. FIG. 21B is a cross-sectional view along dashed-dotted line A-B in FIG. 21A.

The transistor shown in FIG. 21B includes a substrate 600; a base insulating film 602 provided over the substrate 600; an oxide semiconductor film 606 provided over the base insulating film 602; a pair of electrodes 614 in contact with the oxide semiconductor film 606; a gate insulating film 608 provided over the oxide semiconductor film 606 and the pair of electrodes 614; a gate electrode 610 provided to overlap with the oxide semiconductor film 606 with the gate insulating film 608 provided therebetween; an interlayer insulating film 616 provided to cover the gate insulating film 608 and the gate electrode 610; wirings 618 connected to the pair of electrodes 614 through openings formed in the gate insulating film 608 and the interlayer insulating film 616; and a protective film 620 provided to cover the interlayer insulating film 616 and the wirings 618.

A glass substrate can be used as the substrate 600. A silicon oxide film can be used as the base insulating film 602. An In—Sn—Zn—O film can be used as the oxide semiconductor film 606. A tungsten film can be used as the pair of electrodes 614. A silicon oxide film can be used as the gate insulating film 608. A stacked-layer structure of a tantalum nitride film and a tungsten film can be used for the gate electrode 610. A stacked-layer structure of a silicon oxynitride film and a polyimide film can be used for the interlayer insulating film 616. A stacked-layer structure in which a titanium film, an aluminum film, and a titanium film are stacked in this order can be used for each of the wirings 618. A polyimide film can be used as the protective film 620.

In the transistor having the structure illustrated in FIG. 21A, the width of a portion where the gate electrode 610 overlaps with the electrode 614 is referred to as Lov. In addition, the width of a portion of the electrode 614 which does not overlap with the oxide semiconductor film 606 is referred to as dW.

A method for forming the transistors (Samples 1 and 2) having the structure illustrated in FIG. 21B is described below.

First, plasma treatment is performed on a surface of the substrate 600 in an argon atmosphere. The plasma treatment is carried out with a sputtering apparatus by applying a bias power of 200 W (RF) to the substrate 600 side for 3 minutes.

Subsequently, without breaking the vacuum, a silicon oxide film as the base insulating film 602 is formed to have a thickness of 300 nm.

The silicon oxide film is formed with a sputtering apparatus with a power of 1500 W (RF) in an oxygen atmosphere. A quartz target is used as a target. The substrate heating temperature in the film deposition is set at 100° C.

Next, a surface of the base insulating film 602 is processed by CMP to be planarized such that $R_a$ is about 0.2 nm.

Next, over the planarized base insulating film 602, an In—Sn—Zn—O film as the oxide semiconductor film is formed to have a thickness of 15 nm.

The In—Sn—Zn—O film is formed with a sputtering apparatus with a power of 100 W (DC) in a mixed atmosphere of argon:oxygen=2:3 [volume ratio]. An In—Sn—Zn—O target of In:Sn:Zn=1:1:1 [atomic ratio] is used as a target. The substrate heating temperature in the film deposition is set at 200° C.

Next, heat treatment is performed only on Sample 2 at 650° C. As the heat treatment, heat treatment in a nitrogen atmosphere is first performed for 1 hour and then heat treatment in an oxygen atmosphere is performed for 1 hour while keeping the temperature.

Then, the oxide semiconductor film is processed by a photolithography process, whereby the oxide semiconductor film 606 is formed.

Next, the tungsten film is formed over the oxide semiconductor film 606 to have a thickness of 50 nm.

The tungsten film is formed with a sputtering apparatus with a power of 1000 W (DC) in an argon atmosphere. The substrate heating temperature in the film deposition is set at 200° C.

Then, the tungsten film is processed by a photolithography process, whereby the pair of electrodes 614 are formed.

Next, a silicon oxide film as the gate insulating film 608 is formed to have a thickness of 100 nm. The relative permittivity of the silicon oxide film is set at 3.8.

The silicon oxide film as the gate insulating film 608 can be formed in a similar manner to that of the base insulating film 602.

Next, over the gate insulating film 608, a tantalum nitride film and a tungsten film are formed in this order to have thicknesses of 15 nm and 135 nm, respectively.

The tantalum nitride film is formed with a sputtering apparatus with a power of 1000 W (DC) in a mixed atmosphere of argon:nitrogen=5:1. Substrate heating is not performed in the film deposition.

The tungsten film is formed with a sputtering apparatus with a power of 4000 W (DC) in an argon atmosphere. The substrate heating temperature in the film deposition is set at 200° C.

Then, the tantalum nitride film and the tungsten film are processed by a photolithography process, whereby the gate electrode 610 is formed.

Next, a silicon oxynitride film as part of the interlayer insulating film 616 is formed over the gate insulating film 608 and the gate electrode 610 to have a thickness of 300 nm.

The silicon oxynitride film as part of the interlayer insulating film 616 is formed with a PCVD apparatus with a power of 35 W (RF) in a mixed atmosphere of monosilane:nitrous oxide=1:200. The substrate heating temperature in the film deposition is set at 325° C.

Then, the silicon oxynitride film as part of the interlayer insulating film 616 is processed by a photolithography process.

Next, photosensitive polyimide as part of the interlayer insulating film 616 is deposited to have a thickness of 1500 nm.

Next, the photosensitive polyimide as part of the interlayer insulating film 616 is exposed to light using a photomask which is used in the photolithography process on the silicon oxynitride film as part of the interlayer insulating film 616, and developed, and then subjected to heat treatment for hardening the photosensitive polyimide film. In this manner, the interlayer insulating film 616 is formed of the silicon oxynitride film and the photosensitive polyimide film. The heat treatment is performed in a nitrogen atmosphere at 300° C.

Next, a titanium film, an aluminum film, and a titanium film are formed in this order to have thicknesses of 50 nm, 100 nm, and 5 nm, respectively.

The two titanium films are formed with a sputtering apparatus with a power of 1000 W (DC) in an argon atmosphere. Note that heating is not performed on the substrate during deposition.

The aluminum film is formed with a sputtering apparatus with a power of 1000 W (DC) in an argon atmosphere. Note that heating is not performed on the substrate during deposition.

Then, the titanium film, the aluminum film, and the titanium film are processed by a photolithography process, whereby the wirings 618 are formed.

Next, a photosensitive polyimide film as the protective film 620 is formed to have a thickness of 1500 nm.

Next, the photosensitive polyimide film is exposed to light with the use of a photomask which is used in the photolithography process on the wirings 618, and developed, so that openings at which the wirings 618 are exposed are formed in the protective film 620.

Next, heat treatment for hardening the photosensitive polyimide film is performed thereon. The heat treatment is performed in a similar manner to that of the heat treatment performed on the photosensitive polyimide film as the interlayer insulating film 616.

Through the above process, the transistors (Samples 1 and 2) having the structure illustrated in FIG. 21B can be formed.

Next, evaluation results of electric characteristics of the transistors (Samples 1 and 2) having the structure illustrated in FIG. 21B are described.

Figure 22A:
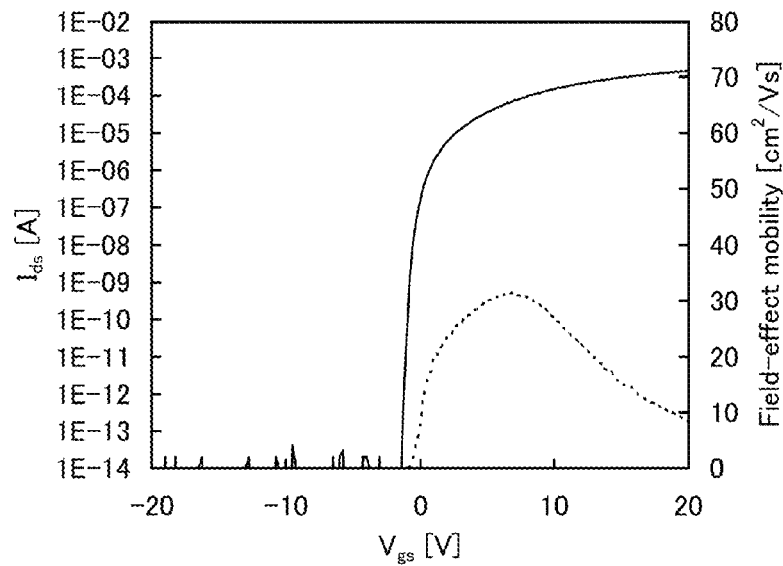
FIGS. 22A and 22B are graphs each showing characteristics of a transistor.
Figure 22B:
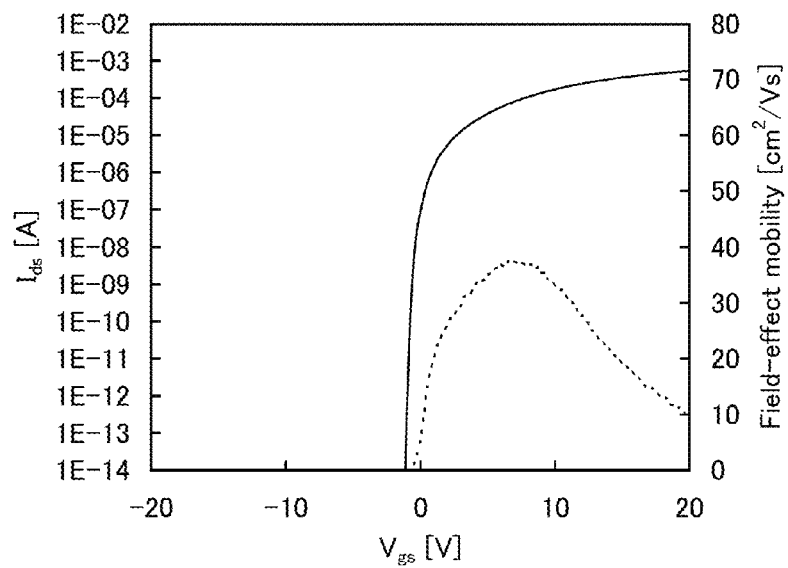

Here, $V_{gs}$–$I_{ds}$ characteristics of the transistors (Samples 1 and 2) having the structure illustrated in FIG. 21B were measured; the results of Sample 1 are shown in FIG. 22A and the results of Sample 2 are shown in FIG. 22B. Each transistor used for the measurement has a channel length L of 3 µm, a channel width W of 10 µm, Lov of 3 µm per side (6 µm in total), and dW of 3 µm per side (6 µm in total). Note that $V_{ds}$ is set at 10 V.

Comparing Samples 1 and 2, it is found that from the results of Sample 2, the field-effect mobility of the transistor is increased by performing heat treatment after formation of the oxide semiconductor film. The reason for this is deemed that the impurity concentration in the oxide semiconductor film is reduced by the heat treatment; accordingly, it is understood that the impurity concentration in the oxide semiconductor film is reduced by heat treatment performed after the oxide semiconductor film is formed, whereby the field-effect mobility of the transistor can be increased.

Next, evaluation results of the off-state current (per micrometer of a channel width) of the transistor which can be applied to a memory device according to one embodiment of the present invention are described.

The transistor used in the measurement has a channel length L of 3 µm, a channel width W of 10 µm, Lov of 2 µm, and dW of 0 µm.

Figure 23:
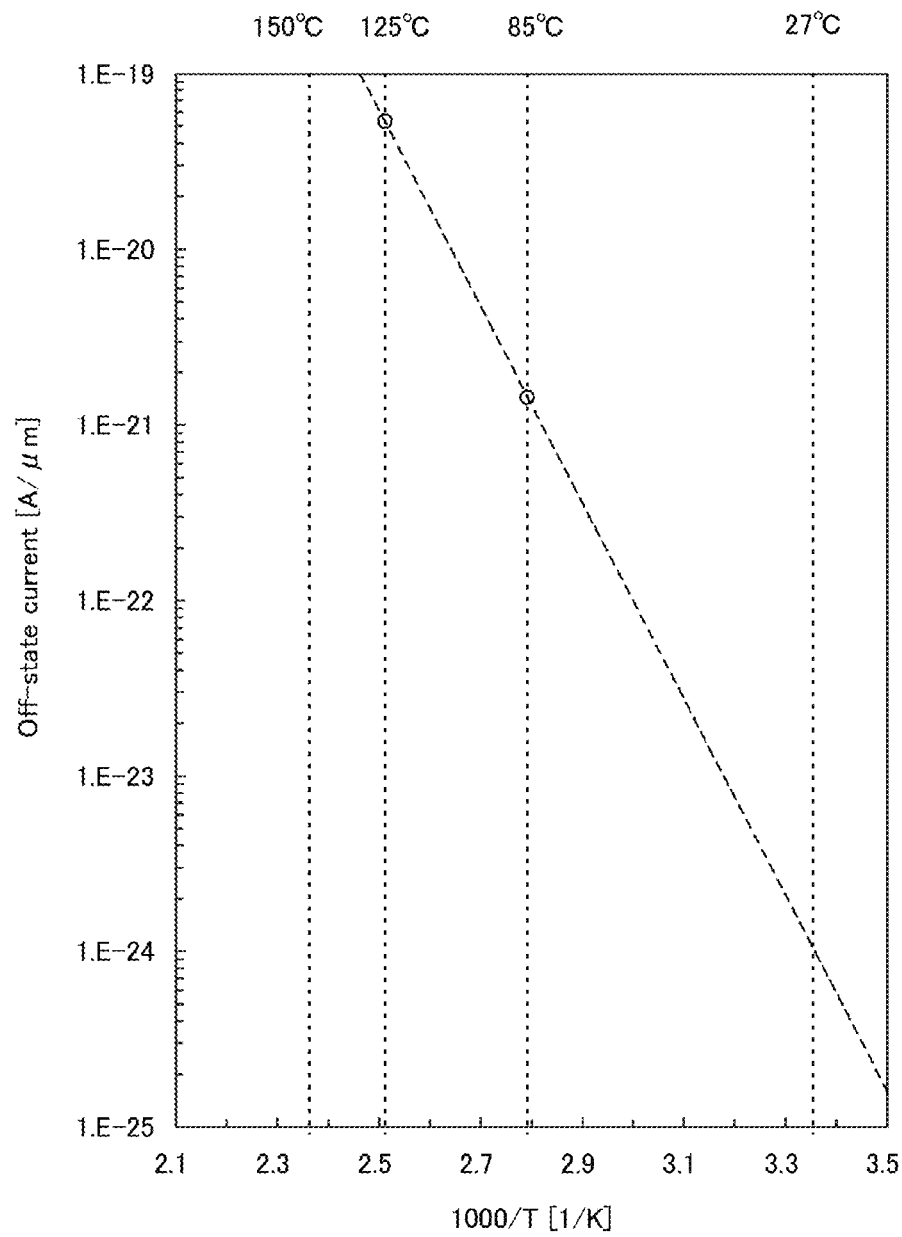
FIG. 23 is a graph showing characteristics of a transistor.

FIG. 23 shows a relation between the off-state current of the transistor and the inverse of the substrate temperature (absolute temperature) at measurement. For simplicity, a value (1000/T) obtained by multiplying the inverse of the substrate temperature at measurement by 1000 is indicated by the horizontal axis.

A method for measuring the off-state current of the transistor is simply described below. Note that a transistor which is an object to be measured is called a first transistor for convenience.

A drain of the first transistor is connected to a floating gate FG, and the floating gate FG is connected to a gate of a second transistor.

First, the first transistor is turned off, and charge is supplied to the floating gate FG, where a certain drain voltage is applied to the second transistor.

Consequently, the charge at the floating gate FG gradually leaks through the first transistor to change the source potential of the second transistor. The amount of charge leaked from the first transistor can be estimated from that amount of change of the source potential in relation to time, whereby the off-state current can be measured.

FIG. 23 shows that the off-state current of the transistor is $2 \times 10^{-21}$ A/µm (2 zA/µm) when a substrate temperature in measurement is 85° C. The proportional relation between the logarithm of the off-state current and the inverse of the substrate temperature suggests that the off-state current at room temperature (27° C.) is smaller than $1 \times 10^{-22}$ A/µm (0.1 zA/µm).

As described above, it is found that the off-state current of the transistor according to this embodiment is extremely small.

When the transistor of this embodiment is used as each of the transistors 115 and 117 illustrated in FIG. 1 or FIG. 4, potentials held in the nodes M and N can be held for a long time. In the memory device illustrated in FIG. 1 or FIG. 4, the potentials held in the nodes O and P of the logic circuit 101 can be held in the nodes M and N after the supply of power is stopped.

The transistor according to this embodiment has relatively high field-effect mobility; therefore, with the use of the transistor as the transistor 115 and the transistor 117 illustrated in FIG. 1 or FIG. 4, the memory circuit 102 and the memory circuit 103 can operate at high speed. Accordingly, in the memory device illustrated in FIG. 1 or FIG. 4, data can be transferred from the logic circuit 101 to the memory circuit 102 and the memory circuit 103 in a short time, before supply of power is stopped. Further, after the supply of power is restarted, data can be restored from the memory circuit 102 and the memory circuit 103 to the logic circuit 101 in a short time.

This embodiment can be implemented in appropriate combination with any of the above embodiments.

Embodiment 7

In this embodiment, a structure of a signal processing circuit including any of the memory devices described in the above embodiments will be described.

Figure 24:
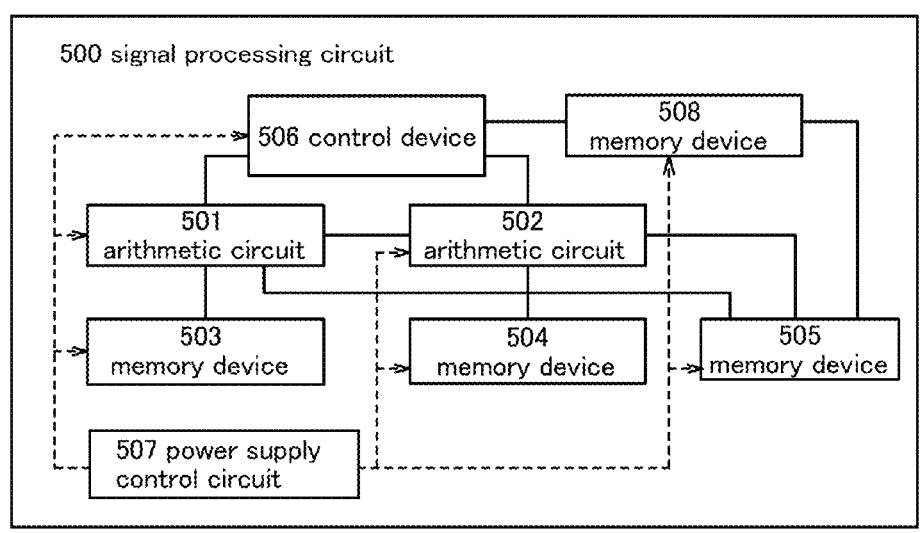
FIG. 24 is a block diagram of a signal processing circuit.

FIG. 24 illustrates an example of a signal processing circuit according to one embodiment of the present invention. The signal processing circuit at least includes one or a plurality of arithmetic circuits and one or a plurality of memory devices. Specifically, a signal processing circuit 500 illustrated in FIG.

24 includes an arithmetic circuit 501, an arithmetic circuit 502, a memory device 503, a memory device 504, a memory device 505, a control device 506, a power supply control circuit 507, and a memory device 508.

The arithmetic circuits 501 and 502 each include, as well as a logic circuit which carries out simple logic arithmetic processing, an adder, a multiplier, and various arithmetic circuits. The memory device 503 functions as a register for temporarily holding data when the arithmetic processing is carried out in the arithmetic circuit 501. The memory device 504 functions as a register for temporarily holding data when the arithmetic processing is carried out in the arithmetic circuit 502.

In addition, the memory device 505 can be used as a main memory and can store a program executed by the control device 506 as data or can store data from the arithmetic circuit 501 and the arithmetic circuit 502.

The control device 506 is a circuit which collectively controls operations of the arithmetic circuit 501, the arithmetic circuit 502, the memory device 503, the memory device 504, the memory device 505, and the memory device 508 included in the signal processing circuit 500. Note that in FIG. 24, a structure in which the control device 506 is provided in the signal processing circuit 500 as a part thereof is illustrated, but the control device 506 may be provided outside the signal processing circuit 500.

In addition, as well as the supply of the power supply voltage to the memory device, the supply of the power supply voltage to the control circuit or the arithmetic circuit which transmits/receives data to/from the memory device may be stopped. For example, when the arithmetic circuit 501 and the memory device 503 are not operated, the supply of the power supply voltage to the arithmetic circuit 501 and the memory device 503 may be stopped.

In addition, the power supply control circuit 507 controls the level of the power supply voltage which is supplied to the arithmetic circuit 501, the arithmetic circuit 502, the memory device 503, the memory device 504, the memory device 505, the control device 506, and the memory device 508 included in the signal processing circuit 500. Further, in the case where the supply of the power supply voltage is stopped, a switching element for stopping the supply of the power supply voltage may be provided for the power supply control circuit 507, or for each of the arithmetic circuit 501, the arithmetic circuit 502, the memory device 503, the memory device 504, the memory device 505, the control device 506, and the memory device 508. In the latter case, the power supply control circuit 507 is not necessarily provided in the signal processing circuit according to one embodiment of the present invention.

The memory device 508 which functions as a cache memory is preferably provided between the memory device 505 that is a main memory and the control device 506. By providing the cache memory, access to the low-speed main memory can be reduced and the speed of the signal processing such as arithmetic processing can be higher.

When a memory device according to one embodiment of the present invention is used as each of the memory devices 503, 504, and 508, data of the memory device can be held even when the supply of the power supply voltage is stopped for a short time. Further, data held in the memory device is not necessarily transferred to an external non-volatile memory device; therefore, the supply of the power supply voltage can be stopped in a short time. Furthermore, after the supply of power supply voltage is restarted, data held in the memory device can be restored to a state before the supply of the power supply voltage stopped, in a short time. The use of the above-described memory device 503, memory device 504, and memory device 508 for the signal processing circuit 500 can reduce power consumption in the case where the supply of power is stopped for a short time.

This embodiment can be implemented in appropriate combination with any of the above-described embodiments.

Embodiment 8

A memory device or a signal processing circuit according to one embodiment of the present invention can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of an electronic device including the memory device or the signal processing circuit described in any of the above embodiments are described below.

Figure 25A:
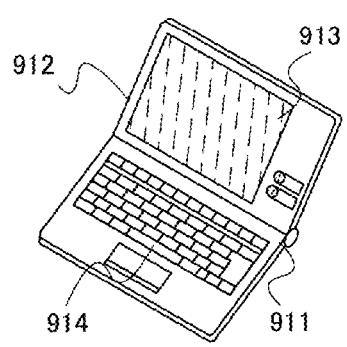
FIGS. 25A to 25F each illustrate an electronic device.

FIG. 25A illustrates a laptop personal computer, which includes a main body 911, a housing 912, a display portion 913, a keyboard 914, and the like. The housing 912 includes the memory device or the signal processing circuit according to one embodiment of the present invention. Therefore, in the case where supply of power is stopped for a short time, power consumption of the laptop personal computer can be reduced.

Figure 25B:
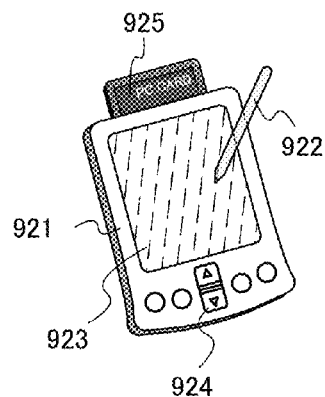

FIG. 25B is a personal digital assistant (PDA), which includes a main body 921 provided with a display portion 923, an external interface 925, operation buttons 924, and the like. A stylus 922 is included as an accessory for operation. The main body 921 includes the memory device or the signal processing circuit according to one embodiment of the present invention. Therefore, in the case where supply of power is stopped for a short time, power consumption of the personal digital assistant can be reduced.

Figure 25C:
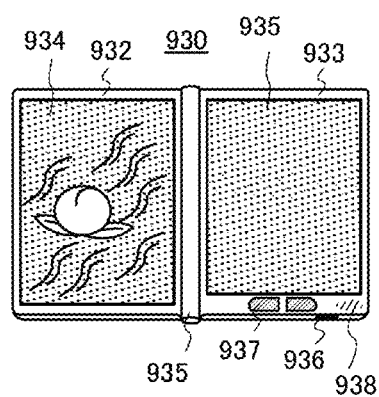

FIG. 25C illustrates an example of an e-book reader. For example, an e-book reader 930 includes two housings, a housing 931 and a housing 932. The housing 931 and the housing 932 are combined with a hinge 935 so that the e-book reader 930 can be opened and closed with the hinge 935 as an axis. With such a structure, the e-book reader 930 can operate like a paper book.

A display portion 933 and a display portion 934 are incorporated in the housing 931 and the housing 932, respectively. One screen image or different screen images may be displayed on the display portion 933 and the display portion 934. In the structure where different screen images are displayed on the display portion 933 and the display portion 934, for example, text can be displayed on the right display portion (the display portion 934 in FIG. 25C) and images can be displayed on the left display portion (the display portion 933 in FIG. 25C). At least one of the housings 931 and 932 includes the memory device or the signal processing circuit according to one embodiment of the present invention. Therefore, in the case where supply of power is stopped for a short time, power consumption of the e-book reader can be reduced.

FIG. 25C illustrates an example in which the housing 932 is provided with an operation portion and the like. For example, the housing 932 is provided with a power switch 936, an operation key 937, a speaker 938, and the like. With the operation key 937, pages can be turned. A keyboard, a pointing device, or the like may also be provided on the same plane of the housing, as the display portion. Furthermore, an external connection terminal (an earphone terminal, a USB terminal, or the like), a recording medium insertion portion, and the like may be provided on the back surface or the side surface of the housing. The e-book reader 930 may have a function of an electronic dictionary.

The e-book reader 930 may have a configuration capable of wirelessly transmitting and receiving data. Through wireless communication, desired book data or the like can be purchased and downloaded from an electronic book server.

Figure 25D:
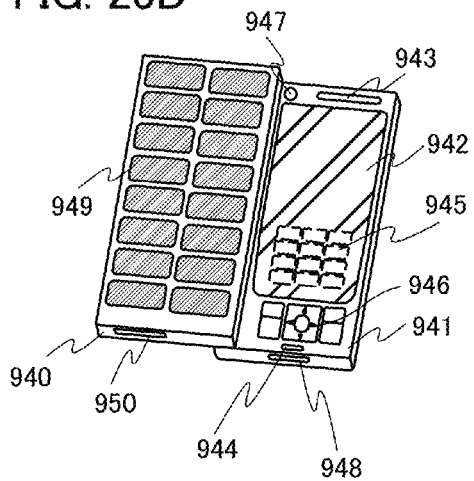

FIG. 25D illustrates a mobile phone, which includes two housings, a housing 940 and a housing 941. The housing 941 is provided with a display panel 942, a speaker 943, a microphone 944, a pointing device 946, a camera lens 947, an external connection terminal 948, and the like. The housing 940 is provided with a solar cell 949 for charging the mobile phone, an external memory slot 950, and the like. Further, an antenna is incorporated in the housing 941. At least one of the housings 940 and 941 includes the memory device or the signal processing circuit according to one embodiment of the present invention. Therefore, in the case where supply of power is stopped for a short time, power consumption of the mobile phone can be reduced.

Further, the display panel 942 is provided with a touch panel. A plurality of operation keys 945 which are displayed as images are shown by dashed lines in FIG. 25D. A boosting circuit by which a voltage output from the solar cell 949 is increased to be sufficiently high for each circuit is also equipped.

In the display panel 942, the display direction can be appropriately changed depending on a usage pattern. Further, the display device is provided with the camera lens 947 on the same plane as the display panel 942, which enables videophone calls. The speaker 943 and the microphone 944 can be used for videophone calls, recording and playing sound, and the like as well as voice calls. Further, the housings 940 and 941 in a state where they are developed as illustrated in FIG. 25D can shift by sliding to a state where one is overlapped with the other; therefore, the size of the mobile phone can be reduced, which makes the mobile phone suitable for being carried.

The external connection terminal 948 can be connected to an AC adapter and various types of cables such as a USB cable, which enables charging and data communication with a personal computer. Further, a large amount of data can be stored and carried by a storage medium inserted into the external memory slot 950.

In addition to the above functions, an infrared communication function, a television reception function, or the like may be equipped.

Figure 25E:
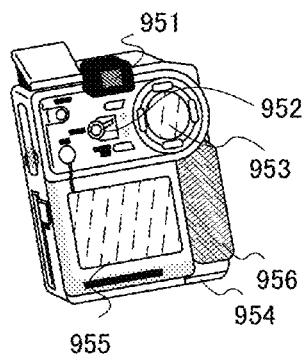

FIG. 25E illustrates a digital video camera which includes a main body 956, a display portion A 955, an eyepiece 951, an operation switch 952, a display portion B 953, a battery 954, and the like. The main body 956 includes the memory device or the signal processing circuit according to one embodiment of the present invention. Therefore, in the case where supply of power is stopped for a short time, power consumption of the digital video camera can be reduced.

Figure 25F:
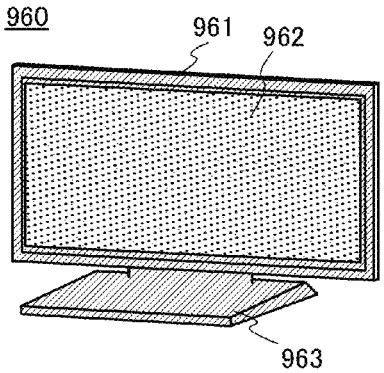

FIG. 25F illustrates an example of a television set. In a television set 960, a display portion 962 is incorporated in a housing 961. Images can be displayed on the display portion 962. Here, the housing 961 is supported by a stand 963. The housing 961 includes the memory device or the signal processing circuit according to one embodiment of the present invention. Therefore, in the case where supply of power is stopped for a short time, power consumption of the television set can be reduced.

The television set 960 can be operated by an operation switch of the housing 961 or a separate remote controller. Further, the remote controller may be provided with a display portion for displaying data output from the remote controller.

The television set 960 is provided with a receiver, a modem, and the like. With use of the receiver, general television broadcasting can be received. Moreover, the television set can be connected to a communication network with or without wires via the modem, whereby one-way (from sender to receiver) or two-way (between sender and receiver or between receivers) data communication can be performed.

This embodiment can be implemented in appropriate combination with any of the above embodiments.

This application is based on Japanese Patent Application serial no. 2011-113359 filed with Japan Patent Office on May 20, 2011, the entire contents of which are hereby incorporated by reference.

What is claimed is:

1. A semiconductor device comprising:
a first inverter, a second inverter, a first transistor, a second transistor, a third transistor, a fourth transistor, a first capacitor and a second capacitor;
wherein an input terminal of the first inverter is electrically connected to an output terminal of the second inverter and a second node, and
wherein an input terminal of the second inverter is electrically connected to an output terminal of the first inverter and a first node,
wherein one of a source and a drain of the first transistor is electrically connected to the output terminal of the first inverter,
wherein one of a source and a drain of the second transistor is electrically connected to the output terminal of the second inverter,
wherein one of a source and a drain of the third transistor is electrically connected to the output terminal of the first inverter,
wherein one of a source and a drain of the fourth transistor is electrically connected to the output terminal of the second inverter,
wherein the other of the source and the drain of the first transistor and a first electrode of the first capacitor are electrically connected to a third node,
wherein the other of the source and the drain of the second transistor and a first electrode of the second capacitor are electrically connected to a fourth node, and
wherein each of the first transistor and the second transistor comprises an oxide semiconductor.

2. The semiconductor device according to claim 1, wherein the oxide semiconductor comprises at least two kinds of elements selected from indium, gallium, tin, and zinc.

3. The semiconductor device according to claim 1, wherein an off-state current density of the first transistor and the second transistor is less than or equal to 100 zA/μm.

4. A signal processing circuit comprising the semiconductor device according to claim 1.

5. The semiconductor device according to claim 1, further comprising:
a precharge circuit comprising a fifth transistor, a sixth transistor and a seventh transistor,
wherein a gate of the fifth transistor is electrically connected to a gate of the sixth transistor and a gate of the seventh transistor,
wherein one of a source and a drain of the sixth transistor is electrically connected to one of a source and a drain of the fifth transistor and the first node, and wherein one of a source and a drain of the seventh transistor is electrically connected to the other of the source and the drain of the fifth transistor and the second node.

6. The semiconductor device according to claim 5, wherein the precharge circuit is configured to output a first precharge potential to the first node and a second precharge potential to the second node.

7. The semiconductor device according to claim 5, wherein a third potential is supplied to the gate of the fifth transistor, so that the fifth transistor, the sixth transistor, and the seventh transistor are turned on.

8. The semiconductor device according to claim 2, wherein a first potential is supplied to a gate of the first transistor and a gate of the second transistor, so that the first transistor and the second transistor are turned on.

9. The semiconductor device according to claim 1, wherein a second potential is supplied to a gate of the third transistor and a gate of the fourth transistor, so that the third transistor and the fourth transistor are turned on.

10. The semiconductor device according to claim 1, wherein one of a source and a drain of an eighth transistor included in the first inverter is electrically connected to one of a source and a drain of an ninth transistor included in the second inverter.

11. The semiconductor device according to claim 10, wherein a sixth potential is supplied to the one of the source and the drain of the eighth transistor.

12. The semiconductor device according to claim 1, wherein one of a source and a drain of a tenth transistor included in the first inverter is electrically connected to one of a source and a drain of an eleventh transistor included in the second inverter.

13. The semiconductor device according to claim 12, wherein a seventh potential is supplied to the one of the source and the drain of the tenth transistor.

14. The semiconductor device according to claim 1, wherein a first data signal is input to the other of the source and the drain of the third transistor.

15. The semiconductor device according to claim 1, wherein a second data signal is input to the other of the source and the drain of the fourth transistor.

16. The semiconductor device according to claim 1, wherein the third node stores a fourth potential held in the first node, and wherein the fourth node stores a fifth potential held in the second node.

17. A semiconductor device comprising:
cells arranged in matrix of m rows and n columns, the cells each comprising:
a first inverter, a second inverter, a first transistor, a second transistor, a third transistor, a fourth transistor, a first capacitor and a second capacitor;
wherein an input terminal of the first inverter is electrically connected to an output terminal of the second inverter and a second node, and
wherein an input terminal of the second inverter is electrically connected to an output terminal of the first inverter and a first node,
wherein one of a source and a drain of the first transistor is electrically connected to the output terminal of the first inverter,
wherein one of a source and a drain of the second transistor is electrically connected to the output terminal of the second inverter,
wherein one of a source and a drain of the third transistor is electrically connected to the output terminal of the first inverter,
wherein one of a source and a drain of the fourth transistor is electrically connected to the output terminal of the second inverter,
wherein the other of the source and the drain of the first transistor and a first electrode of the first capacitor are electrically connected to a third node, and
wherein the other of the source and the drain of the second transistor and a first electrode of the second capacitor are electrically connected to a fourth node,
wherein each of the first transistor and the second transistor comprises an oxide semiconductor.

18. The semiconductor device according to claim 17, wherein the oxide semiconductor comprises at least two kinds of elements selected from indium, gallium, tin, and zinc.

19. The semiconductor device according to claim 17, wherein an off-state current density of the first transistor and the second transistor is less than or equal to 100 zA/μm.

20. The semiconductor device according to claim 17 is used as a register.

21. The semiconductor device according to claim 17 is used as a cache memory.

* * * * *